US009618652B2

(12) United States Patent
Weng et al.

(10) Patent No.: US 9,618,652 B2
(45) Date of Patent: *Apr. 11, 2017

(54) METHOD OF CALIBRATING FRACTURE GEOMETRY TO MICROSEISMIC EVENTS

(71) Applicant: Schlumberger Technology Corporation, Sugar Land, TX (US)

(72) Inventors: Xiaowei Weng, Katy, TX (US); Mark Mack, Houston, TX (US); Craig Cipolla, The Woodlands, TX (US); Utpal Ganguly, Sugar Land, TX (US); Shawn Maxwell, Calgary (CA)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 275 days.

This patent is subject to a terminal disclaimer.

(21) Appl. No.: 14/133,687

(22) Filed: Dec. 19, 2013

(65) Prior Publication Data

US 2014/0372089 A1 Dec. 18, 2014

Related U.S. Application Data

(63) Continuation-in-part of application No. PCT/US2012/063340, filed on Nov. 2, 2012.
(Continued)

(51) Int. Cl.
*G06F 17/50* (2006.01)
*G01V 99/00* (2009.01)
*E21B 43/26* (2006.01)

(52) U.S. Cl.
CPC ............ *G01V 99/005* (2013.01); *E21B 43/26* (2013.01); *G06F 17/5009* (2013.01)

(58) Field of Classification Search
USPC ................................. 703/2, 6, 9; 166/250.01
See application file for complete search history.

(56) References Cited

U.S. PATENT DOCUMENTS 6,101,447 A 8/2000 Poe, Jr.
6,439,310 B1 8/2002 Scott, III et al.
(Continued)

FOREIGN PATENT DOCUMENTS

CN 1916359 A 2/2007
CN 102606126 A 7/2012
(Continued)

OTHER PUBLICATIONS

Kresse et al., Numeric Modeling of Hydraulic Fracturing in Naturally Franctured Formations, ARMA 11-363, 45th US Rock Mechanics/Geomechanics Symposium, Jun. 26-29, 2011, 11 pages total.
(Continued)

*Primary Examiner* — Thai Phan
(74) *Attorney, Agent, or Firm* — Michael L. Flynn; Rachel Greene; Robin Nava

(57) ABSTRACT

A method of performing a fracture operation at a wellsite about a subterranean formation having a fracture network with natural fractures is provided. The wellsite is stimulated by injection of fluid into the fracture network. The method involves generating wellsite data including natural fracture parameters and obtaining measurements of microseismic events, modeling hydraulic fractures of the fracture network based on the wellsite data and defining a hydraulic fracture geometry of the hydraulic fractures, generating a stress field of the hydraulic fractures using a geomechanical model, determining shear failure parameters comprising a failure envelope and a stress state about the fracture network, determining a location of shear failure of the fracture network from the failure envelope and the stress state, and
(Continued)

calibrating the hydraulic fracture geometry by comparing the modeled hydraulic fractures and the locations of shear failure against the measured microseismic events.

20 Claims, 28 Drawing Sheets

Related U.S. Application Data

(60) Provisional application No. 61/746,183, filed on Dec. 27, 2012, provisional application No. 61/628,690, filed on Nov. 4, 2011.

(56) References Cited

U.S. PATENT DOCUMENTS

| | | | |
|---|---|---|---|
| 6,876,959 | B1 | 4/2005 | Peirce et al. |
| 7,363,162 | B2 | 4/2008 | Thambynayagam et al. |
| 7,509,245 | B2 | 3/2009 | Siebrits et al. |
| 7,788,074 | B2 | 8/2010 | Scheidt et al. |
| 7,819,181 | B2 | 10/2010 | Entov et al. |
| 8,061,424 | B2 | 11/2011 | Willberg et al. |
| 8,126,689 | B2 | 2/2012 | Soliman et al. |
| 8,408,313 | B2 | 4/2013 | Yale et al. |
| 8,412,500 | B2 | 4/2013 | Weng et al. |
| 8,428,923 | B2 | 4/2013 | Siebrits et al. |
| 8,498,852 | B2 | 7/2013 | Xu et al. |
| 8,571,843 | B2 | 10/2013 | Weng et al. |
| 8,584,755 | B2 | 11/2013 | Willberg et al. |
| 8,812,334 | B2 | 8/2014 | Givens et al. |
| 8,991,494 | B2 | 3/2015 | Willberg et al. |
| 2005/0017723 | A1 | 1/2005 | Entov et al. |
| 2006/0081412 | A1 | 4/2006 | Wright et al. |
| 2007/0272407 | A1 | 11/2007 | Lehman et al. |
| 2007/0294034 | A1 | 12/2007 | Bratton et al. |
| 2008/0133186 | A1 | 6/2008 | Li et al. |
| 2009/0065253 | A1 | 3/2009 | Suarez-Rivera et al. |
| 2009/0125280 | A1 | 5/2009 | Soliman et al. |
| 2010/0004906 | A1 | 1/2010 | Searles et al. |
| 2010/0138196 | A1 | 6/2010 | Hui et al. |
| 2010/0250215 | A1 | 9/2010 | Kennon et al. |
| 2010/0256964 | A1 | 10/2010 | Lee et al. |
| 2011/0029291 | A1 | 2/2011 | Weng et al. |
| 2011/0077918 | A1 | 3/2011 | Mutlu et al. |
| 2011/0125471 | A1 | 5/2011 | Craig et al. |
| 2011/0257944 | A1 | 10/2011 | Du et al. |
| 2012/0173216 | A1* | 7/2012 | Koepsell ............... E21B 49/00 703/6 |
| 2012/0232872 | A1 | 9/2012 | Nasreldin et al. |
| 2012/0310613 | A1 | 12/2012 | Moos et al. |
| 2013/0140031 | A1 | 6/2013 | Cohen et al. |
| 2013/0144532 | A1 | 6/2013 | Williams et al. |
| 2014/0151033 | A1 | 6/2014 | Xu et al. |
| 2015/0204174 | A1* | 7/2015 | Kresse .................. E21B 49/00 166/250.01 |

FOREIGN PATENT DOCUMENTS

| | | |
|---|---|---|
| WO | 2013016733 | 1/2013 |
| WO | WO2013055930 | 4/2013 |
| WO | WO2013067363 | 5/2013 |
| WO | 2015069817 | 5/2015 |

OTHER PUBLICATIONS

Renshaw et al., An Experimentally Verified Criterion for Propagation Across Unbounded, Frictional Interfaces in Brittle, Linear Elastic Materials, Int. J. Rock Mech. Min. Sci. & Geomech. Abstr., 1995, pp. 237-249, vol. 32, No. 3, Elsevier Science Ltd., Great Britain.

Gu et al., Criterion for Fractures Crossing Frictional Interfaces at Non-orthogonal Angles, 44th US Rock Mechanics Symposium and 5th U.S.—Canada Rock Mechanics Symposium, Jun. 27-30, 2010, 6 pages total, ARMA, American Rock Mechanics Association.

Gu et al., Hyrdaulic Fracture Crossing Natural Fracture at Non-orthogonal Angles, A Criterion, Its Validation and Applications, SPE 139984, SPE Hydraulic Fracturing Technology Conference and Exhibition, Jan. 24-26, 2011, 11 pages total, Society of Petroleum Engineers.

Warpinski et al., Influence of Geologic Discontinuities on Hydraulic Fracture Propagation, SPE 13224, 1984 SPE Annual Technical Conference and Exhibition, Sep. 16-19, 1984, published in Journal of Petroleum Technology, Feb. 1987, pp. 209-220.

Warpinski et al., Altered-Stress Fracturing, SPE 17533, 1988 SPE Rocky Mountain Regional Meeting, May 11-13, 1988, published in JPT, Sep. 1989, pp. 990-997.

Fisher et al., Optimizing Horizontal Completion Techniques in the Barnett Shale Using Microseismic Fracture Mapping, SPE 90051, SPE Annual Technical Conference and Exhibition, Sep. 26-29, 2004, 11 pages total, Society of Petroleum Engineers Inc.

Britt et al., Horizontal Well Completion, Stimulation Optimization, and Risk Mitigation, SPE 125526, 2009 SPE Eastern Regional Meeting, Sep. 23-25, 2009, 17 pages total, Society of Petroleum Engineers.

Cheng, Y., Boundary Element Analysis of the Stress Distribution around Multiple Fractures: Implications for the Spacing of Perforation Clusters of Hydraulically Fractured Horizontal Wells, SPE 125769, 2009 SPE Eastern Regional Meeting, Sep. 23-25, 2009, 15 pages total, Society of Petroleum Engineers.

Meyer et al., A Discrete Fracture Network Model for Hydraulically Induced Fractures: Theory, Parametric and Case Studies, SPE 140514, SPE Hydraulic Fracturing Technology Conference and Exhibition, Jan. 24-26, 2011, 36 pages total, Society of Petroleum Engineers.

Roussel et al., Optimizing Fracture Spacing and Sequencing in Horizontal-Well Fracturing, SPE 127986, SPE International Symposium and Exhibition on Formation Damage Control, Feb. 10-12, 2010, pp. 173-184, published May 2011, SPE Production & Operations, Society of Petroleum Engineers.

Germanovich et al., Fracture closure in extension and mechanical interaction of parallel joints, Journal of Geophysical Research, 2004, 22 total pages, vol. 109, B02208, doi:10.1029/2002JB002131, 2004.

Olson, J.E., Multi-fracture propagation modeling: Applications to hydraulic fracturing in shales and tight gas sands, 42nd US Rock Mechanics Symposium and 2nd US-Canada Rock Mechanics Symposium, Jun. 29-Jul. 2, 2008, 8 pages total, ARMA, American Rock Mechanics Association.

Olson, J. E., Fracture mechanics analysis of joints and veins, PhD dissertation submitted to the Department of Applied Earth Sciences and the Committee on Graduate Studies of Stanford University, Dec. 1990, 191 pages total, Ann Arbor, MI, USA, University Microfilms International, A Bell & Howell Information Company.

Yew et al., On Perforating and Fracturing of Deviated Cased Wellbores, SPE 26514, 68th Annual Technical Conference and Exhibition of the Society of Petroleum Engineers, Oct. 3-6, 1993, pp. 75-86, Society of Petroleum Engineers, Inc.

Weng X., Fracture Initiation and Propagation from Deviated Wellbores, SPE 26597, 68th Annual Technical Conference and Exhibition of the Society of Petroleum Engineers, Oct. 3-6, 1993, pp. 849-864, Society of Petroleum Engineers, Inc.

Nolte Kenneth G., Fracturing-Pressure Analysis for Nonideal Behavior, JPT, Feb. 1991, pp. 210-218 (SPE 20704) (1991), Society of Petroleum Engineers.

Olson, Predicting fracture swarms—the influence of subcritical crack growth and the crack-tip process zone on joint spacing in rock, from: Cosgrove, J.W. & Engelder, T. (eds) 2004, 231, The Initiation, Propagation, and Arrest of Joints and Other Fractures, 15 pages total, London, Special Publications, The Geological Society of London.

Crouch, S.L. and Starfield, A.M., Element Methods in Solid Mechanics, with applications in rock mechanics and geological engineering, 1983, pp. 93-96, London, George Allen & Unwin.

(56) References Cited

OTHER PUBLICATIONS

Itasca Consulting Group Inc., 2002, FLAC3D (Fast Lagrangian Analysis of Continua in 3 Dimensions), Version 2.1, Minneapolis: ICG (2002)—product brochure for newest version 5.01 submitted.
Zhang et al., Deflection and propagation of fluid-driven fractures at frictional bedding interfaces: A numerical investigation, Journal of Structural Geology, 2007, pp. 396-410, 29, Elsevier Ltd.
Mack M.G. et al., Mechanics of Hydraulic Fracturing, 2000, pp. 6-1 to 6-49, Chapter 6, Reservoir Stimulation, 3rd Ed., Economides, M.J. and Nolte, K.G. (eds.), John Wiley & Sons.
Cipolla et al., Integrating Microseismic Mapping and Complex Fracture Modeling to Characterize Fracture Complexity, SPE 140185, SPE Hydraulic Fracturing Technology Conference and Exhibition, Jan. 24-26, 2011, 22 pages total, Society of Petroleum Engineers.
Daniels et al., Contacting More of the Barnett Shale Through an Integration of Real-Time Microseismic Monitoring, Petrophysics, and Hydraulic Fracture Design, SPE 110562, 2007 SPE Annual Technical Conference and Exhibition, Oct. 12-14, 2007, 12 pages total, Society of Petroleum Engineers.
Rich et al., Unconventional Geophysics for Unconventional Plays, SPE 131779, Unconventional Gas Conference, Feb. 23-25, 2010, 7 pages total, Society of Petroleum Engineers.
Koutsabeloulis et al., 3D Reservoir Geomechanical Modeling in Oil/Gas Field Production, SPE 126095, 2009 SPE Saudi Arabia Section Technical Symposium and Exhibition, May 9-11, 2009, 14 pages total, Society of Petroleum Engineers.
Mayerhofer et al., Integration of Microseismic Fracture Mapping Results With Numerical Fracture Network Production Modeling in the Barnett Shale, SPE 102103, 2006 SPE Annual Technical Conference and Exhibition, Sep. 24-27, 2006, 8 pages total, Society of Petroleum Engineers.
Mayerhofer et al., What is Stimulated Reservoir Volume (SRV)?, SPE 119890, 2008 SPE Shale Gas Production Conference, Nov. 16-18, 2008, 14 pages total, Society of Petroleum Engineers.
Warpinski et al., Stimulating Unconventional Reservoirs: Maximizing Network Growth while Optimizing Fracture Conductivity, 2008 SPE Unconventional Reservoirs Conference, Feb. 10-12, 2008, 19 pages total, Society of Petroleum Engineers.
Cipolla et al., The Relationship Between Fracture Complexity, Reservoir Properties, and Fracture Treatment Design, 2008 SPE Annual Technical Conference and Exhibition, Sep. 21-24, 2008, 25 pages total, Society of Petroleum Engineers.
Maxwell et al., Microseismic Imaging of Hydraulic Fracture Complexity in the Barnett Shale, SPE 77440, SPE Annual Technical Conference and Exhibition, Sep. 29-Oct. 2, 2002, 9 pages total, Society of Petroleum Engineers Inc.
Fisher et al., Integrating Fracture-Mapping Technologies to Improve Stimulations in the Barnett Shale, SPE 77441, 2002 SPE Annual Technical Conference and Exhibition, Sep. 29-Oct. 2, 2002, pp. 85-93, published in May 2005 in SPE Production & Facilities, Society of Petroleum Engineers.
Cipolla et al., Effect of Well Placement on Production and Frac Design in a Mature Tight Gas Field, SPE 95337, 2005 SPE Annual Technical Conference and Exhibition, Oct. 9-12, 2005, 10 pages total, Society of Petroleum Engineers.
Zhao et al., Numerical Stimulation of Seismicity Induced by Hydraulic Fracturing in Naturally Fractured Reservoirs, SPE 124690, 2009 SPE Annual Technical Conference and Exhibition, Oct. 4-7, 2009, 17 pages total, Society of Petroleum Engineers.
Jeffrey et al., Hydraulic Fracture Offsetting in Naturally Fractured Reservoirs: Quantifying a Long-Recognized Process, SPE 119351, 2009 SPE Hydraulic Fracturing Technology Conference, Jan. 19-21, 2009, 15 pages total, Society of Petroleum Engineers.
Wu et al., Modeling of Interaction of Hydraulic Fractures in Complex Fracture Networks, SPE 152052, SPE Hydraulic Fracturing Technology Conference, Feb. 6-8, 2012, 14 pages total, Society of Petroleum Engineers.
Warpinski et al., Mapping Hydraulic Fracture Growth and Geometry Using Microseismic Events Detected by a Wireline Retrievable Accelerometer Array, SPE 40014, 1998 SPE Gas Technology Symposium, Mar. 15-18, 1998, pp. 335-346, Society of Petroleum Engineers, Inc.
Maxwell, Shawn, Microseismic Location Uncertainty, CSEG Recorder, Apr. 2009, pp. 41-46.
Maxwell et al., Key Criteria for a Successful Microseismic Project, SPE 134695, SPE Annual Technical Conference and Exhibition, Sep. 19-22, 2010, 16 pages total, Society of Petroleum Engineers.
Maxwell et al., What Does Microseismicity Tell Us About Hydraulic Fracturing?, SPE 146932, SPE Annual Technical Conference and Exhibition, Oct. 30-Nov. 2, 2011, 14 pages total, Society of Petroleum Engineers.
Craig et al., Using Maps of Microseismic Events to Define Reservoir Discontinuities, SPE 135290, SPE Annual Technical Conference and Exhibition, Sep. 19-22, 2010, 8 pages total, Society of Petroleum Engineers.
Williams et al., Quantitative interpretation of major planes from microseismic event locations with application in production prediction, SEG Denver 2010 Annual Meeting, pp. 2085-2089, SEG.
Weng et al., Modeling of Hydraulic Fracture Network Propagation in a Naturally Fractured Formation, SPE 140253, SPE Hydraulic Fracturing Technology Conference and Exhibition, Jan. 24-26, 2011, 18 pages total, Society of Petroleum Engineers.
Zhang et al., Coupled geomechanics-flow modelling at and below a critical stress state used to investigate common statistical properties of field production data, In: Jolley, S. J., Barr, D., Walsh, J. J. & Knipe, R. J. (eds) Structurally Complex Reservoirs, 2007, pp. 453-468, 292, London, Special Publications, The Geological Society of London.
Warpinski et al., Comparison of Single- and Dual-Array Microseismic Mapping Techniques in the Barnett Shale, SPE 95568, 2005 SPE Annual Technical Conference and Exhibition, Oct. 9-12, 2005, 10 pages total, Society of Petroleum Engineers.
Cipolla et al., Hydraulic Fracture Complexity: Diagnosis, Remediation, and Exploitation, SPE 115771, 2008 SPE Asia Pacific Oil & Gas Conference and Exhibition, Oct. 20-22, 2008, 24 pages total, Society of Petroleum Engineers.
Williams-Stroud, Sherilyn, Using Microseismic Events to Constrain Fracture Network Models and Implications for Generating Fracture Flow Properties for Reservoir Stimulation, SPE 119895, 2008 SPE Shale Gas Production Conference, Nov. 16-18, 2008, 7 pages total, Society of Petroleum Engineers.
International Search Report and Written Opinion issued in corresponding International Application No. PCT/US2013/076765 on Apr. 9, 2014, 10 pages.
Cohen et al., "Parametric Study on Completion Design in Shale Reservoirs Based on Fracturing-to-Production Simulations," Paper IPTC 17462, presented at International Petroleum Technology Conference, Doha, Qatar, Jan. 20-22, 2014, 11 pages.
Crouch et al., "The Displacement Discontinuity Method", Appendix B, Boundary Element Methods in Solid Mechanics: With Applications in Rock Mechanic and Geological Engineering, George Allen & Unwin Ltd., London, Jan. 20, 1983, pp. 79-109 and 293-303.
Daneyshy et al., "Fracture shadowing: a direct method for determining of the reach and propagation pattern of hydraulic fractures in horizontal wells", SPE paper 151980, SPE Hydraulic Fracturing Technology Conference, The Woodlands, TX, Feb. 6-8, 2012.
Derschowitz, et al., "A Discrete fracture network approach for evaluation of hydraulic fracture stimulation of naturally fractured reservoirs", ARMA10-475, Presented at 44th US Rock Mechanics symposium, Salt Lake City, Utah, Jun. 27-30, 8 pages.
Examination Report issued in European Application No. 12845204.2 on Dec. 21, 2015; 8 pages.
Fu, et al., "Simulating complex fracture systems in geothermal reservoirs using an explicitly coupled hydro-geomechanical model", ARMA 11-244, presented at 45 US Rock Mechanics Symposium, San Francisco, CA, Jun. 26-29, 2011, 10 pages.
International Search Report and Written Opinion issued in International Application No. PCT/US20121063340 on Jan. 10, 2013; 8 pages.
Nagel et al., "Simulating hydraulic fracturing in real fractured rock — overcoming the limits of Pseudo 3D Models", SPE Paper

(56) References Cited

OTHER PUBLICATIONS 140480 presented at the SPE Hydraulic Fracturing Conference and Exhibition, Woodlands, Texas, USA, Jan. 24-26, 2011, 15 pages.
Nagel et al., "Stress shadowing and microseismic events: a numerical evaluation", SPE Paper 147363 presented at the SPE Annual Technical Conference and Exhibition, Denver, Colorado, USA, Oct. 30-Nov. 2, 2011, 21 pages.
Narendran, et al., "Analysis of growth and interaction of multiple hydraulic fractures", SPE paper 12272 presented at the Reservoir Simulation Symposium, San Francisco, CA, Nov. 15-18, 1983, pgs. 14 pgs.
Office Action issued in Chinese Patent Application No. 201280066343.7 on Nov. 26, 2015; 10 pages.
Rogers et al., "Understanding hydraulic fracture geometry and interactions in the Horn River Basin through DFN and numerical modeling", SPE paper 137488 presented at CSUG conference, Calgary, Alberta, Canada, Oct. 19-21, 2010, 12 pages.
Rogers et al., "Understanding hydraulic fracture geometry and interactions in pre-conditioning through DFN and numerical modeling", ARMA 11-439, presented at 45 US Rock Mechanics Symposium, San Francisco, CA, Jun. 26-29, 2011, 6 pgs.
Roussel et al., "Implications of fracturing pressure data recorded during a horizontal completion on stage spacing design", SPE paper 152631 presented at the SPE Hydraulic Fracturing Technology Conference, Woodlands, Texas, Feb. 5-8, 2012, 14 pgs.
Search Report issued in European Application No. 12845204.2 on Dec. 8, 2015; 5 pages.
Sneddon et al. 1946. The opening of a Griffith crack under internal pressure. Quarterly Applied Mathematics. vol. 4, No. 3, 262-267.
Sneddon, "The distribution of stress in the neighborhood of a crack in an elastic solid", Proc. Royal Society of London, Series A, vol. 187, 229-260, 1946.
Ku et al., "Characterization of Hydraulically-Induced Fracture Network Using Treatment and Microseismic Data in a Tight-Gas Formation: A Geomechanical Approach", SPE-125237, 2009 SPE Tight Gas Completions Conference, Jun. 2009, 5 pages.
International Search Report and Written Opinion issued in PCT/US2016/023013 on Jun. 24, 2016; 10 pages.
Examination Report issued in European Patent Application No. 12845204.2 on Nov. 24, 2016; 7 pages.
Office Action issued in Chinese Patent Application No. 201380073405.1 on Nov. 2, 2016; 10 pages.
International Search Report and Written Opinion issued in International Patent Application No. PCT/US2014/064205 on Feb. 23, 2016; 11 pages.
Decision on Grant issued in Russian Patent Application No. 2015130593/03(047134) on Jul. 6, 2016; 22 pages (with English Translation).

* cited by examiner

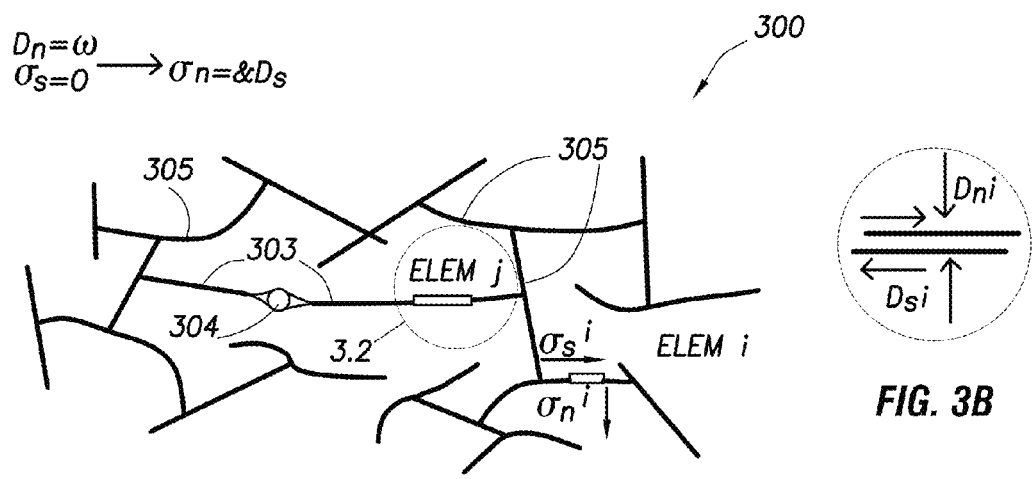
FIG. 3A
FIG. 3B
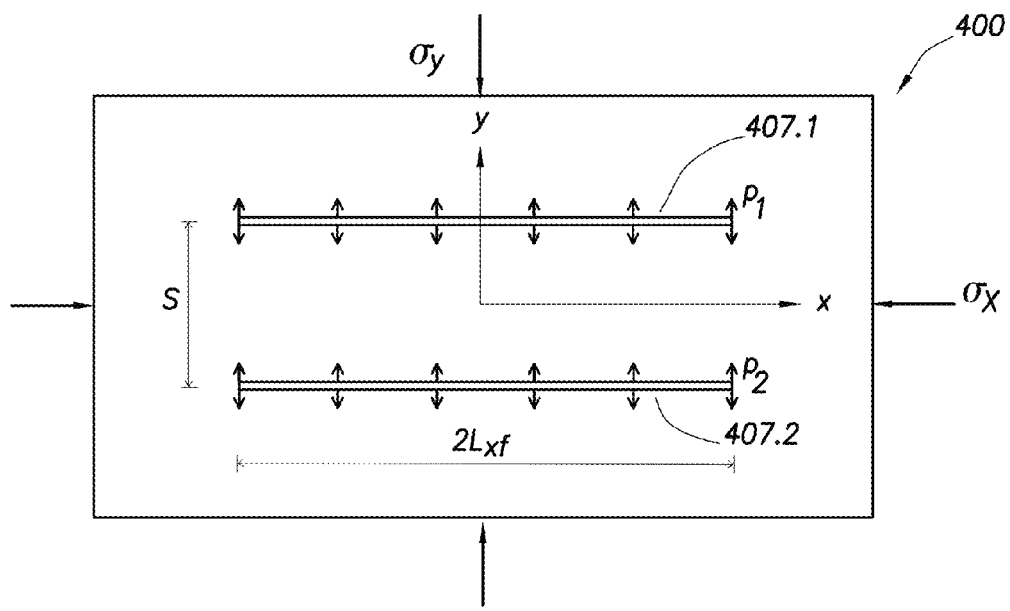
FIG. 4

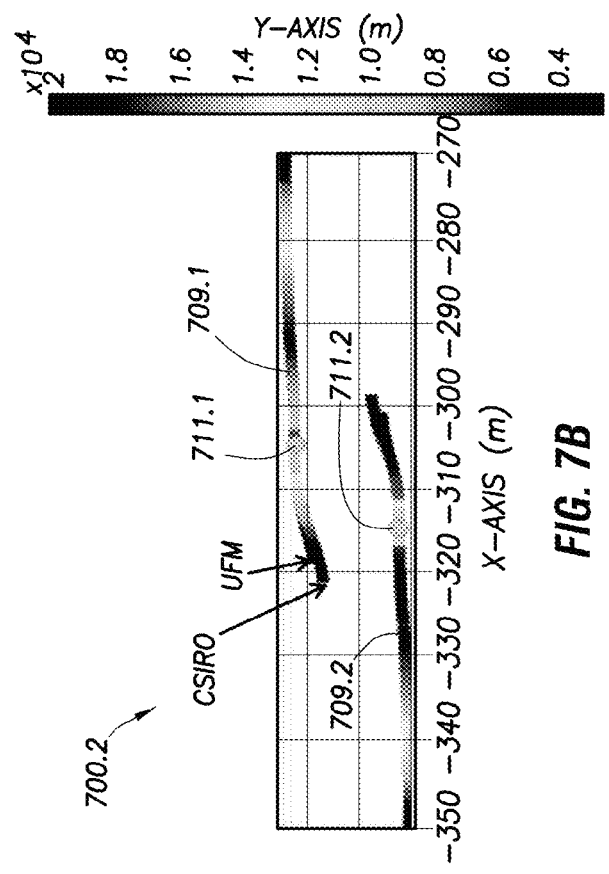
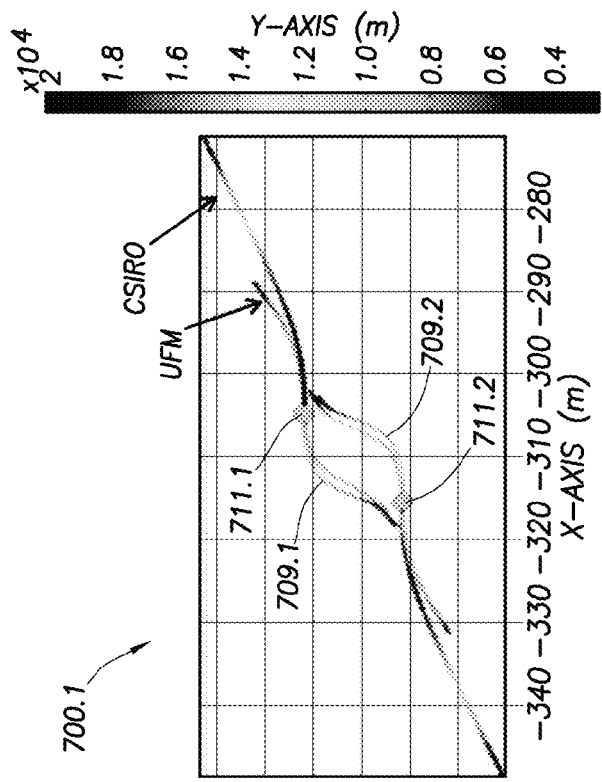
FIG. 7B
FIG. 7A

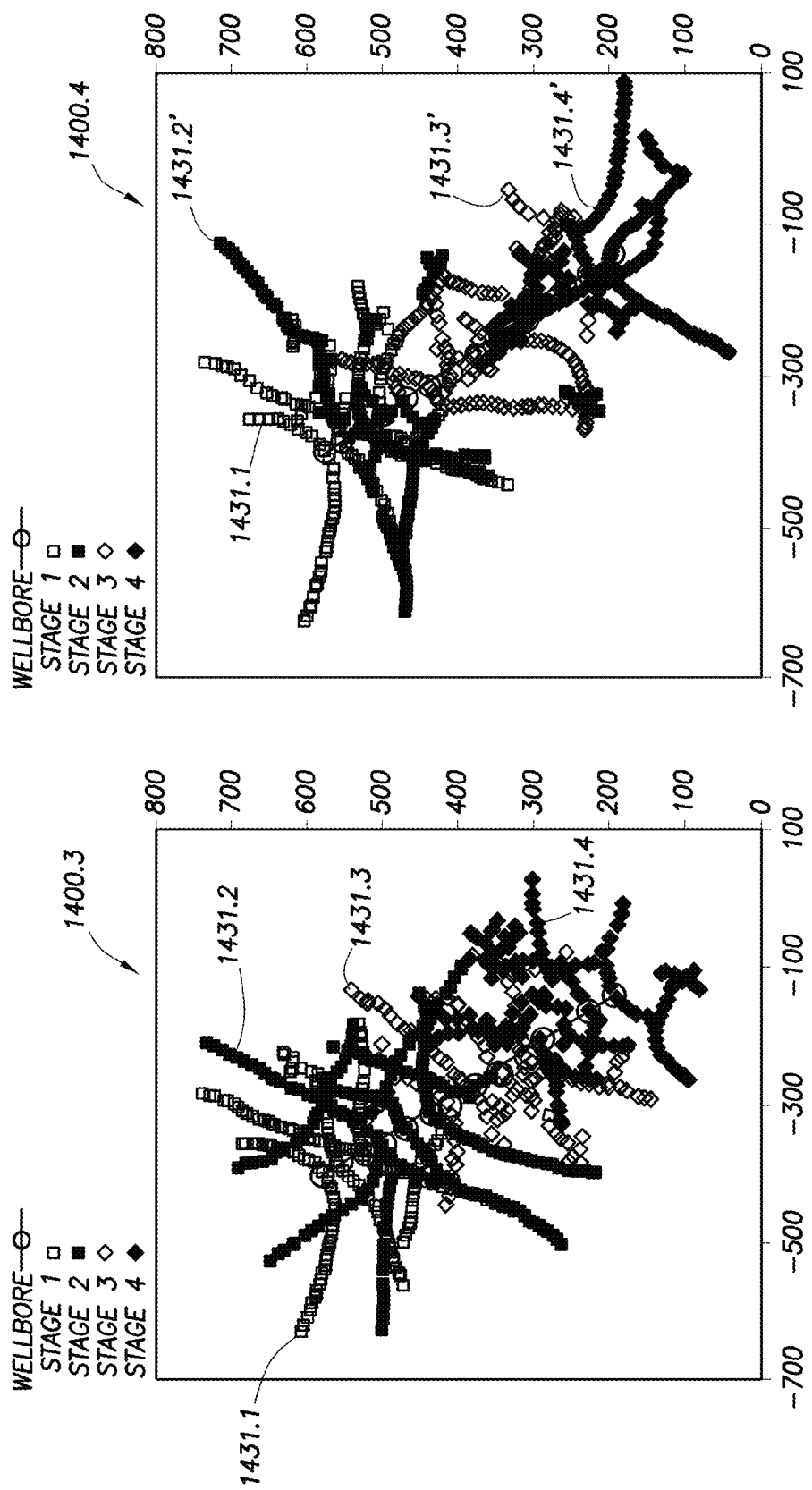

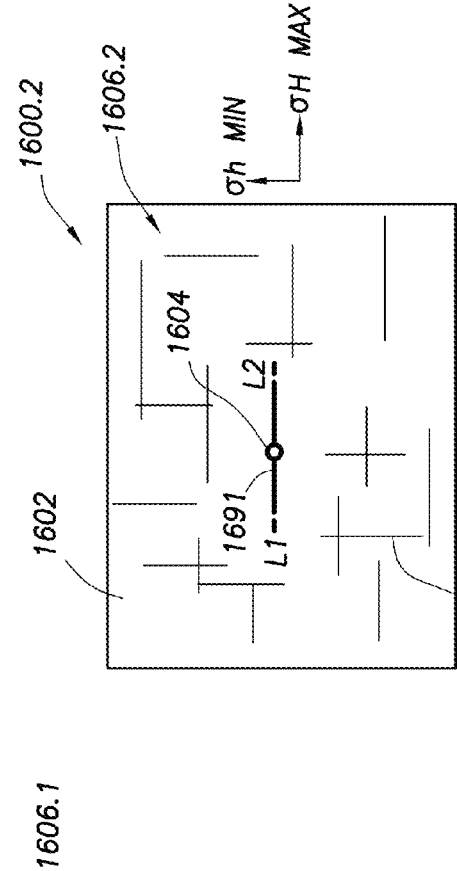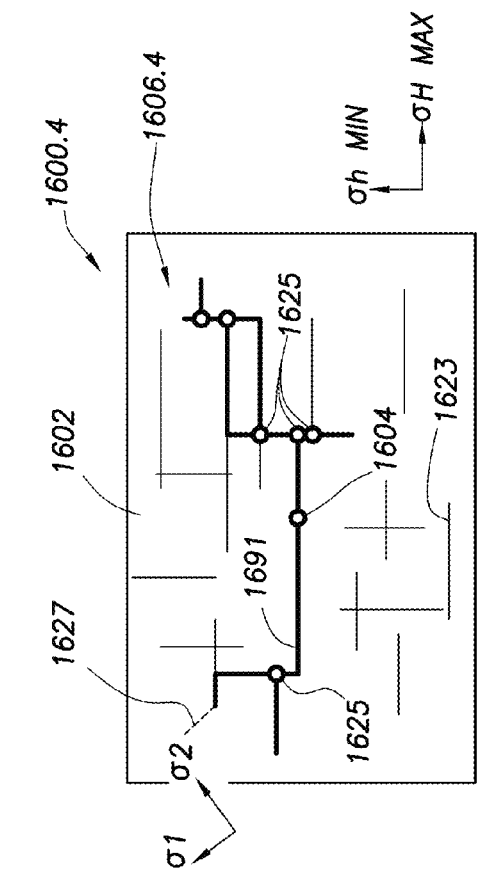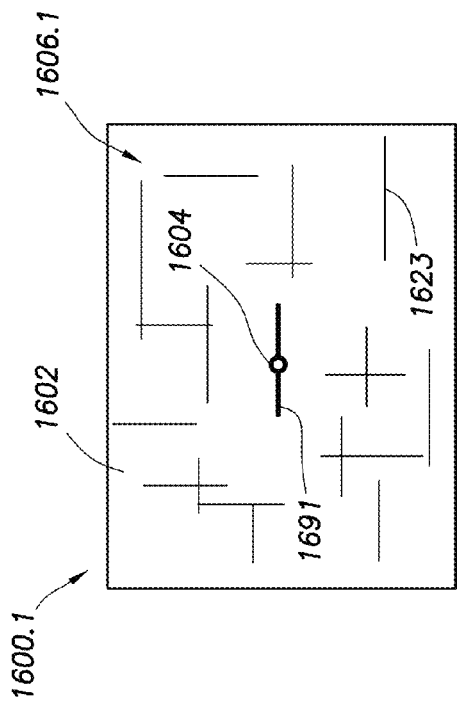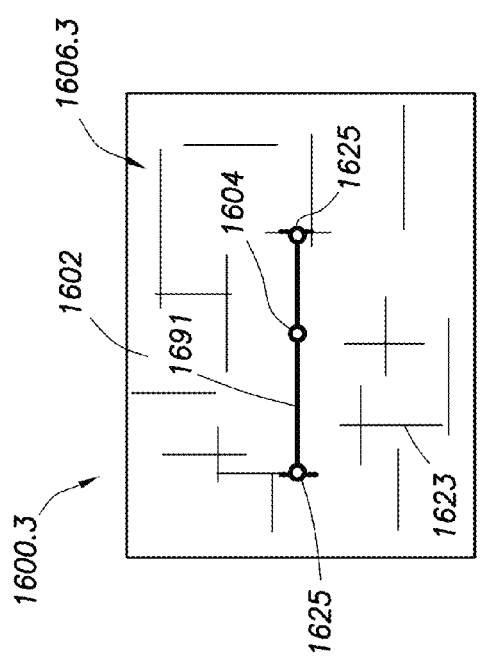

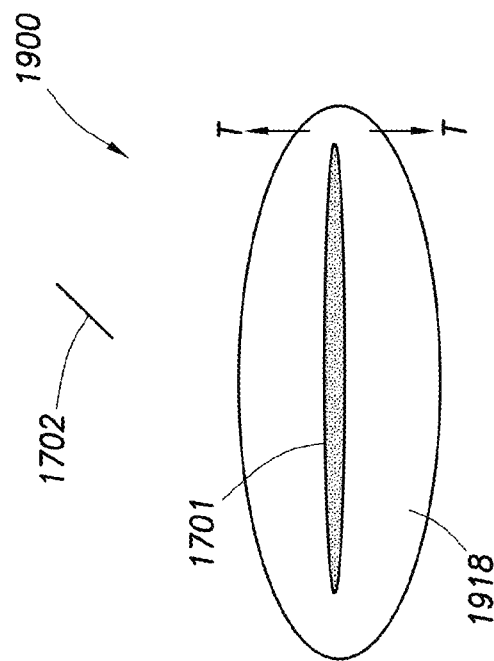
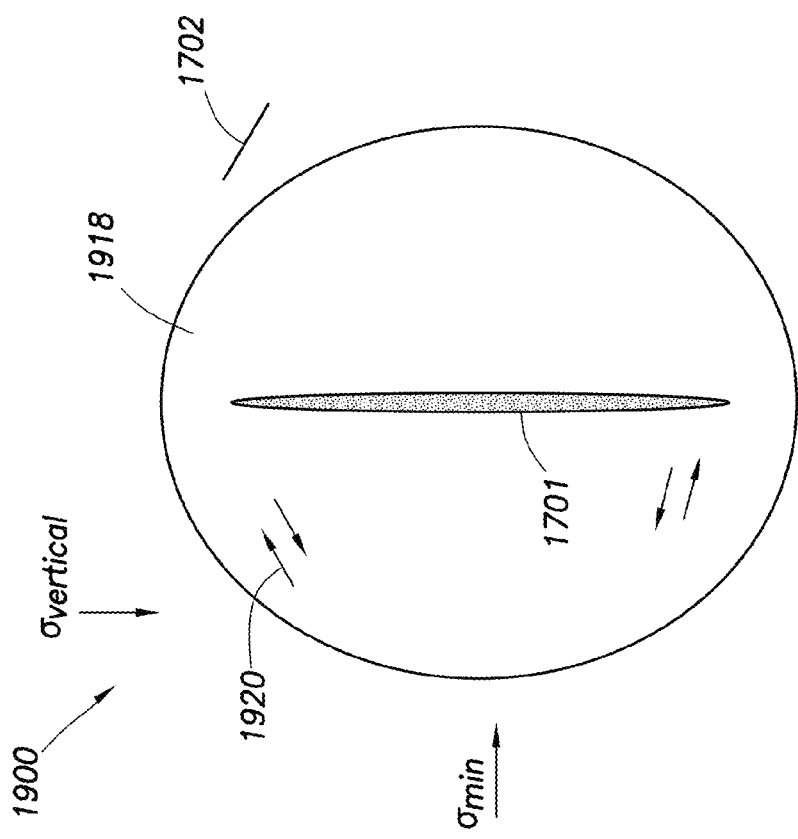
FIG. 19B
FIG. 19A

METHOD OF CALIBRATING FRACTURE GEOMETRY TO MICROSEISMIC EVENTS

CROSS REFERENCE TO RELATED APPLICATION

This application claims priority to U.S. Provisional Application No. 61/746,183 filed on Dec. 27, 2012, the entire contents of which are hereby incorporated by reference herein. This application is a continuation in part of U.S. Patent Application No. 61/628,690, filed Nov. 4, 2011, the entire contents of which are hereby incorporated by reference herein. This application is a continuation in part of International Patent Application No. PCT/US2012/063340, filed Nov. 2, 2012, the entire contents of which are hereby incorporated by reference herein.

BACKGROUND

The present disclosure relates generally to methods and systems for performing wellsite operations. More particularly, this disclosure is directed to methods and systems for performing fracture operations, such as investigating subterranean formations and characterizing hydraulic fracture networks in a subterranean formation.

In order to facilitate the recovery of hydrocarbons from oil and gas wells, the subterranean formations surrounding such wells can be hydraulically fractured. Hydraulic fracturing may be used to create cracks in subsurface formations to allow oil or gas to move toward the well. A formation is fractured by introducing a specially engineered fluid (referred to as "fracturing fluid" or "fracturing slurry" herein) at high pressure and high flow rates into the formation through one or more wellbores. Hydraulic fractures may extend away from the wellbore hundreds of feet in two opposing directions according to the natural stresses within the formation. Under certain circumstances, they may form a complex fracture network. Complex fracture networks can include induced hydraulic fractures and natural fractures, which may or may not intersect, along multiple azimuths, in multiple planes and directions, and in multiple regions.

Current hydraulic fracture monitoring methods and systems may map where the fractures occur and the extent of the fractures. Some methods and systems of microseismic monitoring may process seismic event locations by mapping seismic arrival times and polarization information into three-dimensional space through the use of modeled travel times and/or ray paths. These methods and systems can be used to infer hydraulic fracture propagation over time Patterns of hydraulic fractures created by the fracturing stimulation may be complex and may form a fracture network as indicated by a distribution of associated microseismic events. Complex hydraulic fracture networks have been developed to represent the created hydraulic fractures. Examples of fracture techniques are provided in U.S. Pat. Nos. 6,101,447, 7,363,162, 7,788,074, Application Nos. 20080133186, 20100138196, and 20100250215.

SUMMARY

In at least one aspect, the present disclosure relates to methods of performing a fracture operation at a wellsite. The wellsite is positioned about a subterranean formation having a wellbore therethrough and a fracture network therein. The fracture network has natural fractures therein. The wellsite may be stimulated by injection of an injection fluid with proppant into the fracture network. The method involves obtaining wellsite data comprising natural fracture parameters of the natural fractures and obtaining a mechanical earth model of the subterranean formation and generating a hydraulic fracture growth pattern for the fracture network over time. The generating involves extending hydraulic fractures from the wellbore and into the fracture network of the subterranean formation to form a hydraulic fracture network including the natural fractures and the hydraulic fractures, determining hydraulic fracture parameters of the hydraulic fractures after the extending, determining transport parameters for the proppant passing through the hydraulic fracture network, and determining fracture dimensions of the hydraulic fractures from the determined hydraulic fracture parameters, the determined transport parameters and the mechanical earth model. The method also involves performing stress shadowing on the hydraulic fractures to determine stress interference between the hydraulic fractures and repeating the generating based on the determined stress interference.

If the hydraulic fracture encounters a natural fracture, the method may also involve determining the crossing behavior between the hydraulic fractures and an encountered fracture based on the determined stress interference, and the repeating may involve repeating the generating based on the determined stress interference and the crossing behavior. The method may also involve stimulating the wellsite by injection of an injection fluid with proppant into the fracture network.

The method may also involve, if the hydraulic fracture encounters a natural fracture, determining the crossing behavior at the encountered natural fracture, and wherein the repeating comprises repeating the generating based on the determined stress interference and the crossing behavior. The fracture growth pattern may be altered or unaltered by the crossing behavior. A fracture pressure of the hydraulic fracture network may be greater than a stress acting on the encountered fracture, and the fracture growth pattern may propagate along the encountered fracture. The fracture growth pattern may continue to propagate along the encountered fracture until an end of the natural fracture is reached. The fracture growth pattern may change direction at the end of the natural fracture, and the fracture growth pattern may extend in a direction normal to a minimum stress at the end of the natural fracture. The fracture growth pattern may propagate normal to a local principal stress according to the stress shadowing.

The stress shadowing may involve performing displacement discontinuity for each of the hydraulic fractures. The stress shadowing may involve performing stress shadowing about multiple wellbores of a wellsite and repeating the generating using the stress shadowing performed on the multiple wellbores. The stress shadowing may involve performing stress shadowing at multiple stimulation stages in the wellbore.

The method may also involve validating the fracture growth pattern. The validating may involve comparing the fracture growth pattern with at least one simulation of stimulation of the fracture network.

The extending may involve extending the hydraulic fractures along a fracture growth pattern based on the natural fracture parameters and a minimum stress and a maximum stress on the subterranean formation. The determining fracture dimensions may include one of evaluating seismic measurements, ant tracking, sonic measurements, geological measurements and combinations thereof. The wellsite data may include at least one of geological, petrophysical, geomechanical, log measurements, completion, historical and combinations thereof. The natural fracture parameters may be generated by one of observing borehole imaging logs, estimating fracture dimensions from wellbore measurements, obtaining microseismic images, and combinations thereof.

In another aspect, the disclosure relates to a method of performing a fracture operation at a wellsite positioned about a subterranean formation having a wellbore therethrough and a fracture network therein, with the fracture network comprising natural fractures, and with the wellsite stimulated by injection of an injection fluid with proppant into the fracture network. The method involves obtaining wellsite data comprising natural fracture parameters of the natural fractures and obtaining a mechanical earth model of the subterranean formation, generating a hydraulic fracture growth pattern for the fracture network over time, performing interpretation of microseismicity on the hydraulic fractures to determine stress interference between the hydraulic fractures, and repeating the generating based on the determined stress interference. The generating involves extending hydraulic fractures from the wellbore and into the fracture network of the subterranean formation to form a hydraulic fracture network comprising the natural fractures and the hydraulic fractures, determining hydraulic fracture parameters of the hydraulic fractures after the extending, determining transport parameters for the proppant passing through the hydraulic fracture network, and determining fracture dimensions of the hydraulic fractures from the determined hydraulic fracture parameters, the determined transport parameters, and the mechanical earth model.

In another aspect, a method of performing a fracture operation at a wellsite positioned about a subterranean formation having a wellbore therethrough and a fracture network therein is provided. The fracture network includes natural fractures, and the wellsite is stimulated by injection of an injection fluid with proppant into the fracture network. The method involves generating wellsite data comprising natural fracture parameters of the natural fractures and obtaining measurements of microseismic events of the subterranean formation, modeling hydraulic fractures of the fracture network based on the wellsite data and defining a hydraulic fracture geometry of the hydraulic fractures, generating a stress field of the hydraulic fractures using a geomechanical model based on the wellsite data, determining shear failure parameters comprising a failure envelope and a stress state about the fracture network, determining a location of shear failure of the fracture network from the failure envelope and the stress state, and calibrating the hydraulic fracture geometry by comparing the modeled hydraulic fractures and the locations of shear failure against the measured microseismic events. The method may also involve measuring the wellsite data and the microseismic events at the wellsite, adjusting the natural fracture parameters operation based on the calibrating, performing a stimulation operation comprising stimulating the wellsite by injecting the injection fluid into the fracture network, and/or adjusting the stimulation operation based on the calibrating.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Embodiments of the system and method for characterizing wellbore stresses are described with reference to the following figures. The same numbers are used throughout the figures to reference like features and components.

FIGS. 3A and 3B are schematic illustrations of a stress shadow effect;

FIG. 4 is a schematic illustration comparing 2D Displacement Discontinuity Method (DDM) and Flac3D for two parallel straight fractures;

FIGS. 7A-7B are graphs depicting propagation paths for two initially offset fractures in isotropic and anisotropic stress fields, respectively;

FIGS. 14A-14D are schematic diagrams depicting a distributed fracture network at various stages;

FIGS. 16A-16D are schematic illustrations depicting fracture growth about a wellbore during a fracture operation;

FIGS. 19A and 19B are schematic diagrams illustrating cross-sectional and map views, respectively, of stresses applied to a hydraulic fracture;

DETAILED DESCRIPTION

Figure 1A:
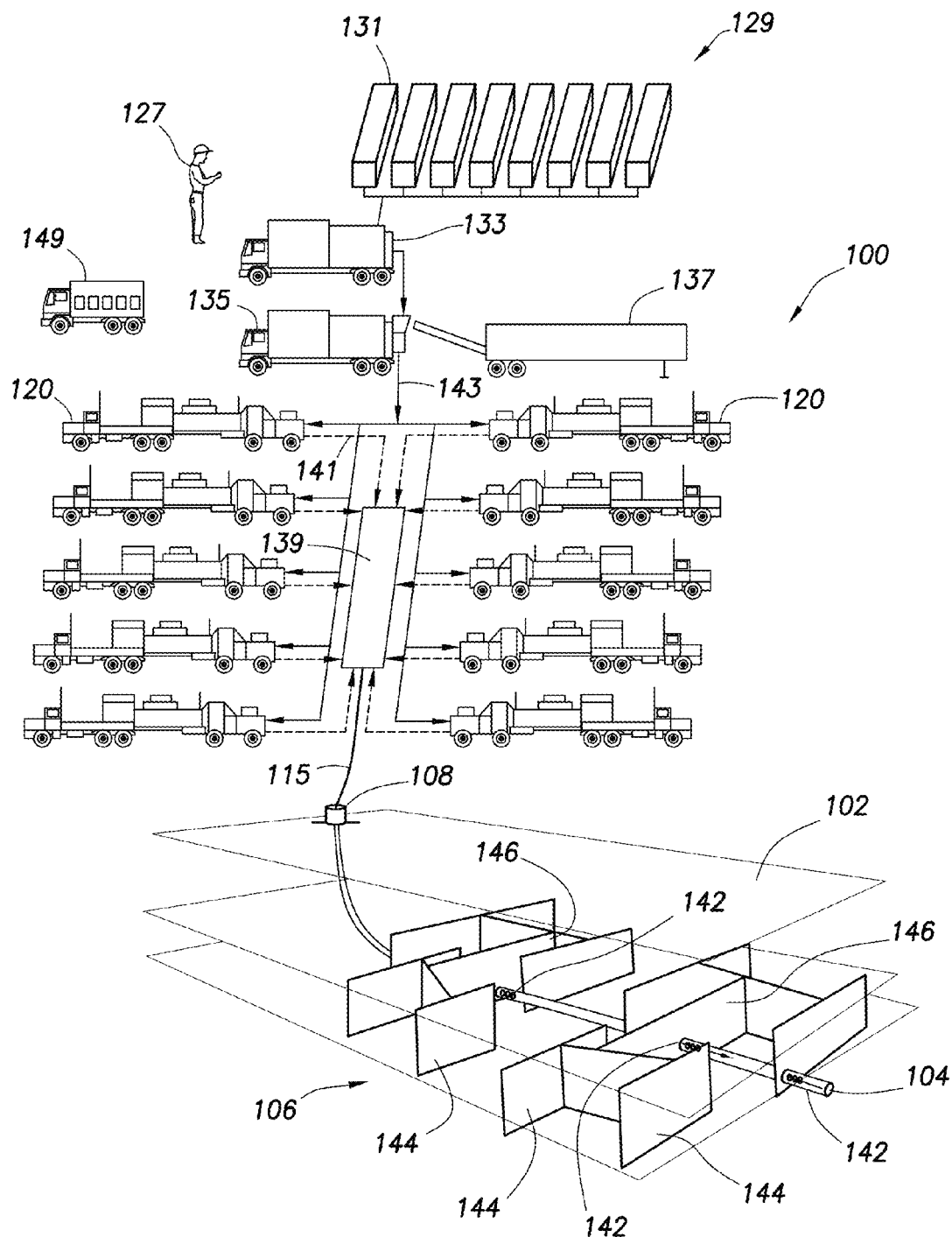
FIG. 1A is a schematic illustration of a hydraulic fracturing site depicting a fracture operation.

The description that follows includes exemplary apparatuses, methods, techniques, and instruction sequences that embody techniques of the inventive subject matter. However, it is understood that the described embodiments may be practiced without these specific details.

I. Fracture Modeling

Models have been developed to understand subsurface fracture networks. The models may consider various factors and/or data, but may not be constrained by accounting for either the amount of pumped fluid or mechanical interactions between fractures and injected fluid and among the fractures. Constrained models may be provided to give a fundamental understanding of involved mechanisms, but may be complex in mathematical description and/or require computer processing resources and time in order to provide accurate simulations of hydraulic fracture propagation. A constrained model may be configured to perform simulations to consider factors, such as interaction between fractures, over time and under desired conditions.

An unconventional fracture model (UFM) (or complex model) may be used to simulate complex fracture network propagation in a formation with pre-existing natural fractures. Multiple fracture branches can propagate simultaneously and intersect/cross each other. Each open fracture may exert additional stresses on the surrounding rock and adjacent fractures, which may be referred to as "stress shadow" effect. The stress shadow can cause a restriction of fracture parameters (e.g., width), which may lead to, for example, a greater risk of proppant screenout. The stress shadow can also alter the fracture propagation path and affect fracture network patterns. The stress shadow may affect the modeling of the fracture interaction in a complex fracture model.

A method for computing the stress shadow in a complex hydraulic fracture network is presented. The method may be performed based on an enhanced 2D Displacement Discontinuity Method (2D DDM) with correction for finite fracture height or 3D Displacement Discontinuity Method (3D DDM). The computed stress field from 2D DDM may be compared to 3D numerical simulation (3D DDM or flac3D) to determine an approximation for the 3D fracture problem. This stress shadow calculation may be incorporated in the UFM. The results for simple cases of two fractures shows the fractures can either attract or expel each other depending, for example, on their initial relative positions, and may be compared with an independent 2D non-planar hydraulic fracture model.

Additional examples of both planar and complex fractures propagating from multiple perforation clusters are presented, showing that fracture interaction may control the fracture dimension and propagation pattern. In a formation with small stress anisotropy, fracture interaction can lead to dramatic divergence of the fractures as they may tend to repel each other. However, even when stress anisotropy is large and fracture turning due to fracture interaction is limited, stress shadowing may have a strong effect on fracture width, which may affect the injection rate distribution into multiple perforation clusters, and hence overall fracture network geometry and proppant placement.

Figure 1B:
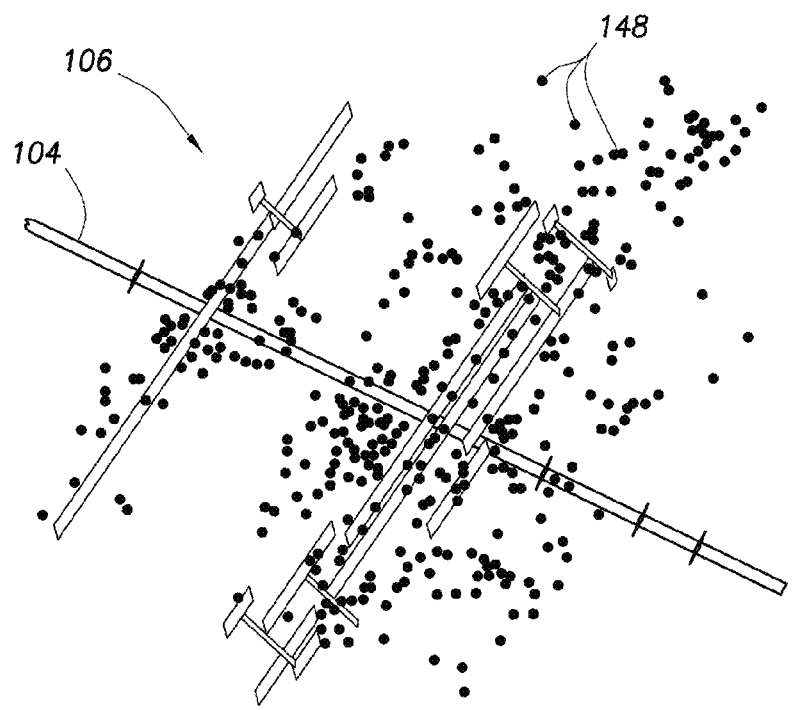
FIG. 1B is a schematic illustration of a hydraulic fracture site with microseismic events depicted thereon.

FIGS. 1A and 1B depict fracture propagation about a wellsite 100. The wellsite has a wellbore 104 extending from a wellhead 108 at a surface location and through a subterranean formation 102 therebelow. A fracture network 106 extends about the wellbore 104. A pump system 129 is positioned about the wellhead 108 for passing fluid through tubing 142.

The pump system 129 is depicted as being operated by a field operator 127 for recording maintenance and operational data and/or performing the operation in accordance with a prescribed pumping schedule. The pumping system 129 pumps fluid from the surface to the wellbore 104 during the fracture operation.

The pump system 129 may include a water source, such as a plurality of water tanks 131, which feed water to a gel hydration unit 133. The gel hydration unit 133 combines water from the tanks 131 with a gelling agent to form a gel. The gel is then sent to a blender 135 where it is mixed with a proppant from a proppant transport 137 to form a fracturing fluid. The gelling agent may be used to increase the viscosity of the fracturing fluid, and to allow the proppant to be suspended in the fracturing fluid. It may also act as a friction reducing agent to allow higher pump rates with less frictional pressure.

The fracturing fluid is then pumped from the blender 135 to the treatment trucks 120 with plunger pumps as shown by solid lines 143. Each treatment truck 120 receives the fracturing fluid at a low pressure and discharges it to a common manifold 139 (sometimes called a missile trailer or missile) at a high pressure as shown by dashed lines 141. The missile 139 then directs the fracturing fluid from the treatment trucks 120 to the wellbore 104 as shown by solid line 115. One or more treatment trucks 120 may be used to supply fracturing fluid at a desired rate.

Each treatment truck 120 may be normally operated at any rate, such as well under its maximum operating capacity. Operating the treatment trucks 120 under their operating capacity may allow for one to fail and the remaining to be run at a higher speed in order to make up for the absence of the failed pump. A computerized control system may be employed to direct the entire pump system 129 during the fracturing operation.

Various fluids, such as conventional stimulation fluids with proppants, may be used to create fractures. Other fluids, such as viscous gels, "slick water" (which may have a friction reducer (polymer) and water) may also be used to hydraulically fracture shale gas wells. Such "slick water" may be in the form of a thin fluid (e.g., nearly the same viscosity as water) and may be used to create more complex fractures, such as multiple micro-seismic fractures detectable by monitoring.

As also shown in FIGS. 1A and 1B, the fracture network includes fractures located at various positions around the wellbore 104. The various fractures may be natural fractures 144 present before injection of the fluids, or hydraulic fractures 146 generated about the formation 102 during injection. FIG. 1B shows a depiction of the fracture network 106 based on microseismic events 148 gathered using conventional means.

Multi-stage stimulation may be the norm for unconventional reservoir development. However, an obstacle to optimizing completions in shale reservoirs may involve a lack of hydraulic fracture models that can properly simulate complex fracture propagation often observed in these formations. A complex fracture network model (or UFM), has been developed (see, e.g., Weng, X, Kresse, O., Wu, R., and Gu, H., *Modeling of Hydraulic Fracture Propagation in a Naturally Fractured Formation.* Paper SPE 140253 presented at the SPE Hydraulic Fracturing Conference and Exhibition, Woodlands, Tex., USA, January 24-26 (2011) (hereafter "Weng 2011"); Kresse, O., Cohen, C., Weng, X, Wu, R., and Gu, H. 2011 (hereafter "Kresse 2011"). *Numerical Modeling of Hydraulic Fracturing in Naturally Fractured Formations.* 45th US Rock Mechanics/Geomechanics Symposium, San Francisco, Calif., June 26-29, the entire contents of which are hereby incorporated herein).

Existing models may be used to simulate fracture propagation, rock deformation, and fluid flow in the complex fracture network created during a treatment. The model may also be used to solve the fully coupled problem of fluid flow in the fracture network and the elastic deformation of the fractures, which may have similar assumptions and governing equations as conventional pseudo-3D fracture models. Transport equations may be solved for each component of the fluids and proppants pumped.

Conventional planar fracture models may model various aspects of the fracture network. The provided UFM may also involve the ability to simulate the interaction of hydraulic fractures with pre-existing natural fractures, i.e. determine whether a hydraulic fracture propagates through or is arrested by a natural fracture when they intersect and subsequently propagates along the natural fracture. The branching of the hydraulic fracture at the intersection with the natural fracture may give rise to the development of a complex fracture network.

A crossing model may be extended from Renshaw and Pollard (see, e.g., Renshaw, C. E. and Pollard, D. D. 1995, *An Experimentally Verified Criterion for Propagation across Unbounded Frictional Interfaces in Brittle, Linear Elastic Materials. Int. J. Rock Mech. Min. Sci. & Geomech. Abstr.*, 32: 237-249 (1995) the entire contents of which is hereby incorporated herein) interface crossing criterion, to apply to any intersection angle, and may be developed (see, e.g., Gu, H. and Weng, X. *Criterion for Fractures Crossing Frictional Interfaces at Non-orthogonal Angles*. 44th US Rock symposium, Salt Lake City, Utah, Jun. 27-30, 2010 (hereafter "Gu and Weng 2010"), the entire contents of which are hereby incorporated by reference herein) and validated against experimental data (see, e.g., Gu, H., Weng, X, Lund, J., Mack, M., Ganguly, U. and Suarez-Rivera R. 2011. *Hydraulic Fracture Crossing Natural Fracture at Non-Orthogonal Angles, A Criterion, Its Validation and Applications*. Paper SPE 139984 presented at the SPE Hydraulic Fracturing Conference and Exhibition, Woodlands, Tex., January 24-26 (2011) (hereafter "Gu et al. 2011"), the entire contents of which are hereby incorporated by reference herein), and integrated in the UFM.

To properly simulate the propagation of multiple or complex fractures, the fracture model may take into account an interaction among adjacent hydraulic fracture branches, often referred to as the "stress shadow" effect. When a single planar hydraulic fracture is opened under a finite fluid net pressure, it may exert a stress field on the surrounding rock that is proportional to the net pressure.

In the limiting case of an infinitely long vertical fracture of a constant finite height, an analytical expression of the stress field exerted by the open fracture may be provided. See, e.g., Warpinski, N. F. and Teufel, L. W, *Influence of Geologic Discontinuities on Hydraulic Fracture Propagation, JPT*, February, 209-220 (1987) (hereafter "Warpinski and Teufel") and Warpinski, N. R., and Branagan, P. T, *Altered-Stress Fracturing*. SPE JPT, September, 1989, 990-997 (1989), the entire contents of which are hereby incorporated by reference herein. The net pressure (or more precisely, the pressure that produces the given fracture opening) may exert a compressive stress in the direction normal to the fracture on top of the minimum in-situ stress, which may equal the net pressure at the fracture face, but quickly falls off with the distance from the fracture.

At a distance beyond one fracture height, the induced stress may be only a small fraction of the net pressure. Thus, the term "stress shadow" may be used to describe this increase of stress in the region surrounding the fracture. If a second hydraulic fracture is created parallel to an existing open fracture, and if it falls within the "stress shadow" (i.e. the distance to the existing fracture is less than the fracture height), the second fracture may, in effect, see a closure stress greater than the original in-situ stress. As a result, a higher pressure may be needed to propagate the fracture, and/or the fracture may have a narrower width, as compared to the corresponding single fracture.

One application of the stress shadow study may involve the design and optimization of the fracture spacing between multiple fractures propagating simultaneously from a horizontal wellbore. In ultra low permeability shale formations, fractures may be closely spaced for effective reservoir drainage. However, the stress shadow effect may prevent a fracture propagating in close vicinity of other fractures (see, e.g., Fisher, M K, J. R. Heinze, C. D. Harris, B. M. Davidson, C. A. Wright, and K P. Dunn, *Optimizing horizontal completion techniques in the Barnett Shale using microseismic fracture mapping*. SPE 90051 presented at the SPE Annual Technical Conference and Exhibition, Houston, 26-29 Sep. 2004, the entire contents of which are hereby incorporated by reference herein in its entirety).

The interference between parallel fractures has been studied in the past (see, e.g., Warpinski and Teufel; Britt, L. K. and Smith, M B., *Horizontal Well Completion, Stimulation Optimization, and Risk Mitigation*. Paper SPE 125526 presented at the 2009 SPE Eastern Regional Meeting, Charleston, Sep. 23-25, 2009; Cheng, Y 2009. *Boundary Element Analysis of the Stress Distribution around Multiple Fractures: Implications for the Spacing of Perforation Clusters of Hydraulically Fractured Horizontal Wells*. Paper SPE 125769 presented at the 2009 SPE Eastern Regional Meeting, Charleston, Sep. 23-25, 2009; Meyer, B. R. and Bazan, L. W, *A Discrete Fracture Network Model for Hydraulically Induced Fractures: Theory, Parametric and Case Studies*. Paper SPE 140514 presented at the SPE Hydraulic Fracturing Conference and Exhibition, Woodlands, Tex., USA, Jan. 24-26, 2011; Roussel, N. P. and Sharma, M. M, *Optimizing Fracture Spacing and Sequencing in Horizontal-Well Fracturing*, SPEPE, May, 2011, pp. 173-184, the entire contents of which are hereby incorporated by reference herein). The studies may involve parallel fractures under static conditions.

An effect of stress shadow may be that the fractures in the middle region of multiple parallel fractures may have smaller width because of the increased compressive stresses from neighboring fractures (see, e.g., Germanovich, L. N., and Astakhov D., *Fracture Closure in Extension and Mechanical Interaction of Parallel Joints. J. Geophys. Res.*, 109, B02208, doi: 10.1029/2002 JB002131 (2004); Olson, J. E., *Multi-Fracture Propagation Modeling: Applications to Hydraulic Fracturing in Shales and Tight Sands*. 42nd US Rock Mechanics Symposium and 2nd US-Canada Rock Mechanics Symposium, San Francisco, Calif., Jun. 29-Jul. 2, 2008, the entire contents of which are hereby incorporated by reference herein). When multiple fractures are propagating simultaneously, the flow rate distribution into the fractures may be a dynamic process and may be affected by the net pressure of the fractures. The net pressure may be strongly dependent on fracture width, and hence, the stress shadow effect on flow rate distribution and fracture dimensions warrants further study.

The dynamics of simultaneously propagating multiple fractures may also depend on the relative positions of the initial fractures. If the fractures are parallel, e.g. in the case of multiple fractures that are orthogonal to a horizontal wellbore, the fractures may repel each other, resulting in the fractures curving outward. However, if the multiple fractures are arranged in an en echlon pattern, e.g. for fractures initiated from a horizontal wellbore that is not orthogonal to the fracture plane, the interaction between the adjacent fractures may be such that their tips attract each other and even connect (see, e.g., Olson, J. E. *Fracture Mechanics Analysis of Joints and Veins*. PhD dissertation, Stanford University, San Francisco, Calif. (1990); Yew, C. H., Mear, M E., Chang, C. C., and Zhang, X. C. *On Perforating and Fracturing of Deviated Cased Wellbores*. Paper SPE 26514 presented at SPE 68th Annual Technical Conference and Exhibition, Houston, Tex. Oct. 3-6 (1993); Weng, X, *Fracture Initiation and Propagation from Deviated Wellbores*. Paper SPE 26597 presented at SPE 68th Annual Technical Conference and Exhibition, Houston, Tex., Oct. 3-6 (1993), the entire contents of which are hereby incorporated by reference herein).

When a hydraulic fracture intersects a secondary fracture oriented in a different direction, it may exert an additional closure stress on the secondary fracture that is proportional to the net pressure. This stress may be derived and be taken into account in the fissure opening pressure calculation in the analysis of pressure-dependent leakoff in fissured formation (see, e.g., Nolte, K., *Fracturing Pressure Analysis for nonideal behavior*. JPT, February 1991, 210-218 (SPE 20704) (1991) (hereafter "Nolte 1991"), the entire contents of which are hereby incorporated by reference herein).

For more complex fractures, a combination of various fracture interactions as discussed above may be present. To properly account for these interactions and remain computationally efficient so it can be incorporated in the complex fracture network model, a proper modeling framework may be constructed. A method based on an enhanced 2D Displacement Discontinuity Method (2D DDM) may be used for computing the induced stresses on a given fracture and in the rock from the rest of the complex fracture network (see, e.g., Olson, J. E., *Predicting Fracture Swarms—The Influence of Sub critical Crack Growth and the Crack-Tip Process Zone on Joints Spacing in Rock. In The Initiation, Propagation and Arrest of Joints and Other Fractures*, ed. J. W. Cosgrove and T. Engelder, Geological Soc. Special Publications, London, 231, 73-87 (2004) (hereafter "Olson 2004"), the entire contents of which are hereby incorporated by reference herein). Fracture turning may also be modeled based on the altered local stress direction ahead of the propagating fracture tip due to the stress shadow effect. The simulation results from the UFM model that incorporates the fracture interaction modeling are presented.

UFM Model Description

To simulate the propagation of a complex fracture network that consists of many intersecting fractures, equations governing the underlying physics of the fracturing process may be used. The basic governing equations may include, for example, equations governing fluid flow in the fracture network, the equation governing the fracture deformation, and the fracture propagation/interaction criterion.

Continuity equation assumes that fluid flow propagates along a fracture network with the following mass conservation:

$$\frac{\partial q}{\partial s} + \frac{\partial (H_{fl}\overline{w})}{\partial t} + q_L = 0 \tag{1}$$

where q is the local flow rate inside the hydraulic fracture along the length, w is an average width or opening at the cross-section of the fracture at position s=s (x,y), $H_{fl}$ is the height of the fluid in the fracture, and $q_L$ is the leak-off volume rate through the wall of the hydraulic fracture into the matrix per unit height (velocity at which fracturing fluid infiltrates into surrounding permeable medium) which is expressed through Carter's leak-off model. The fracture tips propagate as a sharp front, and the length of the hydraulic fracture at any given time t is defined as l(t).

The properties of driving fluid may be defined by power-law exponent n' (fluid behavior index) and consistency index K'. The fluid flow could be laminar, turbulent or Darcy flow through a proppant pack, and may be described correspondingly by different laws. For the general case of 1D laminar flow of power-law fluid in any given fracture branch, the Poiseuille law (see, e.g., Nolte, 1991) may be used:

$$\frac{\partial p}{\partial s} = -\alpha_0 \frac{1}{\overline{w}^{2n'+1}} \frac{q}{H_{fl}} \left|\frac{q}{H_{fl}}\right|^{n'-1} \tag{2}$$

where $$\alpha_0 = \frac{2K'}{\phi(n')^{n'}} \cdot \left(\frac{4n'+2}{n'}\right)^{n'}; \tag{3}$$

$$\phi(n') = \frac{1}{H_{fl}} \int_{H_{fl}} \left(\frac{w(z)}{\overline{w}}\right)^{\frac{2n'+1}{n'}} dz$$

Here w(z) represents fracture width as a function of depth at current position s, α is coefficient, n' is power law exponent (fluid consistency index), φ is shape function, and dz is the integration increment along the height of the fracture in the formula.

Fracture width may be related to fluid pressure through the elasticity equation. The elastic properties of the rock (which may be considered as mostly homogeneous, isotropic, linear elastic material) may be defined by Young's modulus E and Poisson's ratio v. For a vertical fracture in a layered medium with variable minimum horizontal stress $\sigma_h$(x, y, z) and fluid pressure p, the width profile (w) can be determined from an analytical solution given as:

$$w(x,y,z)=w(p(x,y),H,z) \tag{4}$$

where W is the fracture width at a point with spatial coordinates x, y, z (coordinates of the center of fracture element); p(x,y) is the fluid pressure, H is the fracture element height, and z is the vertical coordinate along fracture element at point (x,y).

Because the height of the fractures may vary, the set of governing equations may also include the height growth calculation as described, for example, in Kresse 2011.

In addition to equations described above, the global volume balance condition may be satisfied:

$$\int_0^t Q(t)dt = \int_0^{L(t)} H(s,t)\overline{w}(s,t)ds + \int_{H_L}\int_0^t\int_0^{L(t)} 2g_L \, ds \, dt \, dh_l \tag{5}$$

where $g_L$ is fluid leakoff velocity, Q(t) is time dependent injection rate, H(s,t) height of the fracture at spacial point s(x,y) and at the time t, ds is length increment for integration along fracture length, $d_t$ is time increment, $dh_l$ is increment of leakoff height, $H_L$ is leakoff height, an $s_0$ is a spurt loss coefficient. Equation (5) provides that the total volume of fluid pumped during time t is equal to the volume of fluid in the fracture network and the volume leaked from the fracture up to time t. Here L(t) represents the total length of the HFN at the time t and $S_0$ is the spurt loss coefficient. The boundary conditions may require the flow rate, net pressure and fracture width to be zero at all fracture tips.

The system of Eq. 1-5, together with initial and boundary conditions, may be used to represent a set of governing equations. Combining these equations and discretizing the fracture network into small elements may lead to a nonlinear system of equations in terms of fluid pressure p in each element, simplified as f(p)=0, which may be solved by using a damped Newton-Raphson method.

Fracture interaction may be taken into account to model hydraulic fracture propagation in naturally fractured reservoirs. This includes, for example, the interaction between hydraulic fractures and natural fractures, as well as interaction between hydraulic fractures. For the interaction between hydraulic and natural fractures a semi-analytical crossing criterion may be implemented in the UFM using, for example, the approach described in Gu and Weng 2010, and Gu et al. 2011.

Modeling of Stress Shadow

Figure 2:
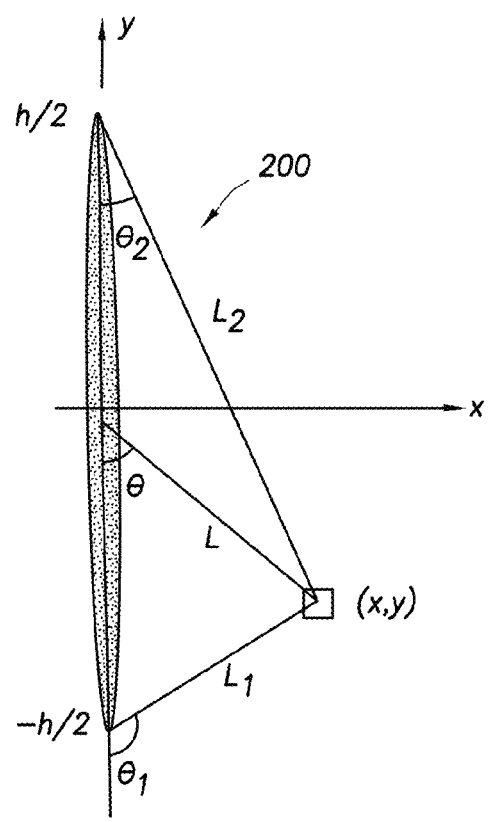
FIG. 2 is a schematic illustration of a 2D fracture.

For parallel fractures, the stress shadow can be represented by the superposition of stresses from neighboring fractures. FIG. 2 is a schematic depiction of a 2D fracture 200 about a coordinate system having an x-axis and a y-axis. Various points along the 2D fractures, such as a first end at h/2, a second end at −h/2 and a midpoint are extended to an observation point (x,y). Each line L extends at angles $\theta_1$, $\theta_2$ from the points along the 2D fracture to the observation point.

The stress field around a 2D fracture with internal pressure p can be calculated using, for example, the techniques as described in Warpinski and Teufel. The stress that affects fracture width is $\sigma_x$, and can be calculated from:

$$\sigma_x = \qquad (6)$$
$$p\left[1 - \frac{L}{\sqrt{L_1 L_2}} \cos\left(\theta - \frac{\theta_1 + \theta_2}{2}\right) - \frac{L}{(L_1 L_2)^{\frac{3}{2}}} \sin\theta \sin\left(\frac{3}{2}(\theta_1 + \theta_2)\right)\right]$$

where $$\theta = \arctan\left(-\frac{\bar{x}}{\bar{y}}\right) \qquad (7.1)$$

$$\theta_1 = \arctan\left(-\frac{\bar{x}}{1 + \bar{y}}\right) \qquad (7.2)$$

$$\theta_2 = \arctan\left(\frac{\bar{x}}{1 - \bar{y}}\right) \qquad (7.3)$$

and where $\sigma_x$ is stress in the x direction, p is internal pressure, and $\bar{x}, \bar{y}, \bar{L}, \bar{L}_1, \bar{L}_2$ are the coordinates and distances in FIG. 2 normalized by the fracture half-height h/2. Since $\sigma_x$ varies in the y-direction as well as in the x-direction, an averaged stress over the fracture height may be used in the stress shadow calculation.

The analytical equation given above can be used to compute the average effective stress of one fracture on an adjacent parallel fracture and can be included in the effective closure stress on that fracture.

For more complex fracture networks, the fractures may orient in different directions and intersect each other. FIG. 3 shows a complex fracture network 300 depicting stress shadow effects. The fracture network 300 includes hydraulic fractures 303 extending from a wellbore 304 and interacting with other fractures 305 in the fracture network 300.

A more general approach may be used to compute the effective stress on any given fracture branch from the rest of the fracture network. In UFM, the mechanical interactions between fractures may be modeled based on an enhanced 2D Displacement Discontinuity Method (DDM) (Olson 2004) for computing the induced stresses (see, e.g., FIG. 3).

In a 2D, plane-strain, displacement discontinuity solution, (see, e.g., Crouch, S. L. and Starfield, A. M., *Boundary Element Methods in Solid Mechanics*, George Allen & Unwin Ltd, London. Fisher, M. K. (1983) (hereafter Crouch and Starfield 1983), the entire contents of which are hereby incorporated by reference) may be used to describe the normal and shear stresses ($\sigma_n$ and $\sigma_s$) acting on one fracture element induced by the opening and shearing displacement discontinuities ($D_n$ and $D_s$) from all fracture elements. To account for the 3D effect due to finite fracture height, Olson 2004 may be used to provide a 3D correction factor to the influence coefficients $C^{ij}$ in combination with the modified elasticity equations of 2D DDM as follows:

$$\sigma_n^i = \sum_{j=1}^{N} A^{ij} C_{ns}^{ij} D_s^j + \sum_{j=1}^{N} A^{ij} C_{nn}^{ij} D_n^j \qquad (8.1)$$

$$\sigma_s^i = \sum_{j=1}^{N} A^{ij} C_{ss}^{ij} D_s^j + \sum_{j=1}^{N} A^{ij} C_{sn}^{ij} D_n^j \qquad (8.2)$$

where A is a matrix of influence coefficients described in eq. (9), N is a total number of elements in the network whose interaction is considered, i is the element considered, and j=1, N are other elements in the network whose influence on the stresses on element i are calculated; and where $C^{ij}$ are the 2D, plane-strain elastic influence coefficients. These expressions can be found in Crouch and Starfield 1983.

Elem i and j of FIG. 3A schematically depict the variables i and j in equations (8.1, 8.2). Discontinuities $D_s$ and $D_n$ applied to Elem j are also depicted in FIG. 3B. $D_n$ may be the same as the fracture width, and the shear stress s may be 0 as depicted. Displacement discontinuity from Elem j creates a stress on Elem i as depicted by $\sigma_s$ and $\sigma_n$.

The 3D correction factor suggested by Olson 2004 may be presented as follows:

$$A^{ij} = 1 - \frac{d_{ij}^\beta}{[d_{ij}^2 + (h/\alpha)^2]^{\beta/2}} \qquad (8)$$

where h is the fracture height, $d_{ij}$ is the distance between elements i and j, $\alpha$ and $\beta$ are fitting parameters. Eq. 9 shows that the 3D correction factor may lead to decaying of interaction between any two fracture elements when the distance increases.

In the UFM model, at each time step, the additional induced stresses due to the stress shadow effects may be computed. It may be assumed that at any time, fracture width equals the normal displacement discontinuities ($D_n$) and shear stress at the fracture surface is zero, i.e., $D^j$. Substituting these two conditions into Eqs. 8.1 and 8.2, the shear displacement discontinuities ($D_s$) and normal stress induced on each fracture element ($\alpha_n$) may be found.

The effects of the stress shadow induced stresses on the fracture network propagation pattern may be described in two folds. First, during pressure and width iteration, the original in-situ stresses at each fracture element may be modified by adding the additional normal stress due to the stress shadow effect. This may directly affect the fracture pressure and width distribution which may result in a change on the fracture growth. Second, by including the stress shadow induced stresses (normal and shear stresses), the local stress fields ahead of the propagating tips may also be altered which may cause the local principal stress direction to deviate from the original in-situ stress direction. This altered local principal stress direction may result in the fracture turning from its original propagation plane and may further affect the fracture network propagation pattern.

Validation of Stress Shadow Model

Validation of the UFM model for the cases of bi-wing fractures may be performed using, for example, Weng 2011 or Kresse 2011. Validation may also be performed using the stress shadow modeling approach. By way of example, the results may be compared using 2D DDM to Flac 3D as provided in *Itasca Consulting Group Inc., 2002, FLAC3D (Fast Lagrangian Analysis of Continua in 3 Dimensions)*, Version 2.1, Minneapolis: ICG (2002) (hereafter "Itasca, 2002").

Comparison of Enhanced 2D DDM to Flac3D

The 3D correction factors suggested by Olson 2004 contain two empirical constants, $\alpha$ and $\beta$. The values of $\alpha$ and $\beta$ may be calibrated by comparing stresses obtained from numerical solutions (enhanced 2D DDM) to the analytical solution for a plane-strain fracture with infinite length and finite height. The model may further be validated by comparing the 2D DDM results to a full three dimensional numerical solutions, utilizing, for example, FLAC3D, for two parallel straight fractures with finite lengths and heights.

The validation problem is shown in FIG. 4. FIG. 4 a schematic diagram 400 comparing enhanced 2D DDM to Flac3D for two parallel straight fractures. As shown in FIG. 4, two parallel fractures 407.1, 407.2 are subject to stresses $\sigma_x$, $\sigma_y$ along an x, y coordinate axis. The fractures have length $2L_{xf}$, and pressure of the fracture $p_1$, $p_2$, respectively. The fractures are a distance s apart.

The fracture in Flac3D may be simulated as two surfaces at the same location but with un-attached grid points. Constant internal fluid pressure may be applied as the normal stress on the grids. Fractures may also be subject to remote stresses, $\sigma_x$ and $\sigma_y$. Two fractures may have the same length and height with the ratio of height/half-length=0.3.

Figure 5A:
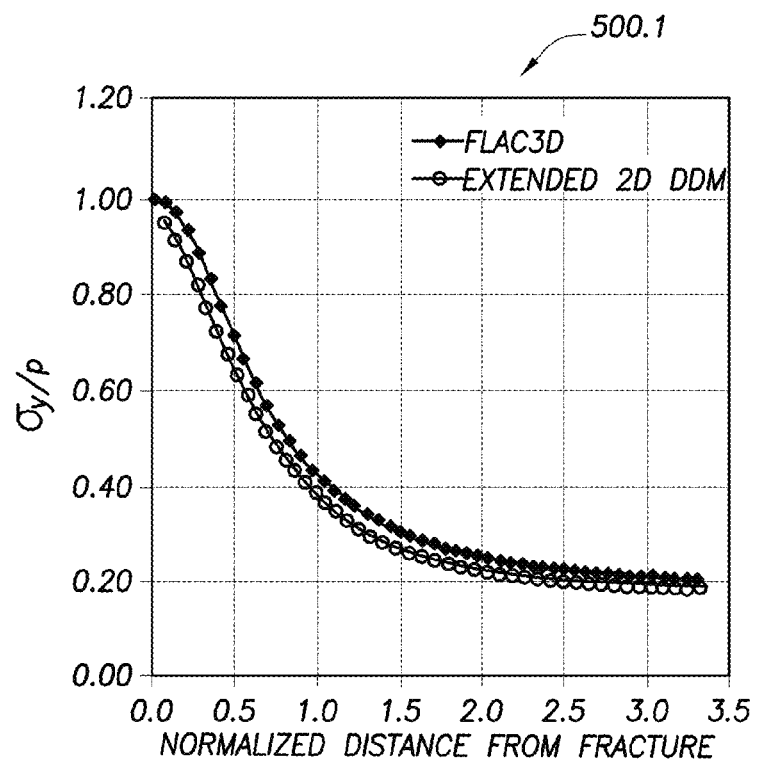
FIGS. 5A-5C are graphs illustrating 2D DDM and Flac3D of extended fractures for stresses in various positions.
Figure 5B:
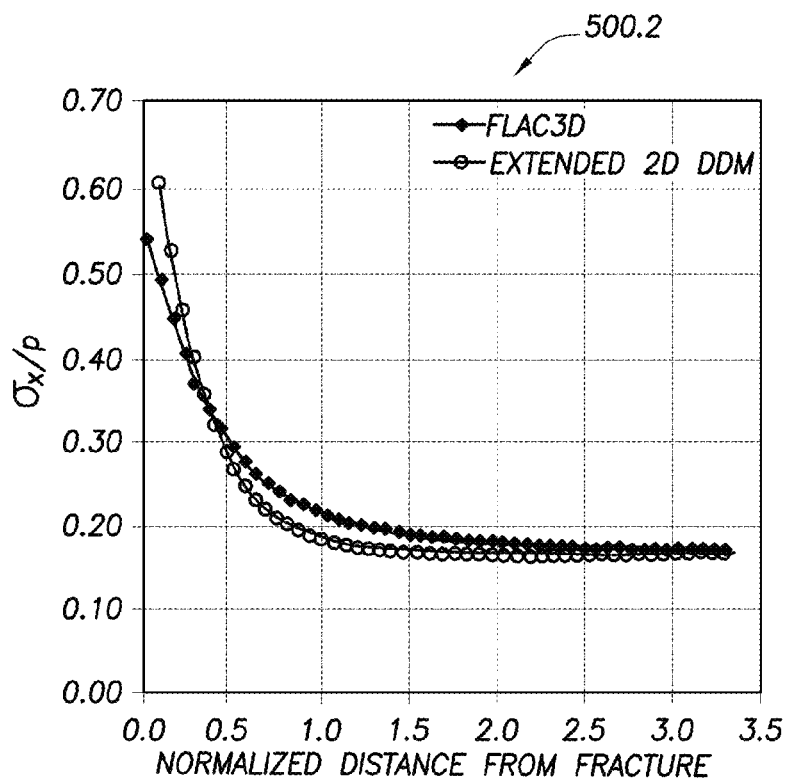
Figure 5C:
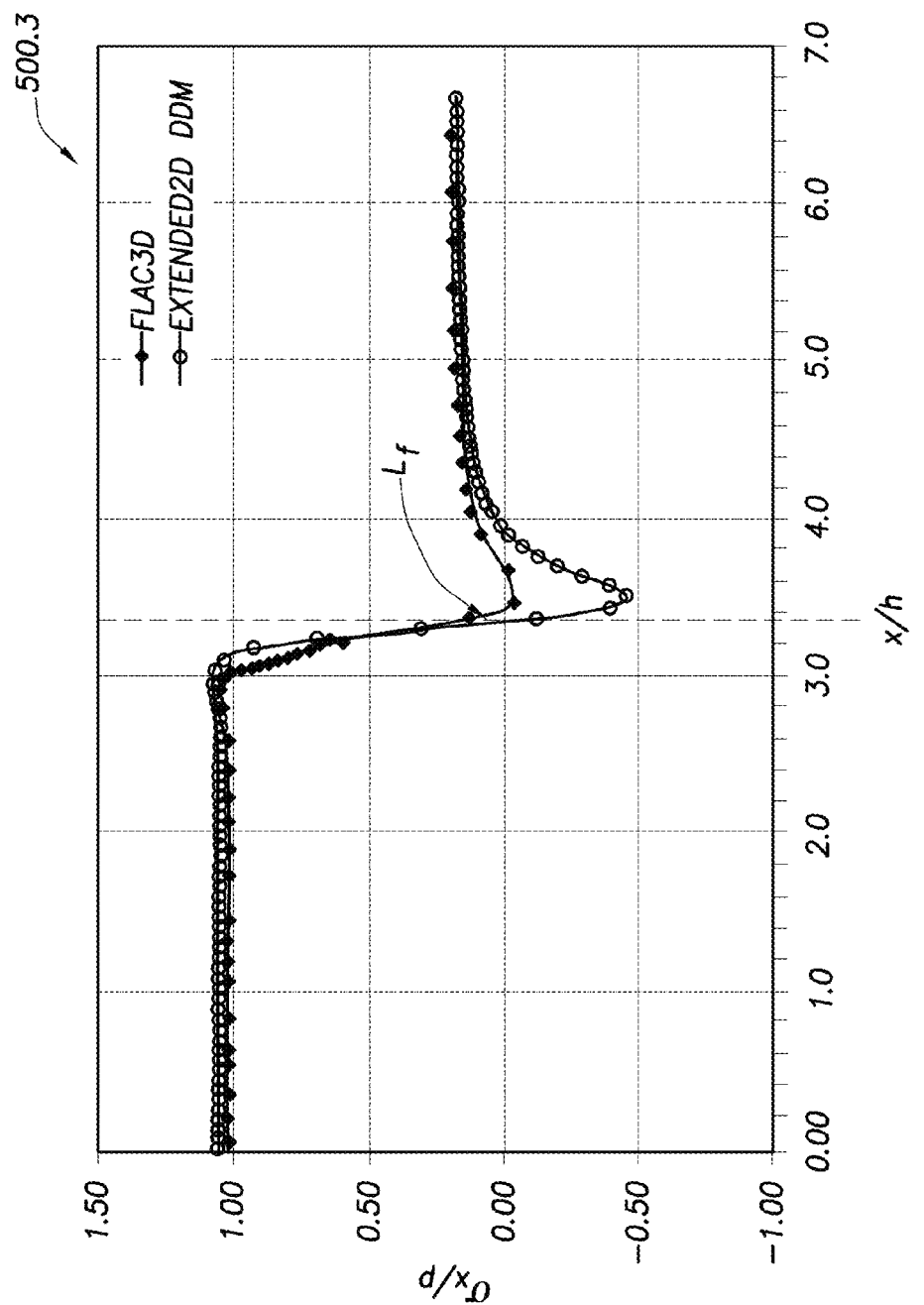

Stresses along x-axis (y=0) and y-axis (x=0) may be compared. Two closely spaced fractures (s/h=0.5) may be simulated as shown in the comparison of FIGS. 5A-5C. These figures provide a comparison of extended 2D DDM to Flac3D: Stresses along x-axis (y=0) and y-axis (x=0).

These figures include graphs 500.1, 500.2, 500.3, respectively, illustrating 2D DDM and Flac3D of extended fractures for $\sigma y$ along the y-axis, $\sigma x$ along the y-axis, and $\sigma y$ along the x-axis, respectively. FIG. 5A plots $\sigma y/p$ (y-axis) versus normalized distance from fracture (x-axis) using 2D DDM and Flac3D. FIG. 5B plots $\sigma x/p$ (y-axis) versus normalized distance from fracture (x-axis) using 2D DDM and Flac3D. FIG. 5C plots $\sigma y/p$ (y-axis) versus normalized distance from fracture (x-axis) using 2D DDM and Flac3D. The location $L_f$ of the fracture tip is depicted along line x/h.

As shown in FIGS. 5A-5C, the stresses simulated from enhanced 2D DDM approach with 3D correction factor match pretty well to those from the full 3D simulator results, which indicates that the correction factor allows capture the 3D effect from the fracture height on the stress field.

Comparison to CSIRO model

The UFM model that incorporates the enhanced 2DDM approach may be validated against full 2D DDM simulator by CSIRO (see, e.g., Zhang, X, Jeffrey, R. G., and Thiercelin, M. 2007, *Deflection and Propagation of Fluid-Driven Fractures at Frictional Bedding Interfaces: A Numerical Investigation. Journal of Structural Geology*, 29: 396-410, (hereafter "Zhang 2007") the entire contents of which is hereby incorporated by reference in its entirety). This approach may be used, for example, in the limiting case of very large fracture height where 2D DDM approaches do not consider 3D effects of the fractures height.

The comparison of influence of two closely propagating fractures on each other's propagation paths may be employed. The propagation of two hydraulic fractures initiated parallel to each other (propagating along local max stress direction) may be simulated for configurations, such as: 1) initiation points on top of each other and offset from each other for isotropic, and 2) anisotropic far field stresses. The fracture propagation path and pressure inside of each fracture may be compared for UFM and CSIRO code for the input data given in Table 1.

TABLE 1

| Input data for validation against CSIRO model | | |
|---|---|---|
| Injection rate | 0.106 m3/s | 40 bbl/min |
| Stress anisotropy | 0.9 MPa | 130 psi |
| Young's modulus | $3 \times 10^{10}$ Pa | 4.35e+6 psi |
| Poisson's ratio | 0.35 | 0.35 |
| Fluid viscosity | 0.001 pa-s | 1 cp |
| Fluid Specific Gravity | 1.0 | 1.0 |
| Min horizontal stress | 46.7 MPa | 6773 psi |
| Max horizontal stress | 47.6 MPa | 6903 psi |
| Fracture toughness | 1 MPa-m$^{0.5}$ | 1000 psi/in$^{0.5}$ |
| Fracture height | 120 m | 394 ft |

When two fractures are initiated parallel to each other with initiation points separated by dx=0, dy=33 ft (10.1 m) (max horizontal stress field is oriented in x-direction), they may turn away from each other due to the stress shadow effect.

Figure 6B:
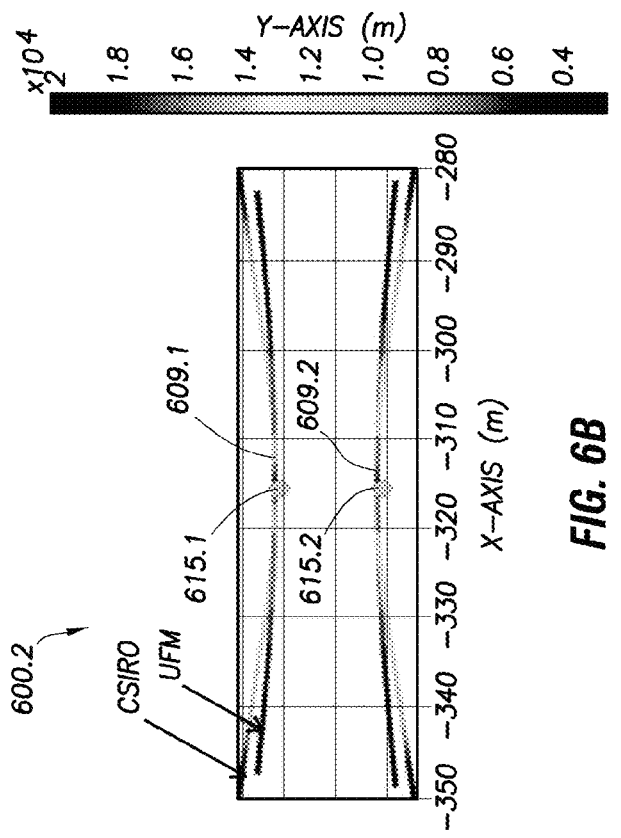
FIGS. 6A-6B are graphs depicting propagation paths for two initially parallel fractures in isotropic and anisotropic stress fields, respectively.
Figure 6A:
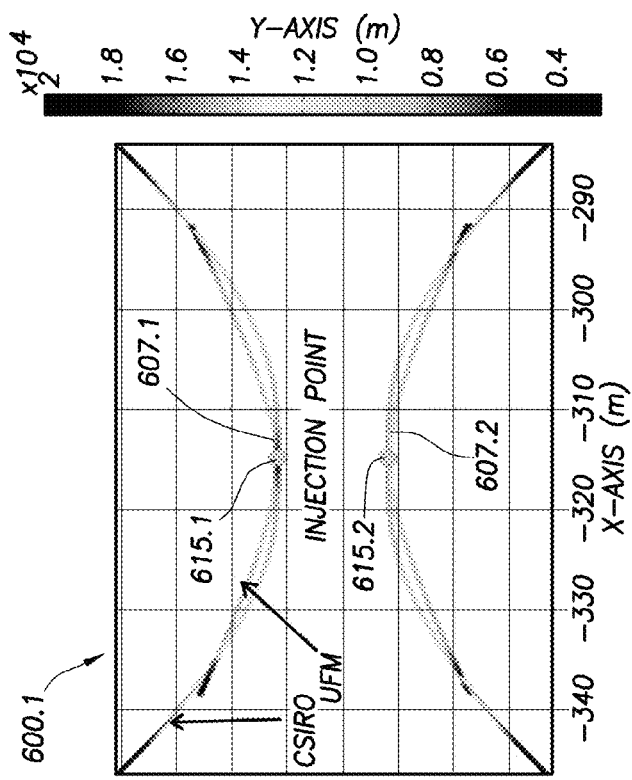

The propagation paths for isotropic and anisotropic stress fields are shown in FIGS. 6A and 6B. These figures are graphs 600.1, 600.2 depicting propagation paths for two initially parallel fractures 609.1, 609.2 in isotropic and anisotropic stress fields, respectively. The fractures 609.1 and 609.2 are initially parallel near the injection points 615.1, 615.2, but diverge as they extend away therefrom. Comparing with isotropic case, the curvatures of the fractures in the case of stress anisotropy are depicted as being smaller. This may be due to the competition between the stress shadow effect which tends to turn fractures away from each other, and far-field stresses which pushes fractures to propagate in the direction of maximum horizontal stress (x-direction). The influence of far-field stress becomes dominant as the distance between the fractures increases, in which case the fractures may tend to propagate parallel to maximum horizontal stress direction.

FIGS. 7A and 7B depict graphs 700.1, 7002 showing a pair of fractures initiated from two different injection points 711.1, 711.2, respectively. These figures show a comparison for the case when fractures are initiated from points separated by a distance dx=dy=(10.1 m) for an isotropic and anisotropic stress field, respectively. In these figures, the fractures 709.1, 709.2 tend to propagate towards each other. Examples of similar type of behavior have been observed in lab experiments (see, e.g., Zhang 2007).

As indicated above, the enhanced 2D DDM approach implemented in UFM model may be able to capture the 3D effects of finite fracture height on fracture interaction and propagation pattern, while being computationally efficient.

A good estimation of the stress field for a network of vertical hydraulic fractures and fracture propagation direction (pattern) may be provided.

Example Cases

Case #1 Parallel Fractures in Horizontal Wells

Figure 8:
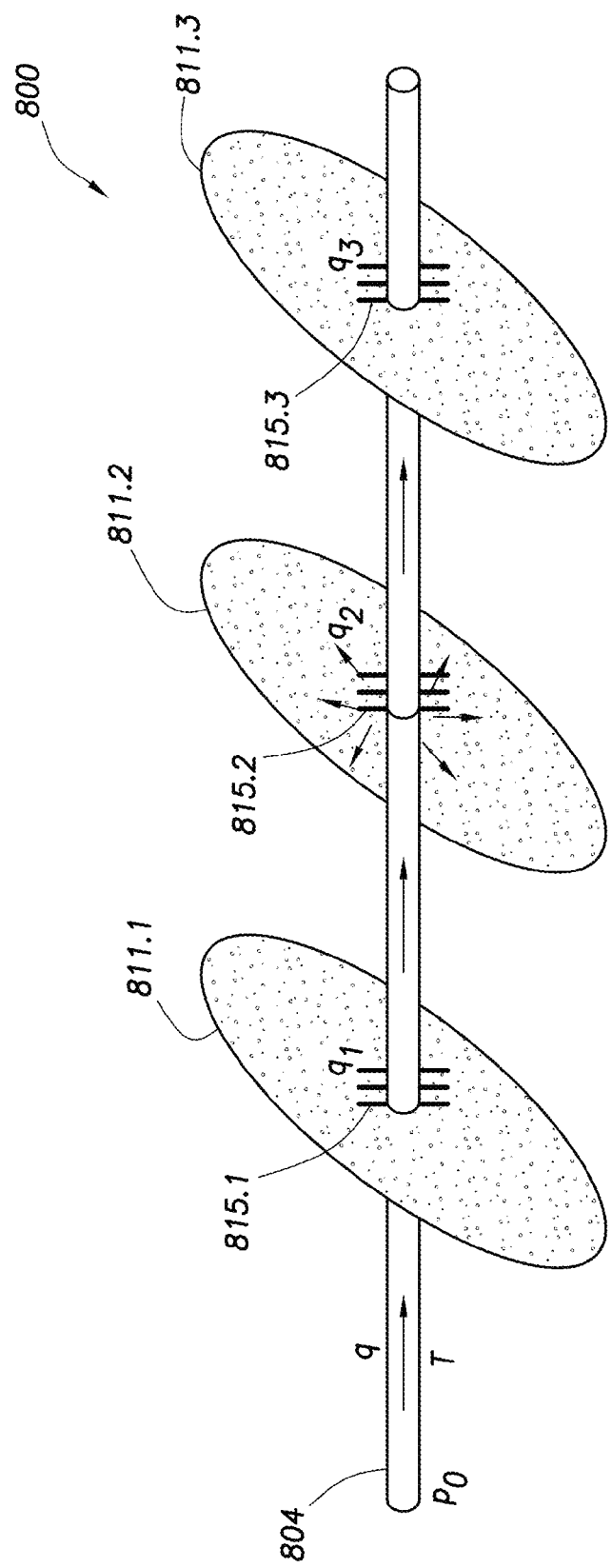
FIG. 8 is a schematic illustration of transverse parallel fractures along a horizontal well.

FIG. 8 is a schematic plot 800 of parallel transverse fractures 811.1, 811.2, 811.3 propagating simultaneously from multiple perforation clusters 815.1, 815.2, 815.3, respectively, about a horizontal wellbore 804. Each of the fractures 811.1, 811.2, 811.3 provides a different flow rate $q_1$, $q_2$, $q_3$ that is part of the total flow $q_t$ at a pressure $p_0$.

When the formation condition and the perforations are the same for all the fractures, the fractures may have about the same dimensions if the friction pressure in the wellbore between the perforation clusters is proportionally small. This may be assumed where the fractures are separated far enough and the stress shadow effects are negligible. When the spacing between the fractures is within the region of stress shadow influence, the fractures may be affected not only in width, but also in other fracture dimension. To illustrate this, a simple example of five parallel fractures may be considered.

In this example, the fractures are assumed to have a constant height of 100 ft (30.5 m). The spacing between the fractures is 65 ft (19.8 m). Other input parameters are given in Table 2.

TABLE 2

Input parameters for Case #1

| | |
|---|---|
| Young's modulus | 6.6 × 10$^6$ psi = 4.55e+10 Pa |
| Poisson's ratio | 0.35 |
| Rate | 12.2 bbl/min = 0.032 m3/s |
| Viscosity | 300 cp = 0.3 Pa-s |
| Height | 100 ft = 30.5 m |
| Leakoff coefficient | 3.9 × 10$^{-2}$ m/s$^{1/2}$ |
| Stress anisotropy | 200 psi = 1.4 Mpa |
| Fracture spacing | 65 ft = 19.8 m |
| No. of perfs per frac | 100 |

For this simple case, a conventional Perkins-Kern-Nordgren (PKN) model (see, e.g., Mack, M. G. and Warpinski, N. R., *Mechanics of Hydraulic Fracturing. Chapter 6, Reservoir Stimulation, 3rd Ed., eds. Economides,* M. J. and Nolte, K. G. John Wiley & Sons (2000)) for multiple fractures may be modified by incorporating the stress shadow calculation as given from Eq. 6. The increase in closure stress may be approximated by averaging the computed stress from Eq. 6 over the entire fracture. Note that this simplistic PKN model may not simulate the fracture turning due to the stress shadow effect. The results from this simple model may be compared to the results from the UFM model that incorporates point-by-point stress shadow calculation along the entire fracture paths as well as fracture turning.

Figure 9:
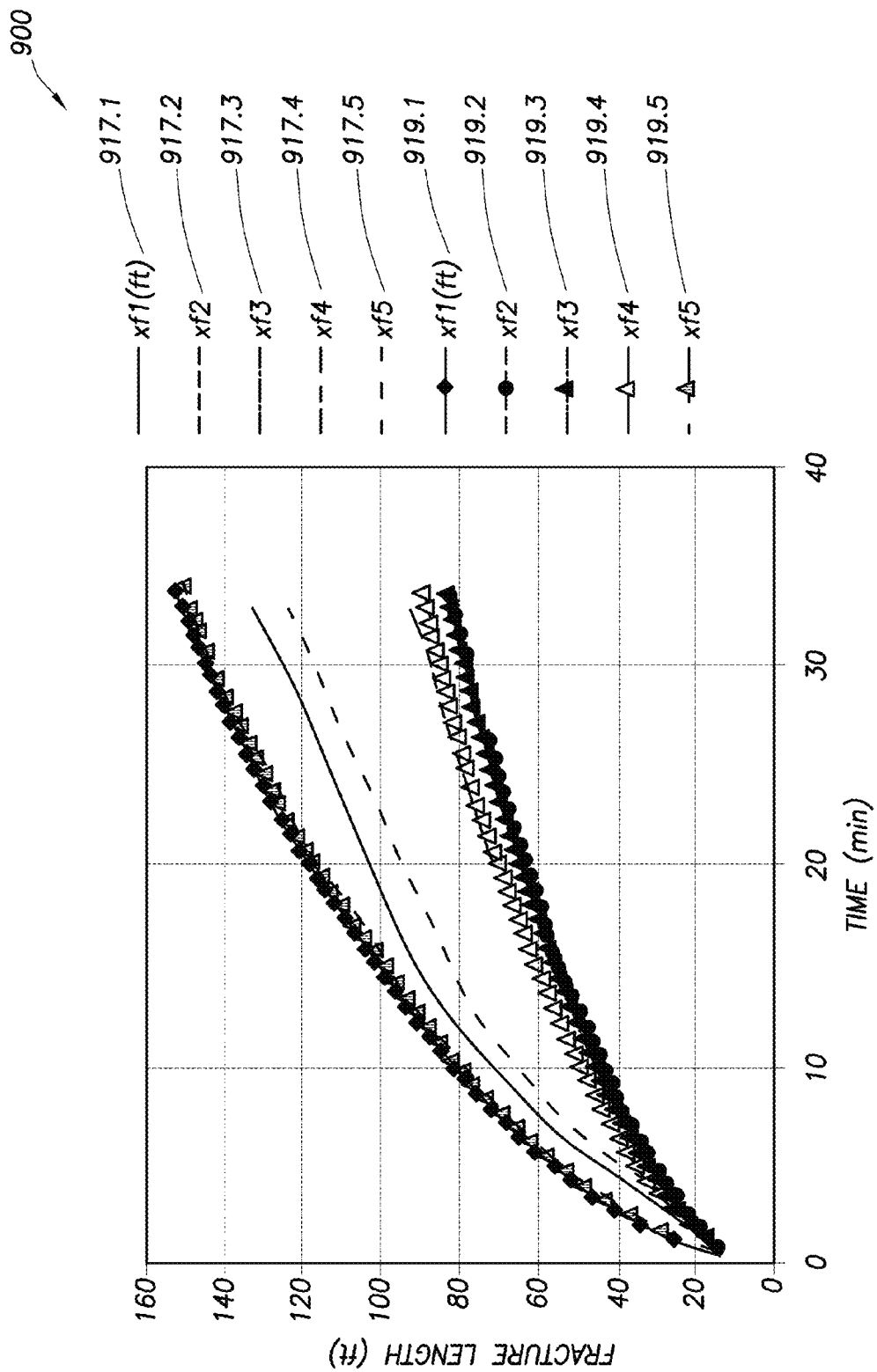
FIG. 9 is a graph depicting lengths for five parallel fractures.

FIG. 9 shows the simulation results of fracture lengths of the five fractures, computed from both models. FIG. 9 is a graph 900 depicting length (y-axis) versus time (t) of five parallel fractures during injection. Lines 917.1-917.5 are generated from the UFM model. Lines 919.1-919.5 are generated from the simplistic PKN model.

Figure 10:
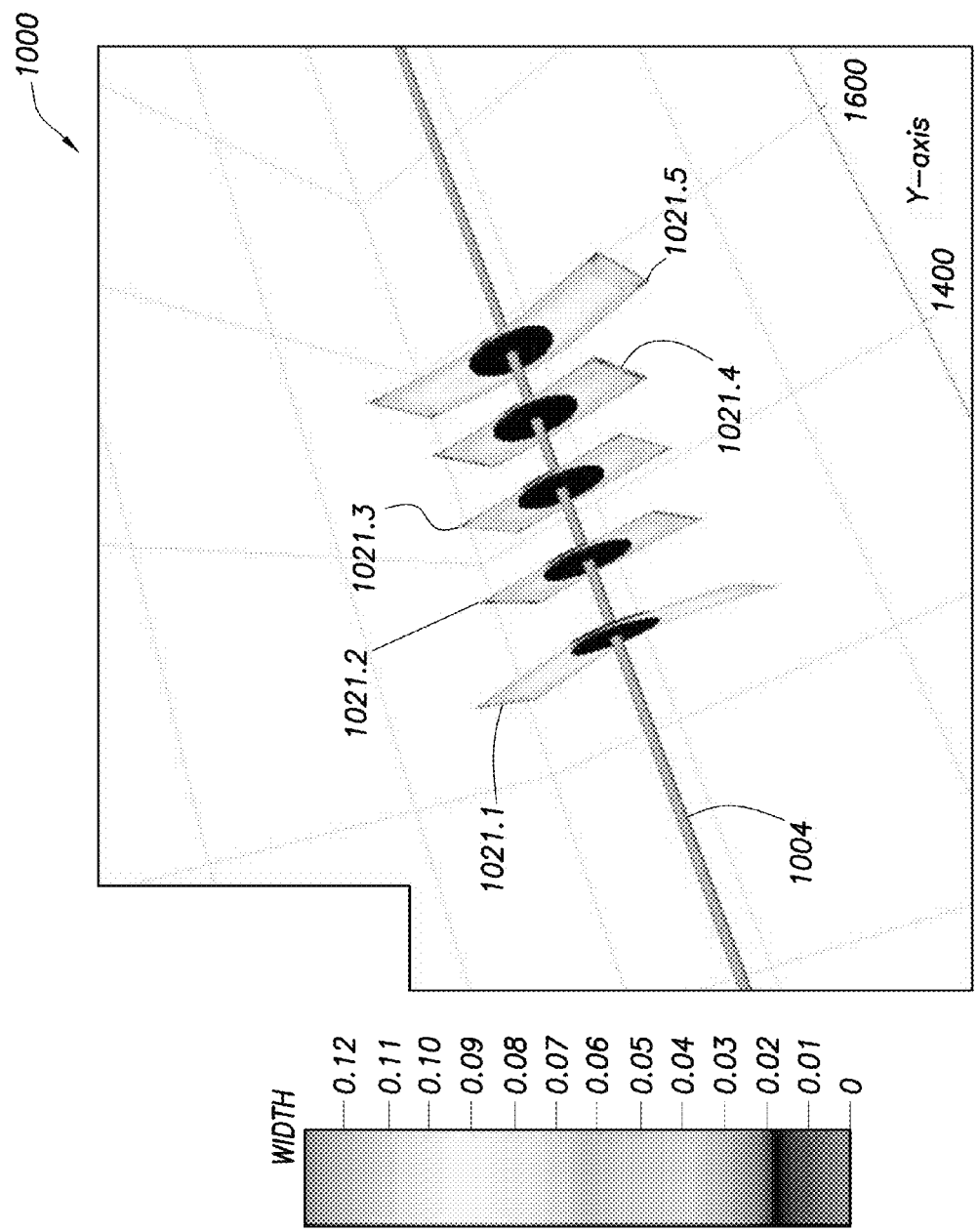
FIG. 10 is a schematic diagram depicting UFM fracture geometry and width for the parallel fractures of FIG. 9.

The fracture geometry and width contour from the UFM model for the five fractures of FIG. 9 are shown in FIG. 10. FIG. 10 is a schematic diagram 1000 depicting fractures 1021.1-1021.5 about a wellbore 1004.

Fracture 1021.3 is the middle one of the five fractures, and fractures 1021.1 and 1021.5 are the outmost ones. Since fractures 1021.2, 1021.3, and 1021.4 have smaller width than that of the outer ones due to the stress shadow effect, they may have larger flow resistance, receive less flow rate, and have shorter length. Therefore, the stress shadow effects may not only be fracture width but also fracture length under dynamic conditions.

The effect of stress shadow on fracture geometry may be influenced by many parameters. To illustrate the effect of some of these parameters, the computed fracture lengths for the cases with varying fracture spacing, perforation friction, and stress anisotropy are shown in Table 3.

Figure 11:
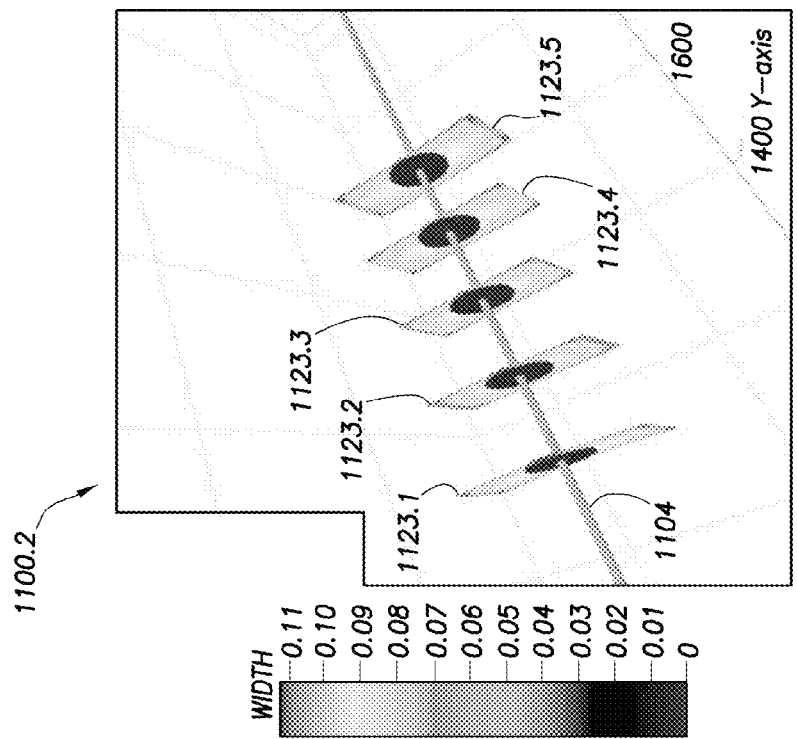
FIGS. 11A-11B are schematic diagrams depicting fracture geometry for a high perforation friction case and a large fracture spacing case, respectively.

FIGS. 11A and 11B shows the fracture geometry predicted by the UFM for the case of large perforation friction and the case of large fracture spacing (e.g., about 120 ft (36.6 m)). FIGS. 11A and 11B are schematic diagrams 1100.1 and 1100.2 depicting five fractures 1123.1-1123.5 about a wellbore 1104. When the perforation friction is large, a large diversion force that uniformly distributes the flow rate into all perforation clusters may be provided. Consequently, the stress shadow may be overcome and the resulting fracture lengths may become approximately equal as shown in FIG. 11A. When fracture spacing is large, the effect of the stress shadow may dissipate, and fractures may have approximately the same dimensions as shown in FIG. 11B.

TABLE 3

Influence of various parameters on fracture geometry

| Frac | Base case | 120 ft spacing (36.6 m) | No. of perfs = 2 | Anisotropy = 50 psi (345000 Pa) |
|---|---|---|---|---|
| 1 | 133 | 113 | 105 | 111 |
| 2 | 93 | 104 | 104 | 95 |
| 3 | 83 | 96 | 104 | 99 |
| 4 | 93 | 104 | 100 | 95 |
| 5 | 123 | 113 | 109 | 102 |

Case #2 Complex Fractures

Figure 12:
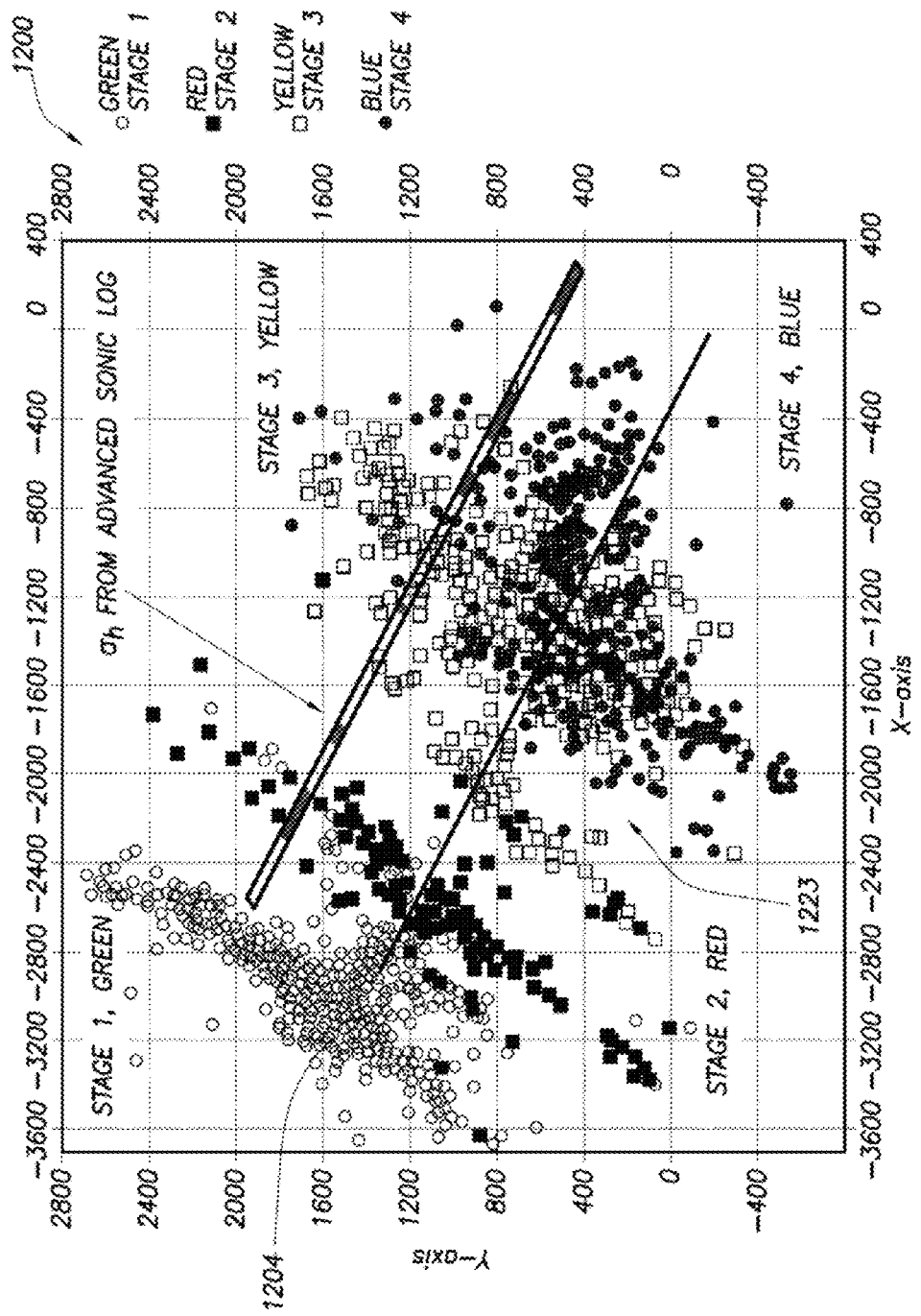
FIG. 12 is a graph depicting microseismic mapping.
Figure 13B:
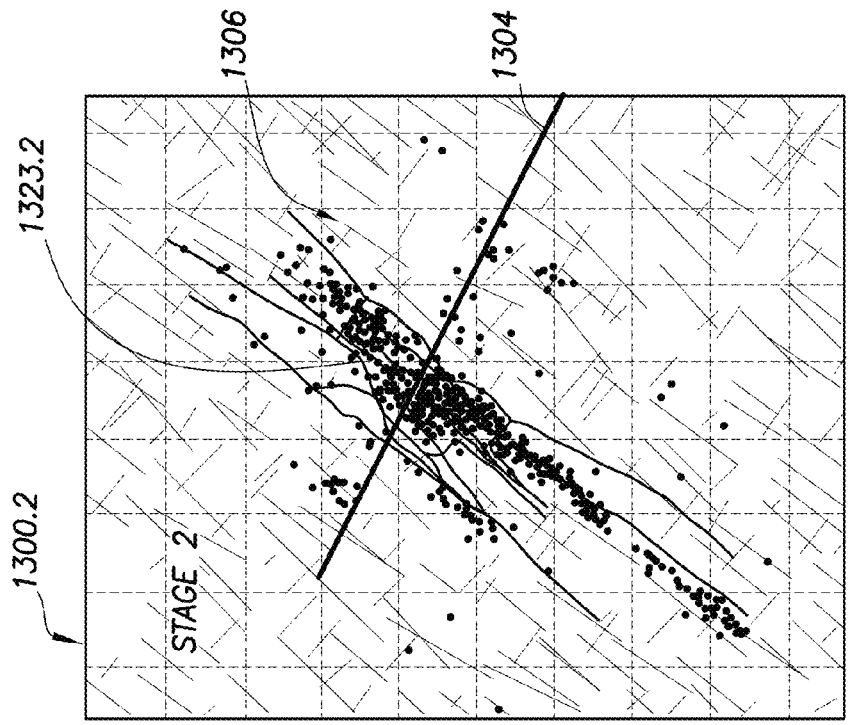
FIGS. 13A-13D are schematic diagrams illustrating a simulated fracture network compared to the microseismic measurements for stages 1-4, respectively.
Figure 13A:
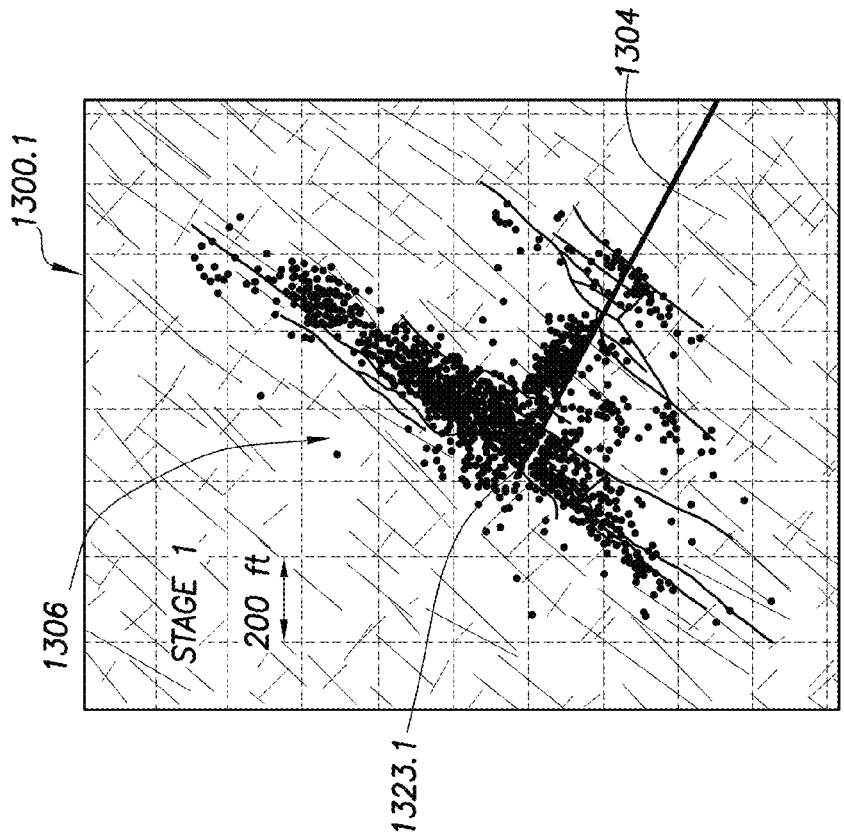
Figure 13C:
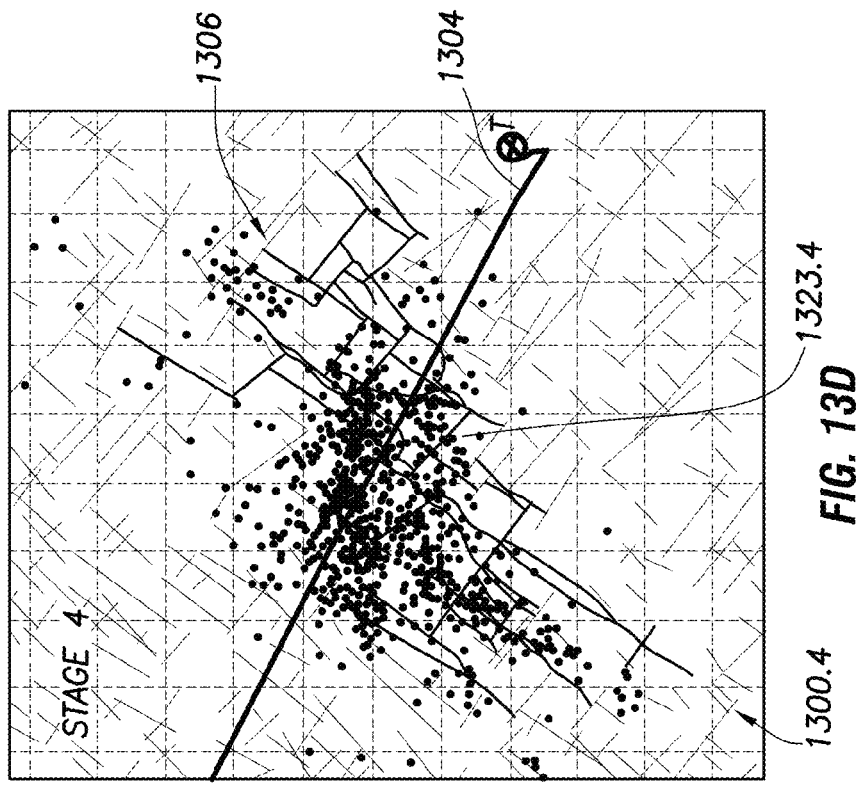
Figure 13D:
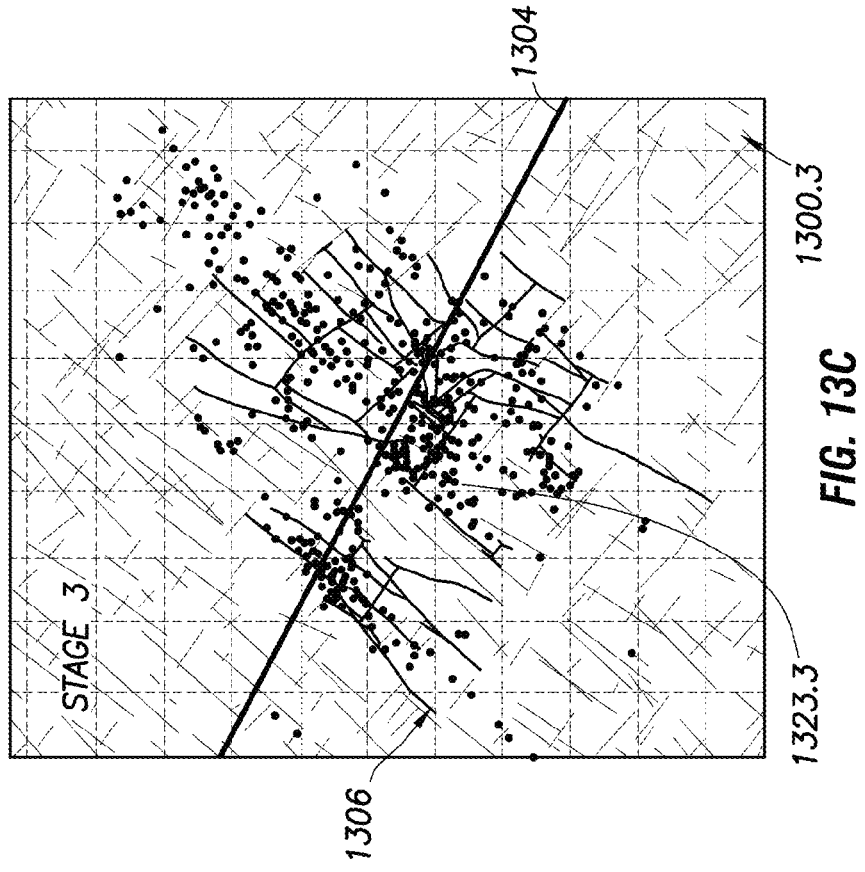

In an example of FIG. 12, the UFM model may be used to simulate a 4-stage hydraulic fracture treatment in a horizontal well in a shale formation. See, e.g., Cipolla, C., Weng, X, Mack, M, Ganguly, U., Kresse, O., Gu, H., Cohen, C. and Wu, R., *Integrating Microseismic Mapping and Complex Fracture Modeling to Characterize Fracture Complexity.* Paper SPE 140185 presented at the SPE Hydraulic Fracturing Conference and Exhibition, Woodlands, Tex., USA, Jan. 24-26, 2011, (hereinafter "Cipolla 2011") the entire contents of which are hereby incorporated by reference in their entirety. The well may be cased and cemented, and each stage pumped through three or four perforation clusters. Each of the four stages may consist of approximately 25,000 bbls (4000 m$^3$) of fluid and 440,000 lbs (2e+6 kg) of proppant. Extensive data may be available on the well, including advanced sonic logs that provide an estimate of minimum and maximum horizontal stress. Microseismic mapping data may be available for all stages. See, e.g., Daniels, J., Waters, G., LeCalvez, J., Lassek, J., and Bentley, D., *Contacting More of the Barnett Shale Through an Integration of Real-Time Microseismic Monitoring, Petrophysics, and Hydraulic Fracture Design.* Paper SPE 110562 presented at the 2007 SPE Annual Technical Conference and Exhibition, Anaheim, Calif., USA, Oct. 12-14, 2007. This example is shown in FIG. 12. FIG. 12 is a graph depicting microseismic mapping of microseismic events 1223 at various stages about a wellbore 1204.

The stress anisotropy from the advanced sonic log, indicates a higher stress anisotropy in the toe section of the well compared to the heel. An advanced 3D seismic interpretation may indicate that the dominant natural fracture trend changes from NE-SW in the toe section to NW-SE in heel portion of the lateral. See, e.g., Rich, J. P. and Ammerman, M., *Unconventional Geophysics for Unconventional Plays*. Paper SPE 131779 presented at the Unconventional Gas Conference, Pittsburgh, Pa., USA, Feb. 23-25, 2010, the entire contents of which is hereby incorporated by reference herein in its entirety.

Simulation results may be based on the UFM model without incorporating the full stress shadow calculation (see, e.g., Cipolla 2011), including shear stress and fracture turning (see, e.g., Weng 2011). The simulation may be updated with the full stress model as provided herein. FIGS. 13A-13D show a plan view of a simulated fracture network 1306 about a wellbore 1304 for all four stages, respectively, and their comparison to the microseismic measurements 1323.1-1323.4, respectively.

From simulation results in FIGS. 13A-13D, it can be seen that for Stages 1 and 2, the closely spaced fractures did not diverge significantly. This may be because of the high stress anisotropy in the toe section of the wellbore. For Stage 3 and 4, where stress anisotropy is lower, more fracture divergence can be seen as a result of the stress shadow effect.

Case #3 Multi-Stage Example

Case #3 is an example showing how stress shadow from previous stages can influence the propagation pattern of hydraulic fracture networks for next treatment stages, resulting in changing of total picture of generated hydraulic fracture network for the four stage treatment case.

This case includes four hydraulic fracture treatment stages. The well is cased and cemented. Stages 1 and 2 are pumped through three perforated clusters, and Stages 3 and 4 are pumped through four perforated clusters. The rock fabric is isotropic. The input parameters are listed in Table 4 below. The top view of total hydraulic fracture network without and with accounting for stress shadow from previous stages is shown in FIGS. 13A-13D.

TABLE 4

| Input parameters for Case #3 | |
|---|---|
| Young's modulus | $4.5 \times 10^6$ psi = 3.1e+10 Pa |
| Poisson's ratio | 0.35 |
| Rate | 30.9 bpm = 0.082 m3/s |
| Viscosity | 0.5 cp = 0.0005 pa-s |
| Height | 330 ft = 101 m |
| Pumping time | 70 min |

Figure 14B:
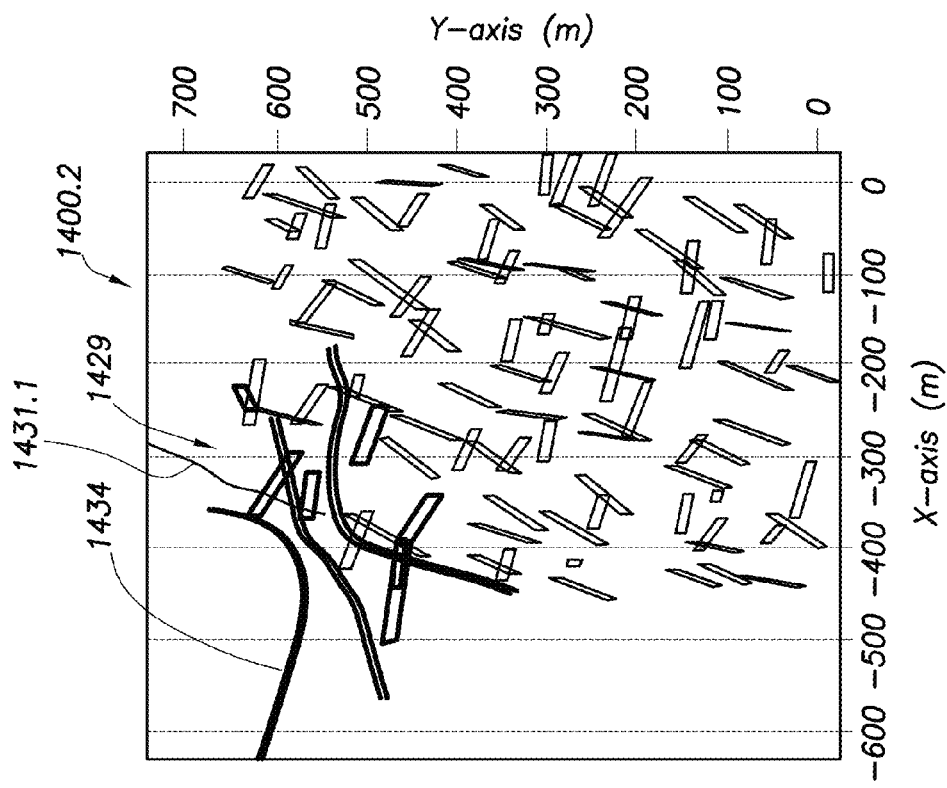
Figure 14A:
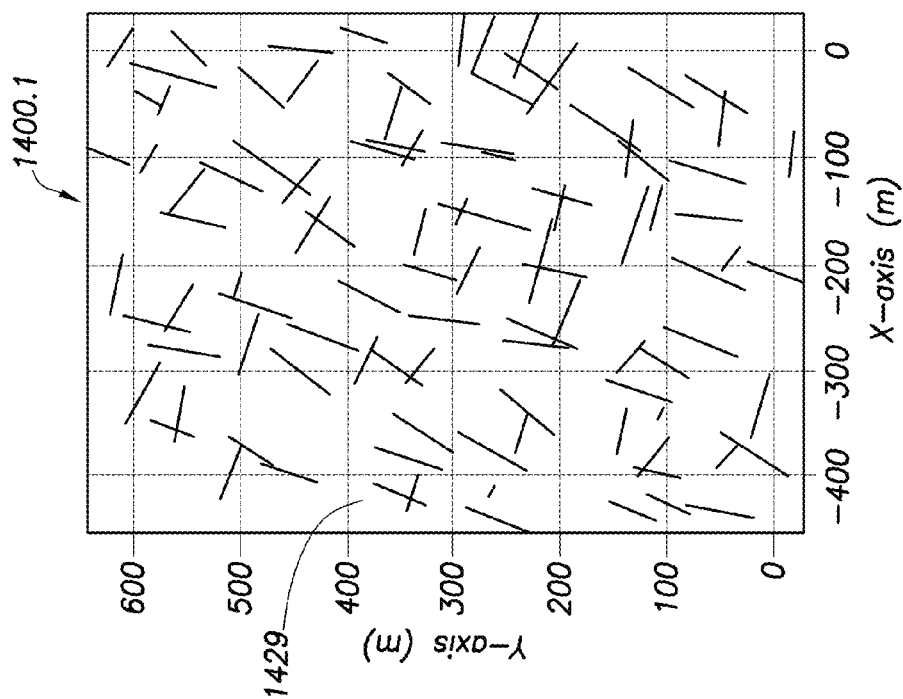

FIGS. 14A-14D are schematic diagrams 1400.1-1400-4 depicting a fracture network 1429 at various stages during a fracture operation. FIG. 14A shows a discrete fracture network (DFN) 1429 before treatment. FIG. 14B depicts a simulated DFN 1429 after a first treatment stage. The DFN 1429 has propagated hydraulic fractures (HFN) 1431 extending therefrom due to the first treatment stage. FIG. 14C shows the DFN depicting a simulated HFN 1431.1-1431.4 propagated during four stages, respectively, but without accounting for previous stage effects. FIG. 14D shows the DFN depicting HFN 1431.1, 1431.2'-1431.4' propagated during four stages, but with accounting for the fractures, stress shadows and HFN from previous stages.

When stages are generated separately, they may not see each other as indicated in FIG. 14C. When stress shadow and HFN from previous stages are taken into account as in FIG. 14D the propagation pattern may change. The hydraulic fractures 1431.1 generated for the first stage is the same for both case scenarios as shown in FIGS. 14C and 14D. The second stage 1431.2 propagation pattern may be influenced by the first stage through stress shadow, as well as through new DFN (including HFN 1431.1 from Stage 1), resulting in the changing of propagation patterns to HFN 1431.2'. The HFN 1431.1' may start to follow HFN 1431.1 created at stage 1 while intercounting it. The third stage 1431.3 may follow a hydraulic fracture created during second stage treatment 1431.2, 1431.2', and may not propagate too far due to stress shadow effect from Stage 2 as indicated by 1431.3 versus 1431.3'. Stage 4 (1431.4) may tend to turn away from stage three when it could, but may follow HFN 1431.3' from previous stages when encounters it and be depicted as HFN 1431.4' in FIG. 14D.

A method for computing the stress shadow in a complex hydraulic fracture network is presented. The method may involve an enhanced 2D or 3D Displacement Discontinuity Method with correction for finite fracture height. The method may be used to approximate the interaction between different fracture branches in a complex fracture network for the fundamentally 3D fracture problem. This stress shadow calculation may be incorporated in the UFM, a complex fracture network model. The results for simple cases of two fractures show the fractures can either attract or expel each other depending on their initial relative positions, and compare favorably with an independent 2D non-planar hydraulic fracture model.

Simulations of multiple parallel fractures from a horizontal well may be used to confirm the behavior of the two outmost fractures that may be more dominant, while the inner fractures have reduced fracture length and width due to the stress shadow effect. This behavior may also depend on other parameters, such as perforation friction and fracture spacing. When fracture spacing is greater than fracture height, the stress shadow effect may diminish and there may be insignificant differences among the multiple fractures. When perforation friction is large, sufficient diversion to distribute the flow equally among the perforation clusters may be provided, and the fracture dimensions may become approximately equal despite the stress shadow effect.

When complex fractures are created, if the formation has a small stress anisotropy, fracture interaction can lead to dramatic divergence of the fractures where they tend to repel each other. On the other hand, for large stress anisotropy, there may be limited fracture divergence where the stress anisotropy offsets the effect of fracture turning due to the stress shadow, and the fracture may be forced to go in the direction of maximum stress. Regardless of the amount of fracture divergence, the stress shadowing may have an effect on fracture width, which may affect the injection rate distribution into multiple perforation clusters, and overall fracture network footprint and proppant placement.

Figure 15:
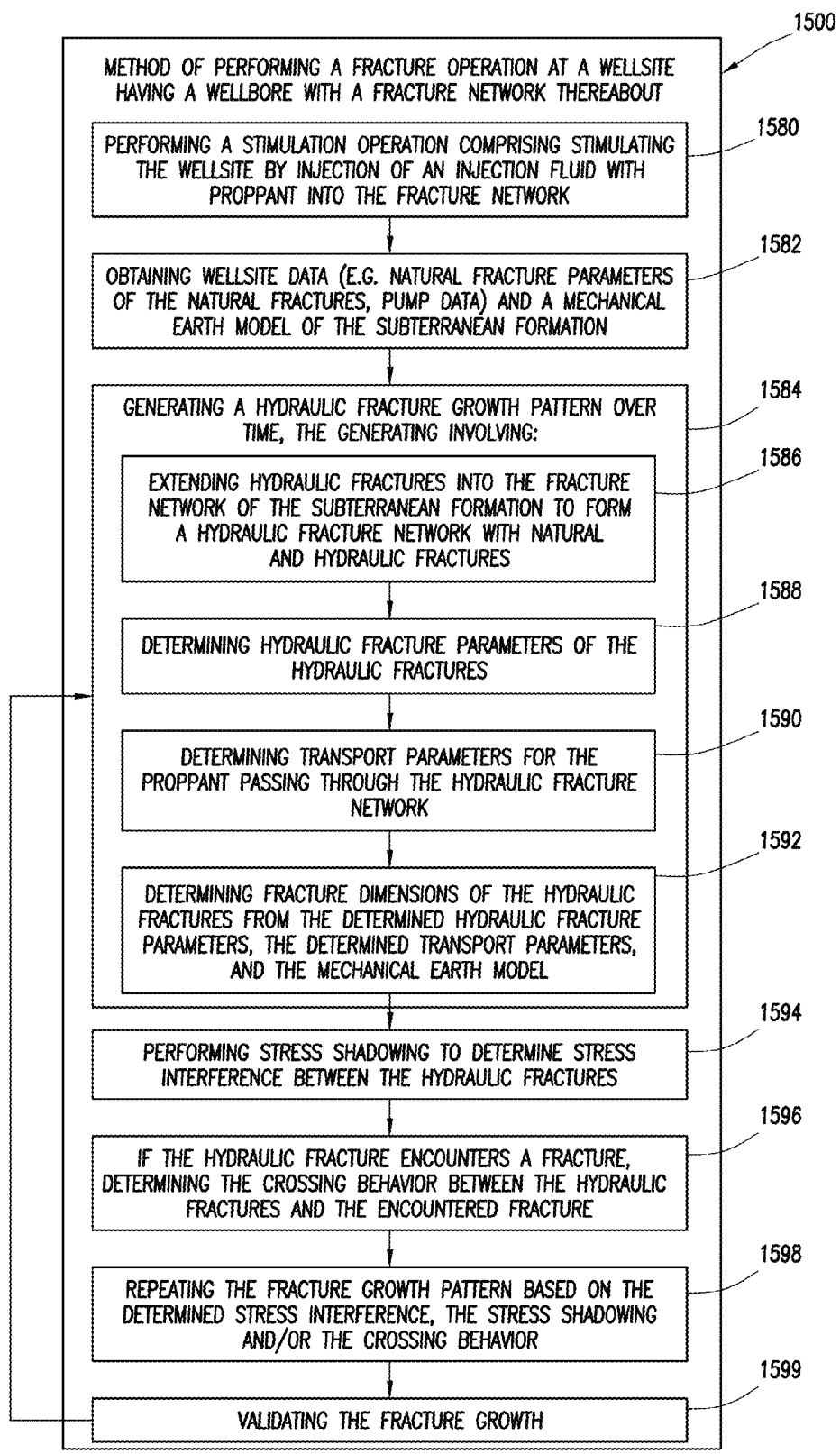
FIG. 15 is a flow chart depicting a method of performing a fracture operation.

FIG. 15 is a flow chart depicting a method 1500 of performing a fracture operation at a wellsite, such as the wellsite 100 of FIG. 1A. The wellsite is positioned about a subterranean formation having a wellbore therethrough and a fracture network therein. The fracture network has natural fractures as shown in FIGS. 1A and 1B. The method (1500) may involve (1580) performing a stimulation operation by stimulating the wellsite by injection of an injection fluid with proppant into the fracture network to form a hydraulic fracture network. In some cases, the stimulation may be performed at the wellsite or by simulation.

The method involves (1582) obtaining wellsite data and a mechanical earth model of the subterranean formation. The wellsite data may include any data about the wellsite that may be useful to the simulation, such as natural fracture parameters of the natural fractures, images of the fracture network, etc. The natural fracture parameters may include, for example, density orientation, distribution, and mechanical properties (e.g., coefficients of friction, cohesion, fracture toughness, etc.) The fracture parameters may be obtained from direct observations of borehole imaging logs, estimated from 3D seismic, ant tracking, sonic wave anisotropy, geological layer curvature, microseismic events or images, etc. Examples of techniques for obtaining fracture parameters are provided in PCT/US2012/059774, the entire contents of which are hereby incorporated by reference herein in their entirety.

Images may be obtained by, for example, observing borehole imaging logs, estimating fracture dimensions from wellbore measurements, obtaining microseismic images, and/or the like. The fracture dimensions may be estimated by evaluating seismic measurements, ant tracking, sonic measurements, geological measurements, and/or the like. Other wellsite data may also be generated from various sources, such as wellsite measurements, historical data, assumptions, etc. Such data may involve, for example, completion, geological structure, petrophysical, geomechanical, log measurement and other forms of data. The mechanical earth model may be obtained using conventional techniques.

The method (1500) also involves (1584) generating a hydraulic fracture growth pattern over time, such as during the stimulation operation. FIGS. 16A-16D depict an example of (1584) generating a hydraulic fracture growth pattern. As shown in FIG. 16A, in its initial state, a fracture network 1606.1 with natural fractures 1623 is positioned about a subterranean formation 1602 with a wellbore 1604 therethrough. As proppant is injected into the subterranean formation 1602 from the wellbore 1604, pressure from the proppant creates hydraulic fractures 1691 about the wellbore 1604. The hydraulic fractures 1691 extend into the subterranean formation along $L_1$ and $L_2$ (FIG. 16B), and encounter other fractures in the fracture network 1606.1 over time as indicated in FIGS. 16B-16C. The points of contact with the other fractures are intersections 1625.

The generating (1584) may involve (1586) extending hydraulic fractures from the wellbore and into the fracture network of the subterranean formation to form a hydraulic fracture network including the natural fractures and the hydraulic fractures as shown in FIG. 16B. The fracture growth pattern is based on the natural fracture parameters and a minimum stress and a maximum stress on the subterranean formation. The generating may also involve (1588) determining hydraulic fracture parameters (e.g., pressure p, width w, flow rate q, etc.) of the hydraulic fractures, (1590) determining transport parameters for the proppant passing through the hydraulic fracture network, and (1592) determining fracture dimensions (e.g., height) of the hydraulic fractures from, for example, the determined hydraulic fracture parameters, the determined transport parameters and the mechanical earth model. The hydraulic fracture parameters may be determined after the extending. The determining (1592) may also be performed by from the proppant transport parameters, wellsite parameters and other items.

The generating (1584) may involve modeling rock properties based on a mechanical earth model as described, for example, in Koutsabeloulis and Zhang, 3D Reservoir Geomechanics Modeling in Oil/Gas Field Production, SPE Paper 126095, 2009 SPE Saudi Arabia Section Technical Symposium and Exhibition held in Al Khobar, Saudi Arabia, 9-11 May, 2009 ("Koutsabeloulis 2009"), the entire contents of which are hereby incorporated by reference herein. The generating may also involve modeling the fracture operation by using the wellsite data, fracture parameters and/or images as inputs modeling software, such as UFM, to generate successive images of induced hydraulic fractures in the fracture network.

The method (1500) also involves (1594) performing stress shadowing on the hydraulic fractures to determine stress interference between the hydraulic fractures (or with other fractures), and (1598) repeating the generating (1584) based on the stress shadowing and/or the determined stress interference between the hydraulic fractures. The repeating may be performed to account for fracture interference that may affect fracture growth. Stress shadowing may involve performing, for example, a 2D or 3D DDM for each of the hydraulic fractures and updating the fracture growth pattern over time. The fracture growth pattern may propagate normal to a local principal stress direction according to stress shadowing. The fracture growth pattern may involve influences of the natural and hydraulic fractures over the fracture network (see FIG. 16C).

Stress shadowing may be performed for multiple wellbores of the wellsite. The stress shadowing from the various wellbores may be combined to determine the interaction of fractures as determined from each of the wellbores. The generating may be repeated for each of the stress shadowings performed for one or more of the multiple wellbores. The generating may also be repeated for stress shadowing performed where stimulation is provided from multiple wellbores. Multiple simulations may also be performed on the same wellbore with various combinations of data, and compared as desired. Historical or other data may also be input into the generating to provide multiple sources of information for consideration in the ultimate results.

The method also involves (1596) determining crossing behavior between the hydraulic fractures and an encountered fracture if the hydraulic fracture encounters another fracture, and (1598) repeating the generating (1584) based on the crossing behavior if the hydraulic fracture encounters a fracture (see, e.g., FIG. 16C). Crossing behavior may be determined using, for example, the techniques of PCT/US2012/059774, the entire contents of which is hereby incorporated herein in its entirety.

The determining crossing behavior may involve performing stress shadowing. Depending on downhole conditions, the fracture growth pattern may be unaltered or altered when the hydraulic fracture encounters the fracture. When a fracture pressure is greater than a stress acting on the encountered fracture, the fracture growth pattern may propagate along the encountered fracture. The fracture growth pattern may continue propagation along the encountered fracture until the end of the natural fracture is reached. The fracture growth pattern may change direction at the end of the natural fracture, with the fracture growth pattern extending in a direction normal to a minimum stress at the end of the natural fracture as shown in FIG. 16D. As shown in FIG. 16D, the hydraulic fracture extends on a new path 1627 according to the local stresses $\sigma_1$ and $\sigma_2$.

Optionally, the method (1500) may also involve (1599) validating the fracture growth pattern. The validation may be performed by comparing the resulting growth pattern with other data, such as microseismic images as shown, for example, in FIGS. 7A and 7B.

The method may be performed in any order and repeated as desired. For example, the steps of generating (1584)-(1599) may be repeated over time, for example, by iteration as the fracture network changes. The generating (1584) may be performed to update the iterated simulation performed during the generating to account for the interaction and effects of multiple fractures as the fracture network is stimulated over time.

II. Interpretation of Microseismicity

In an aspect of the present disclosure, at least one embodiment relates to techniques for performing oilfield operations, such as fracture and/or stimulation operations. More particularly, at least one embodiment of the present disclosure relates to a method for microseismic data interpretation using a geomechanics model to compute the stress field surrounding the created fracture network and potential shear failure in the natural fractures. This may lead to a means for calibrating and a more accurate determination of the fracture network geometry.

The disclosure also relates to interpretation of hydraulic fracturing based on microseismicity and stress analysis. A method is provided to consider microseismicity triggered as a result of interaction between hydraulic and natural fractures. Geomechanic models may be used to determine stress fields surrounding a fracture network and potential shear failure in natural fractures of the fracture network. Hydraulic fracture geometry may be determined based on the geomechanic models.

Hydraulic fracture interpretation may be performed using the 2D and 3D DDM methods to describe induced stress on a given fracture by other fractures as described above. Hydraulic fracture interpretation may also be performed using 2D DDM and 3D DDM stress field methods to compute the stress field for a collection of fractures with known interfacial displacements. In the stress field methods, a microseismicity prediction employs the DDM to compute the stress in the rock and/or on closed natural fractures located away from the hydraulic fractures. DDM may be used to generate induced stresses on a fracture by other fractures using 2D, 3D DDM and/or to generate stresses on distant fractures using extended DDM.

Current hydraulic fracture monitoring methods and systems may map where the fractures occur and the extent of the fractures. Some methods and systems of microseismic monitoring may process seismic event locations by mapping seismic arrival times and polarization information into three-dimensional (3D) space through the use of modeled travel times and/or ray paths. These methods and systems can be used to infer hydraulic fracture propagation over time.

Understanding the nature and degree of hydraulic fracture complexity may be useful to the economic development of unconventional resources. Examples of hydraulic fracture techniques are described in the following papers: Mayerhofer et al., *Integrating of Microseismic Fracture Mapping Results with Numerical Fracture Network Production Modeling in the Barnett Shale*, Society of Petroleum Engineers (SPE) 102103, presented at the SPE Annual Technical Conference and Exhibition, San Antonio, Tex., 24-24 Sep. 2006; Mayerhofer et al., *What is Stimulated Reservoir Volume (SRV)?*, SPE 119890 presented at the SPE Shale Gas Production Conference, Fort Worth, Tex., 16-18 Nov. 2008; Warpinski et al., *Stimulating Unconventional Reservoirs: Maximizing Network Growth while Optimizing Fracture Conductivity*, SPE 114173 presented at the SPE Unconventional Reservoirs Conference, Keystone, Colo., 10-12 Feb. 2008; and Cipolla et al., *The Relationship between Fracture Complexity, Reservoir Properties, and Fracture Treatment Design*, SPE 115769 presented at the SPE Annual Technical Conference and Exhibition, Denver, Colo., 21-24 Sep. 2008, the entire contents of which are hereby incorporated by reference herein.

Complex hydraulic fracture propagation may be interpreted from microseismic measurements, for example, from unconventional reservoirs and tight gas reservoirs. Examples of complex hydraulic fracture techniques are provided in the following articles: Maxwell et al., *Microseismic Imaging of Hydraulic Fracture Complexity in the Barnett Shale*, SPE 77440 presented at the SPE Annual Technical Conference and Exhibition, San Antonio, Tex., Sep. 29-Oct. 2, 2002; Fisher et al., *Integrating Fracture Mapping Technologies to Optimize Stimulations in the Barnett Shale*, 77411 presented at the SPE Annual Technical Conference and Exhibition, San Antonio, Tex., Sep. 29-Oct. 2, 2002; Cipolla et al., *Effect of Well Placement on Production and Frac Design in a Mature Tight Gas Field*, 95337 presented at the SPE Annual Technical Conference and Exhibition, Dallas, Tex., 9-12 Oct. 2005; and Warpinski et al., *Stimulating Unconventional Reservoirs: Maximizing Network Growth while Optimizing Fracture Conductivity*, SPE 114173 presented at the SPE Unconventional Reservoirs Conference, Keystone, Colo., 10-12 Feb. 2008, the entire contents of which are hereby incorporated by reference herein.

Additional techniques relating to fracturing are provided in Zhao, X. P. and Young, R. P. 2009, *Numerical Simulation of Seismicity Induced by Hydraulic Fracturing in Naturally Fractured Reservoirs*, Paper SPE 124690 presented at the Annual Technical Conference and Exhibition, New Orleans, La., USA, October 4-7; Meyer, B. R. and Bazan, L. W. (2011) "*A Discrete Fracture Network Model for Hydraulically-Induced Fractures: Theory, Parametric and Case Studies*," Paper SPE 140514 presented at the SPE Hydraulic Fracturing Conference and Exhibition, Woodlands, Tex., January 24-26; Jeffery, R. G., Zhang, X., and Thiercelin, M. 2009, *Hydraulic Fracture Offsetting in Naturally Fractured Reservoirs: Quantifying a Long-Recognized Process*, Paper SPE 119351 presented at 2009 SPE Hydraulic Fracturing Technology Conference, Woodlands, Tex., 19-21 January; and Wu, R., Kresse, O., Weng, X., Cohen, C., and Gu, H. 2012, *Modeling of Interaction of Hydraulic Fractures in Complex Fracture Networks*, Paper SPE 152052 presented at the SPE Hydraulic Fracturing Technology Conference and Exhibition held in The Woodlands, Tex., USA, 6-8 February ("Wu 2012"), the entire contents of which are hereby incorporated by reference herein.

FIGS. 17-19B depict stresses applied to hydraulic fractures and natural fractures of a rock medium, such as the formation around a wellbore as shown, for example, in FIGS. 1A and 1B. As demonstrated by these figures, microseismic events may be triggered by interaction between fracture geometry and stress properties relating to the fractures. Microseismic events recorded during hydraulic fracturing operations may be utilized to interpret induced fracture geometry. Each microseismic event may be a result of a sudden release of local elastic energy stored in the rock associated with crack propagation, for example, under shear deformation.

Examples of microseismic event techniques are provided in Warpinski, N. R., Branagan, P. T., Peterson, R. E., Wolhart, S. L., and Uhl, J. E. 1998, *Mapping Hydraulic Fracture Growth and Geometry Using Microseismic Events*

*Detected by a Wireline Retrievable Accelerometer Array*, Paper SPE 40014 presented at the 1998 Gas Technology Symposium, Calgary, Alberta, Canada, March 15-18; Cipolla, C. L., Peterman, F., Creegan, T., McCarley, D. and Nevels, H. 2005, *Effect of Well Placement on Production and Frac Design in a Mature Tight Gas Field*, Paper SPE 95337 presented at the 2005 SPE Annual Technical Conference and Exhibition, Dallas, Tex., October 9-12; Maxwell, S. C., Urbancic, T. I., Steinsberger, N. P., and Zinno, R. 2002, *Microseismic Imaging of Hydraulic Fracture Complexity in the Barnett Shale*, Paper SPE 77440 presented at the SPE Annual Technical Conference and Exhibition, San Antonio, Tex., September 29-October 2; and Fisher, M. K., Davidson, B. M., Goodwin, A. K., Fielder, E. O., Buckler, W. S., and Steinberger, N. P. 2002, *Integrating Fracture Mapping Technologies to Optimize Stimulations in the Barnett Shale*, Paper SPE 77411 presented at the 2002 SPE Annual Technical Conference and Exhibition, San Antonio, Tex., USA, September 29-October 2, the entire contents of which are hereby incorporated by reference herein.

Figure 17:
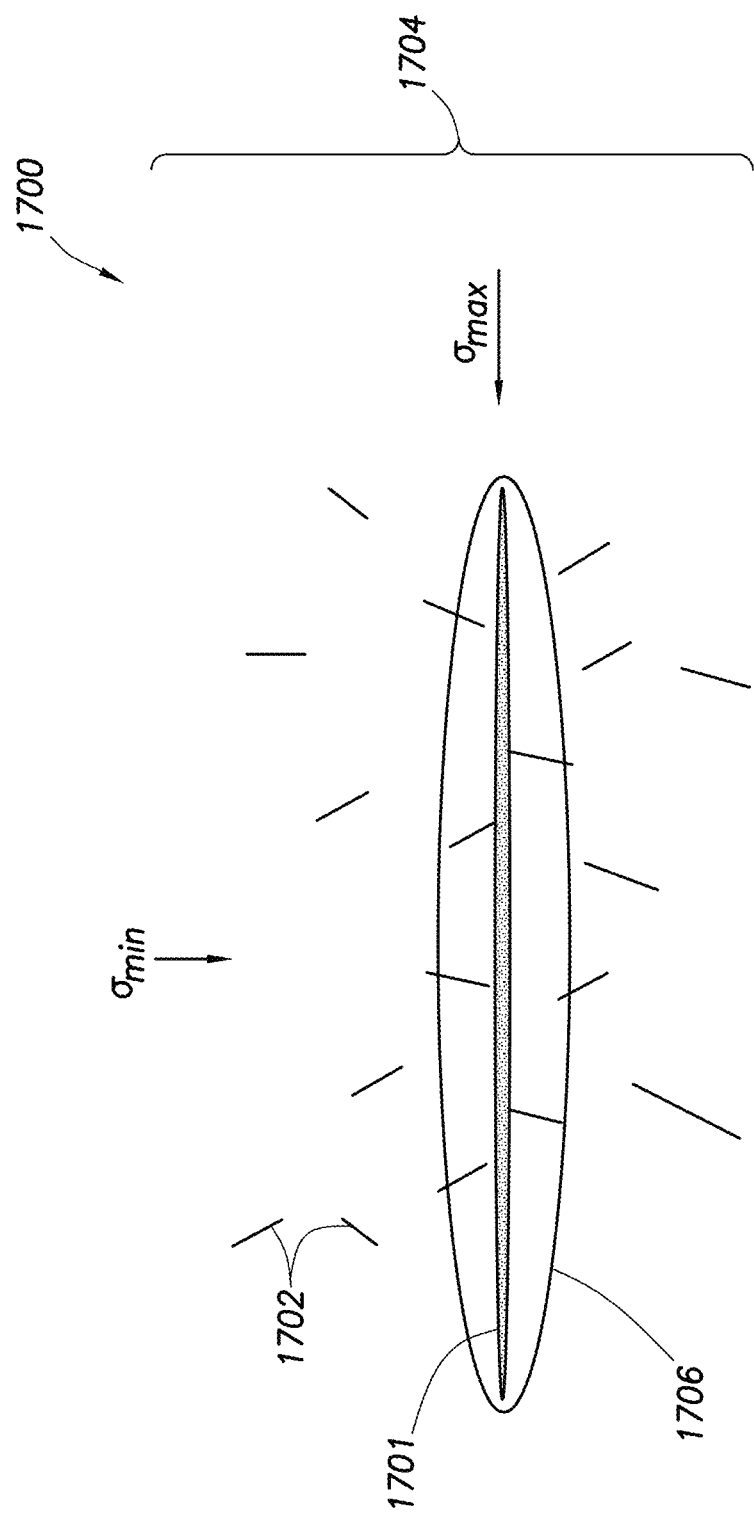
FIG. 17 is a schematic diagram depicting stresses applied to a hydraulic fracture.

FIG. 17 is a schematic diagram 1700 depicting a simple planar hydraulic fracture 1701 propagating in a rock medium 1704 containing pre-existing natural fractures 1702. The depicted hydraulic fracture 1701 may be a fracture generated, for example, in the formation 102 of FIG. 1A. The area 1706 surrounding the hydraulic fracture 1701 indicates fluid infiltration into rock matrix of the rock medium 1704.

The homogeneous rock matrix of the rock medium 1704 may be initially subjected to in-situ stresses (e.g., minimum horizontal stress $\sigma_{min}$, maximum horizontal stress $\sigma_{max}$) in the earth. The faces of the natural fractures 1702 may be in contact with each other since the rock medium 1704 is subjected to compressive in-situ stresses $\sigma_{min}$, $\sigma_{max}$ as indicated by the arrows. If the natural fractures 1702 are not aligned with directions of the principal stresses $\sigma_{min}$, $\sigma_{max}$ the faces of the natural fractures 1702 may be subjected to shear forces, in addition to compressional normal forces. If the shear stress at the interface exceeds a limiting value, which may be defined as the sum of the cohesion and the normal stress multiplied by a Coulomb friction coefficient (COF), a rock interface may slip, triggering propagation of the fracture and a microseismic event that may be detected from a geophone (not shown) at some distance.

Figure 18:
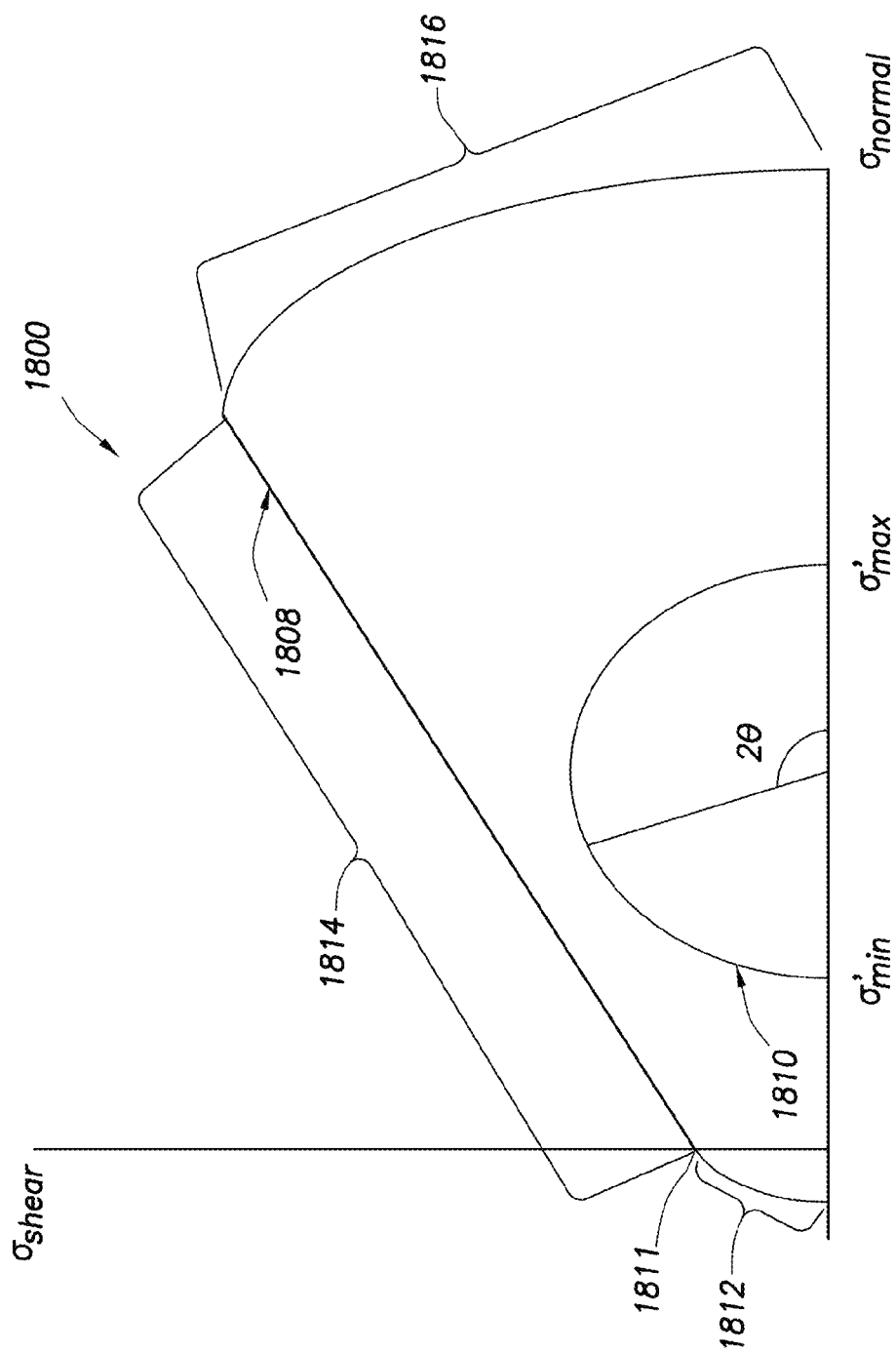
FIG. 18 is a graph depicting a Mohr-Coulomb envelope and a Mohr circle for a rock medium.

Shear failure may be interpreted based on failure parameters, such as a failure envelope (e.g., a Mohr-Coulomb failure envelope) and a stress state (e.g., a Mohr circle). FIG. 18 is a graph 1800 depicting a Mohr-Coulomb failure envelope 1808 and a Mohr circle 1810. The Mohr-Coulomb failure envelope 1808 may be applicable for a natural fracture interface for the rock medium 1704 of FIG. 17. This failure envelope 1808 may be used as a model describing a response of the rock medium to shear stresses. The Mohr-Coulomb failure envelope 1808 is a plot of shear strength of the rock medium (y-axis) versus the applied normal stress (x-axis). The y-axis denotes $\sigma_{shear}$.

The horizontal axis (x-axis) of the graph 1800 depicts effective stress, defined as the total stress $\sigma_{total}$ in the rock minus the pore pressure $P_p$. The failure envelope 1808 extends from a point alone the negative x-axis to $\sigma_{normal}$ on the positive x-axis a distance thereabove. A tensile line 1812 of the failure envelope 1808 extending from the x-axis to the y-axis provides tensile failure of the rock medium. A shear line 1814 extending from the y-axis along a top side of the failure envelope 1808 may indicate shear failure. A compaction line 1816 extending from the shear failure to the x-axis may indicate compaction.

The Mohr circle 1810 of a natural fracture may be used to indicate an initial stress state in the rock medium 1704. The Mohr circle 1810 extends between $\sigma'_{min}$ and $\sigma'_{max}$ a distance above the x-axis. The Mohr circle 1810 represents normal and shear stresses on a rock face at any orientation θ. The Mohr circle 1810 may be used to determine graphically a stress component acting on a rotated coordinate system. In other words, the Mohr circle 1810 may be used to determine the stress components acting on a differently oriented plane passing through a certain material point. As the pore pressure increases, the Mohr circle 1810 may shift to the left, and may cause the natural fracture 1701 to slip even when the total stress remains constant.

The failure envelope 1808 may be different from the failure envelope for the rock matrix of the rock medium 1704 which may have a different cohesion 1811 (cohesion is the intersection of shear failure slope with the y-axis) and different slope. If the initial stress state in the rock medium 1704 is such that the corresponding Mohr circle 1810 touches the shear failure envelope 1808, a natural fracture oriented at the angle θ that corresponds to the point touching the failure envelop may fail under shear. While a Mohr-Coulomb failure envelope and a Mohr circle are depicted, other failure envelopes or stress states may be used for failure analysis.

Referring to FIGS. 17 and 18, during a hydraulic fracturing treatment (e.g., as shown in FIG. 1A), fluid can invade into the rock matrix surrounding the hydraulic fracture 1701. As a result, the pore pressure in the rock matrix may increase, and cause the Mohr circle 1810 to shift to the left as explained above. This shifting may be a primary mechanism of microseismicity during hydraulic fracturing in a permeable rock. Another mechanism which may be a dominant mechanism for ultra-low permeability rocks may be stress disturbance surrounding the hydraulic fracture 1701 as schematically depicted in FIG. 19A or FIG. 19B.

FIGS. 19A and 19B schematically illustrate stress disturbance 1900 of stresses $\sigma_{min}$, $\alpha_{vertical}$ applied to the hydraulic fracture 1701. These stress disturbances may trigger an existing natural fracture 1702 to slide if its properties and the initial stress state are such that the natural fracture 1702 is close to a shear failure condition. A small disturbance of the stress, as that induced in the rock surrounding the hydraulic fracture 1701, can push the Mohr circle 1810 to reach the shear failure and creates a microseismic event.

As shown by the cross-sectional view of FIG. 19A, a stress disturbed region 1918 proportional to fracture height of the fracture 1701 may be generated. Shear deformation 1920 may be generated about the stress distributed region as indicated by the double arrows. As shown by the map view of FIG. 19A, tensile deformation T may be applied to the hydraulic fracture as indicated by the opposing arrows.

Similar to the natural fractures 1702, if the stress state is such that the shear envelope 1808 of the rock matrix is reached, a shear crack may be created in the rock matrix, which may also trigger a microseismic event. It may be easier to reach the failure condition for at least some of the existing natural fractures 1702 than the rock matrix.

Hydraulic fracturing may be used for hydrocarbon recovery, for example, in ultra-tight unconventional reservoirs, such as shale gas. As in conventional reservoirs, microseismic monitoring may be used to help determine created fracture geometry. Microseismic monitoring may show widespread events cloud, which may indicate complex fracture patterns, or networks, are created during the hydraulic fracturing. When a complex fracture pattern is created, the ability to use a microseismic cloud to delineate the detailed fracture network's structure may be difficult, for example, due to the fact that the microseismic events may not be located on the hydraulic fracture planes and/or may be at natural fractures surrounding the hydraulic fractures, and/or due to uncertainty associated with microseismic event locations.

Examples of microseismic location uncertainty are provided in Maxwell, S. C. 2009, *Microseismic Location Uncertainty*, CSEG RECORDER, April 2009, pp. 41-46; and Maxwell, S. C., Underhill, B., Bennett, L., Woerpel, C. and Martinez, A. 2010, *Key Criteria for a Successful Microseismic Project*, Paper SPE 134695 presented at the SPE Annual Technical Conference and Exhibition, Florence, Italy, 19-22 Sep. 2010, the entire contents of which are hereby incorporated by reference herein.

Figure 20:
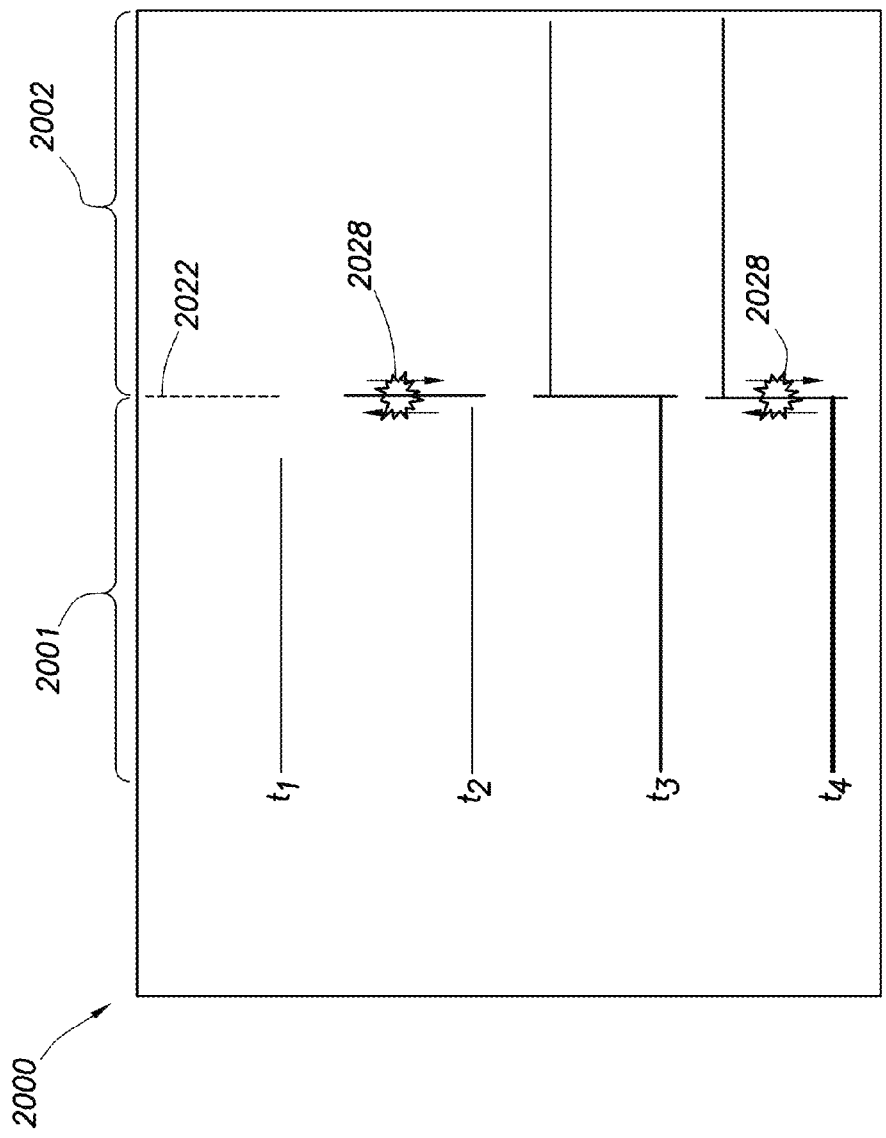
FIG. 20 is a schematic timeline illustrating interaction of hydraulic and natural fractures with seismic events.

FIG. 20 is a schematic diagram 2000 illustrating how microseismicity may be triggered as a result of interaction between hydraulic fracture 2001 and a natural fracture 2002. A timeline 2022 is provided depicting microseismic events 2028 occurring along the hydraulic fracture 2001 and the natural fracture 2002. Examples of microseismicity are provided in Maxwell, S. C. and Cipolla, C. 2011, *What Does Microseismicity Tell Us About Hydraulic Fracturing*. Paper SPE 146932 presented at the 2011 SPE Annual Technical Conference and Exhibition, Denver, Colo., October 30-November 2, the entire contents of which are hereby incorporated by reference herein.

At time t1, the hydraulic fracture 2001 is far enough away from the natural fracture 2002 such that stress disturbances surrounding the hydraulic fracture 2001 is insufficient to trigger slippage of interfaces of the natural fracture 2002. In this case, no microseismicity may be emitted from the natural fracture. At time t2, the hydraulic fracture 2001 is sufficiently close to the natural fracture 2002 such that the stress disturbance causes shear slippage to occur at the natural fracture 2002, leading to a microseismic event 2028.

At time t3 the hydraulic fracture 2001 intersects the natural fracture 2002 and can propagate along the natural fracture 2002 or branch off from the natural fracture 2002. In some cases, the natural fracture 2002 that is already in communication with the hydraulic fracture 2001 may still have its interfaces "stick" again as a result of rock deformation or pressure fluctuation. At a later time t4, the interface may slip again and emit a new microseismic event 2028.

Hydraulic fracture planes/surfaces may be directly extracted from microseismic data. Examples of methods for extracting microseismic data are provided in Fisher et al., *Integrating Fracture Mapping Technologies to Optimize Stimulations in the Barnett Shale*, Paper SPE 77411 presented at the 2002 SPE Annual Technical Conference and Exhibition, San Antonio, Tex., USA, Sep. 29-Oct. 2, 2002; Craig, D. P. and Burkhart, R., *Using Maps of Microseismic Events to Define Reservoir Discontinuities*, Paper SPE 135290 presented at SPE Annual Technical Conference and Exhibition, Florence, Italy, 19-22 September, 2010; Williams et al., *Quantitative Interpretation of Major Planes From Microseismic Event Locations With Application in Production Prediction*, submitted to SEG Annual Meeting (2010), and US Patent Application No. 2011/0029291, the entire contents of which are hereby incorporated by reference herein.

In at least some cases, the fracture surfaces extracted directly from the microseismic events cloud using certain methods may have large uncertainties, for example, since the events may not necessarily be at the actual hydraulic fracture surfaces as discussed above. These methods may not utilize other information, such as formation properties and pumped fluid volume. The interpretation of microseismic acoustic signals may yield information, such as the moment tensor of the microseismic source, the stress drop, and the effective area corresponding to the slip. Such information may not fully be utilized to correlate to the hydraulic fracture geometry.

To incorporate formation characterization and pumping information, hydraulic fracture models for simulating complex fracture propagation in natural fractured formations have been developed. Examples of hydraulic fracture models are provided in Weng et al., *Modeling of Hydraulic Fracture Network Propagation in a Naturally Fractured Formation*, Paper SPE 140253 presented at the SPE Hydraulic Fracturing Technology Conference and Exhibition held in The Woodlands, Tex., USA, 24-26 Jan. 2011 ("Weng 2011"); Cipolla et al., *Integrating Microseismic Mapping and Complex Fracture Modeling to Characterize Hydraulic Fracture Complexity*, Paper SPE 140185 presented at the SPE Hydraulic Fracturing Conference and Exhibition, Woodlands, Tex., USA, Jan. 24-26, 2011; and Gu et al., "*Hydraulic Fracture Crossing Natural Fracture at Non-Orthogonal Angles, A Criterion, Its Validation and Applications*," Paper SPE 139984 presented at the SPE Hydraulic Fracturing Conference and Exhibition, Woodlands, Tex., Jan. 24-26, 2011, the entire contents of which are hereby incorporated by reference herein.

The models may consider the interaction of the hydraulic fracture with natural fractures and/or fissures, and predict detailed structure of the generated fracture networks. The models may use a simulator, such as UFM, that may require, a priori, a pre-defined population of natural fractures in the formation. These natural fractures may be generated based on information obtained from 3D seismic data, borehole imaging logs, and/or core characterization. The generated natural fractures may have large uncertainties that can lead to inaccurate prediction from the complex fracture simulator. Microseismic data may provide a means to validate and/or calibrate the simulation results.

Since the microseismic data may not provide precise fracture plane as discussed above, the fracture model's predicted "footprint" of the overall fracture network may be compared against an overall microseismic cloud. The model parameters may be adjusted until the model results approximately agree with the observed microseismic cloud. This calibration approach may have some inherent uncertainty, for example, where an exact footprint of the fracture network may not be the same as an area delineated by the microseismic cloud. This may occur, for example, where the shear failure events can be triggered at some distance from the actual fractures.

Figure 21:
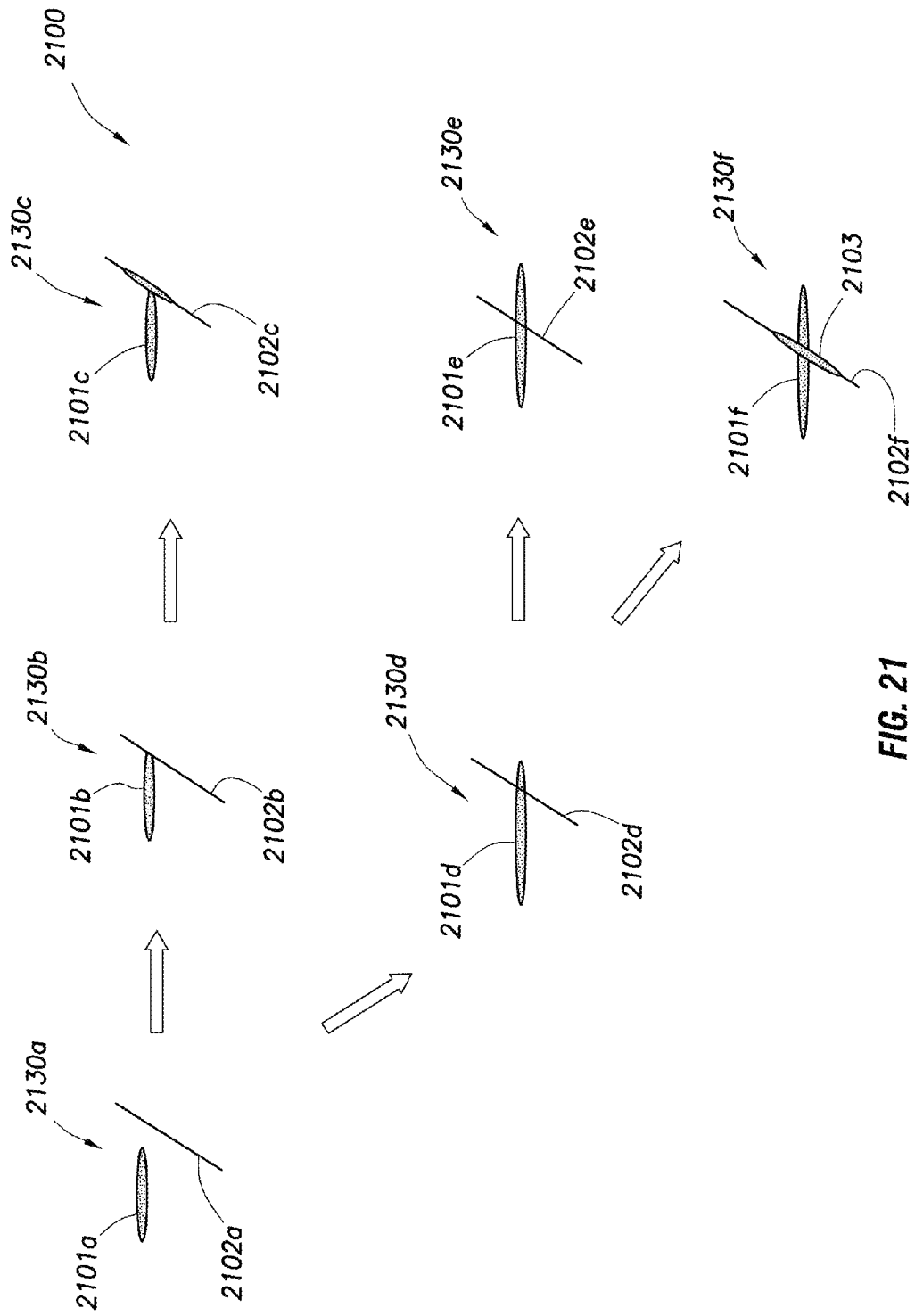
FIG. 21 is schematic diagram illustrating a progression of hydraulic and natural fracture interaction.

FIG. 21 is a schematic diagram 2100 depicting an example of progressive propagation of hydraulic fractures 2101a-f and natural fractures 2102a-f. Detailed complex hydraulic fracture models may be used to predict progressive propagation of multiple fracture branches in a complex fracture network. The formation initially may consist of many natural fractures 2102a-f.

As shown in FIG. 21, various interactions 2130a-f may occur between hydraulic fractures 2101a-f and natural fractures 2102a-f. Interaction 2130a shows no intersection between the hydraulic fracture 2101a and the natural fracture 2102a. Interaction 2130b shows arrest and/or slippage between the hydraulic fracture 2101a and the natural fracture 2102a. Interaction 2130c shows the hydraulic fracture 2101c propagating along the natural fracture 2102c and the natural fracture 2102c dilating. Interaction 2130d shows the hydraulic fracture 2101d crossing the natural fracture 2102c. Interaction 2130e shows an intersection between the hydraulic fracture 2101e and the natural fracture 2102e, with the natural fracture 2102e remaining closed. Interaction 2130f shows an intersection between the hydraulic fracture 2101f and the natural fracture 2102f, with the natural fracture 2102e having a fissure opening 2103 developing after crossing between the hydraulic fracture 2101f and the natural fracture 2102f.

In some cases, such as interactions 2130-2130f, the hydraulic fractures 2101a-f and natural fractures 2102a-f may intersect. Interaction of the hydraulic fractures 2101a-f and the natural fracture 2102a-f may result in fracture branching where the hydraulic fractures 2101a-f and the natural fracture 2102a-f intersect. The intersections 2130a-f may result in hydraulic fractures 2101a-f opening up and propagating along the natural fractures 2102a-f and lead to fracture branching and complexity.

Exact characterization of natural fractures underground may be difficult, if not impossible, in some cases. Initial population of natural fractures of a discrete fracture network (DFN) may be stochastically created. The stochastic population of the DFN may be constrained by information obtained from seismic data and borehole imaging measurements, and/or utilizing geological and geostatistical models.

Figure 22B:
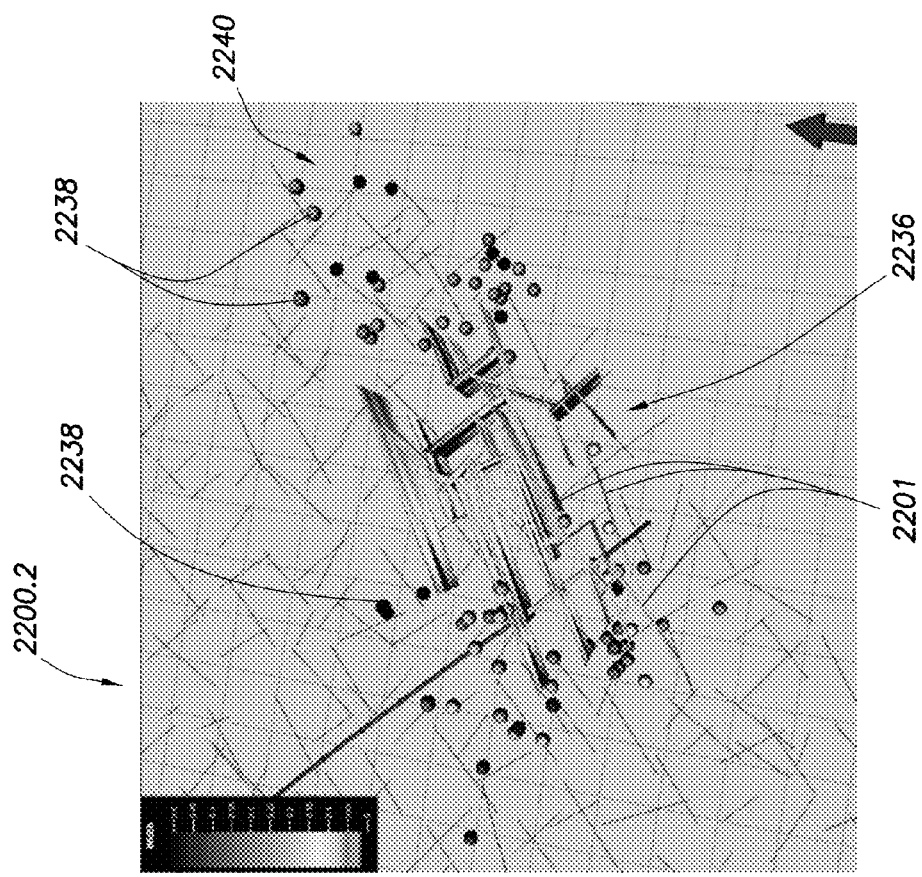
FIGS. 22A and 22B are schematic diagrams depicting a discrete fracture network and a fracture network with simulated hydraulic fractures, respectively.
Figure 22A:
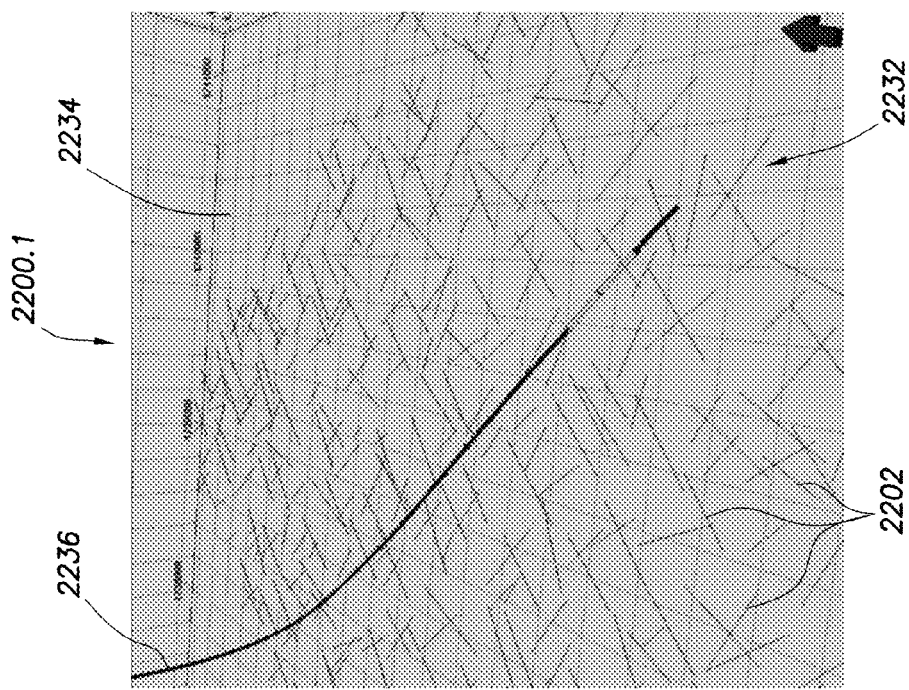

FIG. 22A shows a schematic diagram 2200.1 depicting a DFN 2232 about a wellbore 2236. Traces of statistically generated DFN are depicted near the wellbore 2236, with statistically created DFN traces uniformly distributed in a formation 2234. The traces depict natural fractures 2202 positioned about the formation 2234.

FIG. 22B is a schematic diagram 2200.2 showing a predicted hydraulic fracture network (HFN) 2236 simulated from the uniformly distributed DFN 2232. Hydraulic fractures 2201 are generated from a complex fracture model for the corresponding DFN 2232. FIG. 22B also shows microseismic events 2238 (shown as balls in the graph 2200.2) collected during the fracture treatment.

In the case depicted in FIG. 22B, the predicted HFN 2236 footprint does not match with a microseismic cloud 2240 of the microseismic events 2238. Attempts to provide a match may be made by changing rock properties and/or initial natural fracture distribution to try to match the microseismic events 2238. It is not certain that the microseismic events 2238 represent actual hydraulic fracture planes, as they may be shear induced slippage of natural fractures 2202 away from the hydraulic fractures 2203 as already discussed above.

Forcing the complex fracture model to match the microseismic cloud 2240 may introduce error. Another approach may be to predict an induced stress field surrounding the created HFN 2236, and to determine the shear failure condition in the natural fractures and the rock matrix so the failure "footprint" approximately matches the microseismic. Additionally, from the computed stress field, the natural fractures that undergo slippage and their orientation can be determined, which can be compared to the slip orientation determined from the microseismic moment tensor to obtain more reliable interpretation.

Figure 23A:
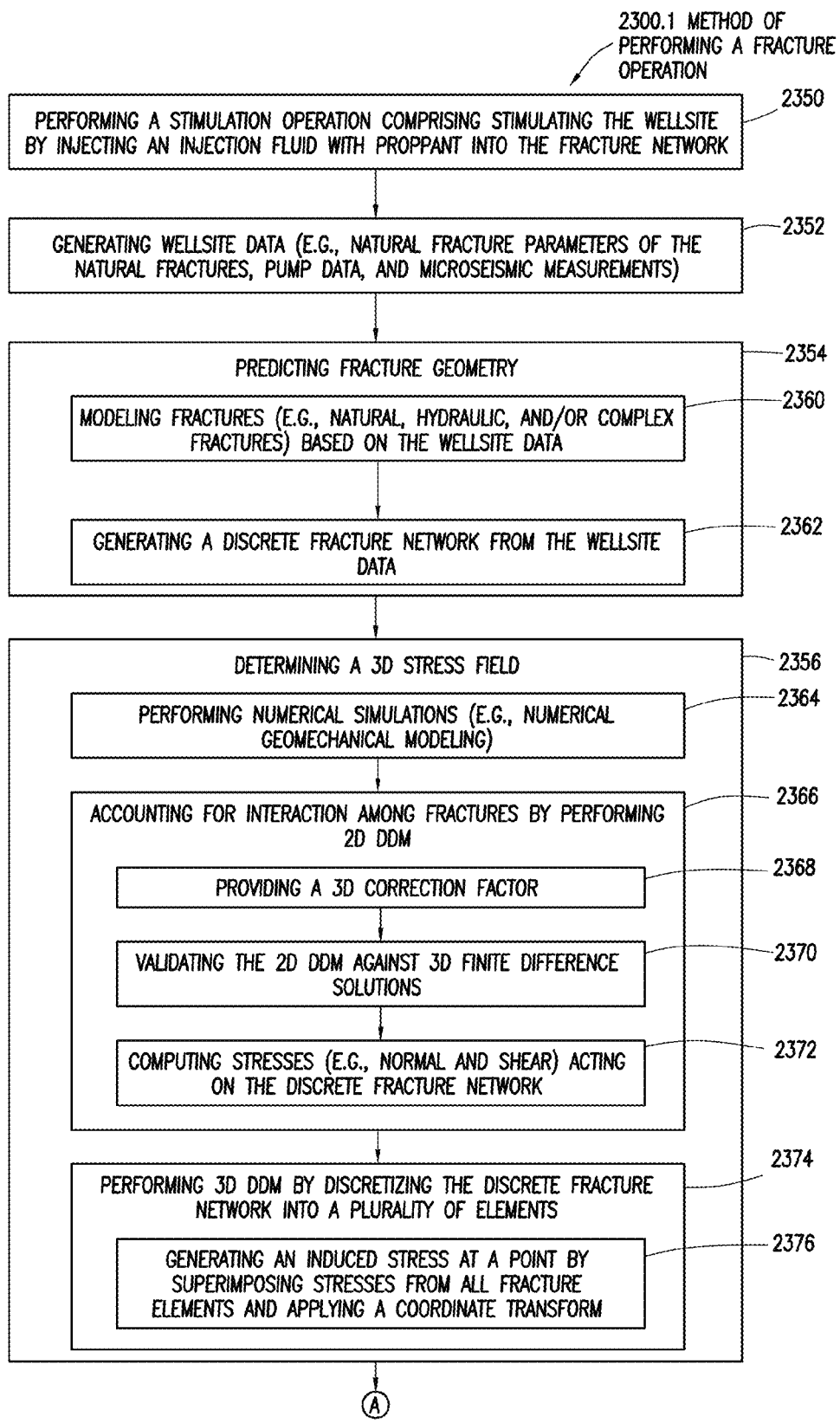
FIGS. 23A-23C are flow charts depicting methods of performing a fracture operation.
Figure 23B:
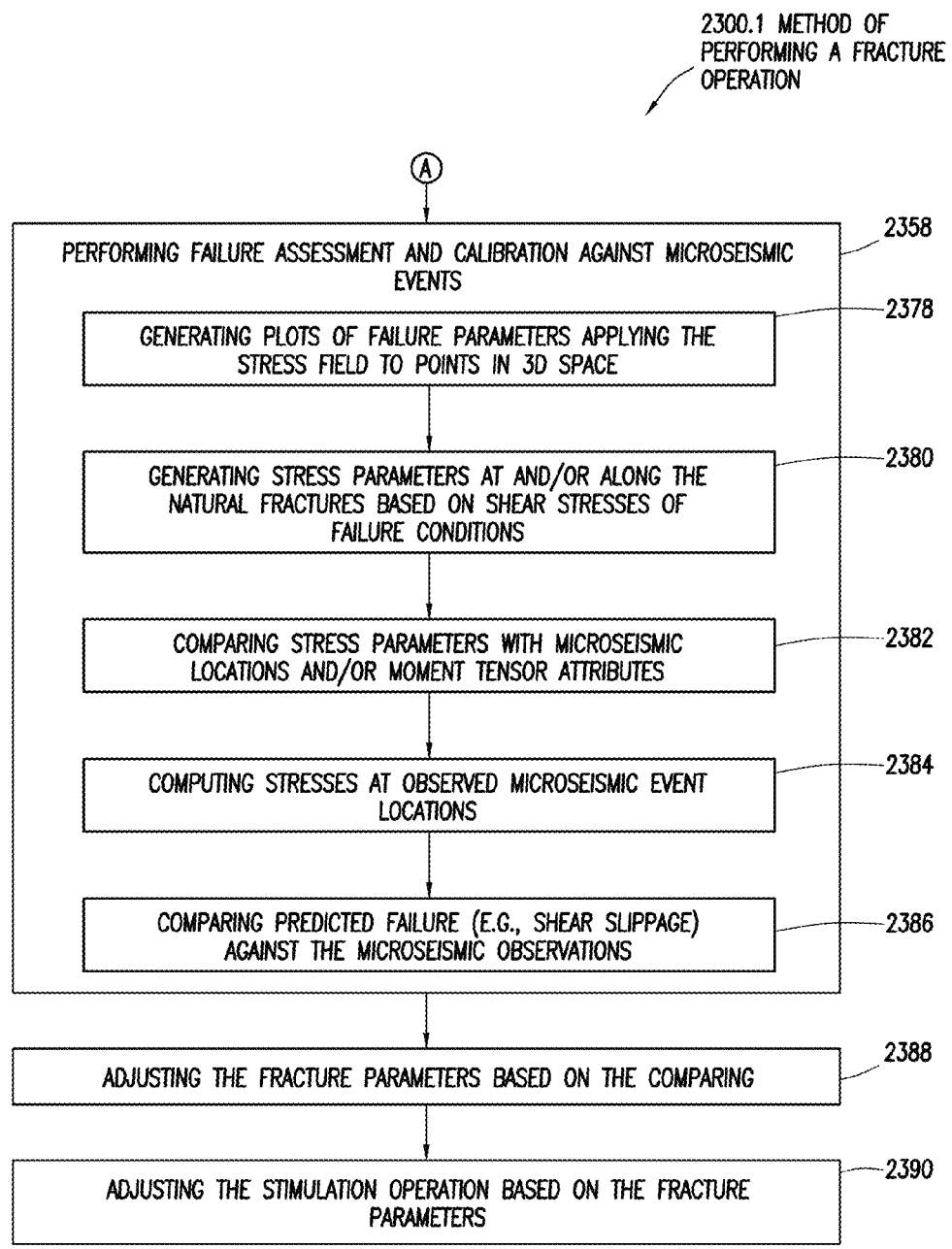
Figure 23C:
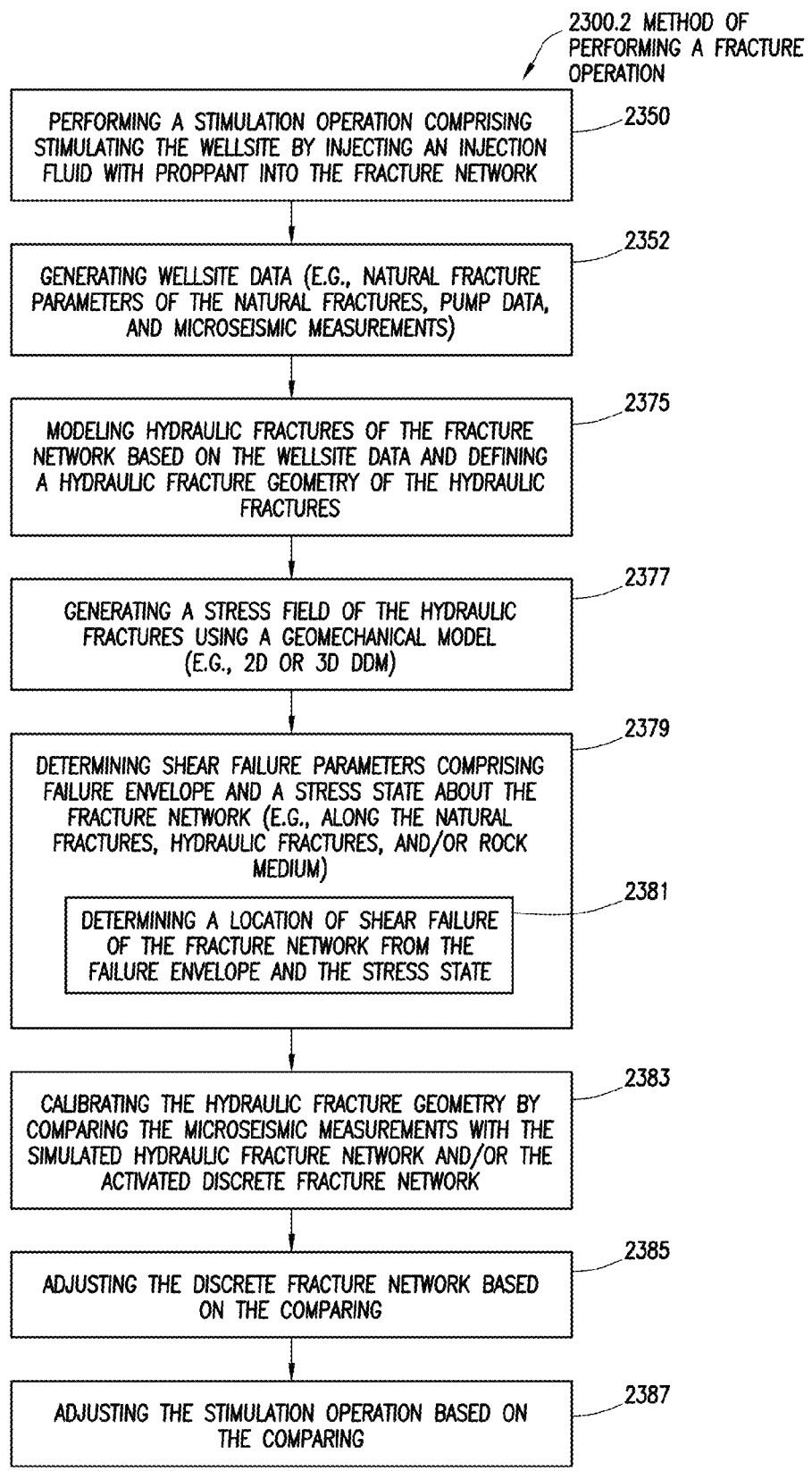

FIGS. 23A and 23B depict methods 2300.1, 2300.2 of performing a fracture operation at a wellsite. In at least one embodiment of the present disclosure, the methods 2300.1, 2300.2 are presented for interpretation of microseismicity and its use for calibration of complex fracture simulation by coupling the stress and rock failure analysis. Each of the methods 2300.1, 2300.2 may involve 2350 performing a stimulation operation comprising stimulating the wellsite by injecting an injection fluid with proppant into the fracture network and/or 2352 generating wellsite data (e.g. natural fracture parameters of the natural fractures, pump data, and microseismic measurements) The methods 2300.1, 2300.2 may be performed with all or part of the method 1500 of FIG. 15.

The method 2300.1 involves 2354 predicting fracture geometry, 2356 determining a three dimensional (3D) stress field, and 2358 performing failure assessment and calibration against microseismic events.

Fracture Geometry Prediction

Predicting fracture geometry 2354 may be performed, for example, by 2360 modeling fractures, such as natural, hydraulic, and/or complex fractures, based on the wellsite data, and 2362 generating a discrete fracture network from wellsite data. The hydraulic fracture geometry may first be computed using a hydraulic fracture model based on known geological, geomechanical and fracture treatment data. In the case of complex fractures in a naturally fractured formation, the model can be used to predict the complex fracture planes, as well as the fracture width, fluid pressure and other parameters associated with the fracture system. Examples of modeling are provided in US Patent Application No. 2008/0183451. Predictions may be performed by simulating using, for example, UFM as described above.

3D Stress Field Computation

A three dimensional (3D) stress field may be determined 2356 by modeling. For any given hydraulic fracture geometry computed by the fracture model, the 3D stress field (or region) surrounding the hydraulic fractures (see, e.g., FIG. 19) can be computed by modeling 2364 using, for example, a numerical geomechanics model. For example, a finite element numerical geomechanics code, and/or a finite difference code can be used. Such numerical simulation may be time consuming since it requires building complex 3D fine grids surrounding each of the fractures, and may be computationally intensive. Examples of modeling are provided in Koutsabeloulis 2009 and Zhang 2007, and may employ Itasca 2002 and/or FLAC3D™ commercially available from ITASCA™ (see: http://www.itascacg.com/).

The 3D dimensional stress field may also be determined 2356 using computationally efficient methods based on Displacement Discontinuity Method (DDM). The DDM may be performed using, for example, enhanced two dimensional (2D) DDM and/or 3D DDM. Examples of 1. Enhanced 2D DDM The method may be based on an enhanced 2D DDM 2366, such as those described herein. 2D DDM has been used in complex fracture modeling to compute the interaction among complex hydraulic fractures (also called "stress shadow" effect), and discussed herein and in PCT/US2012/063340. Examples of 2D DDM are provided in Olson 2004, and complex fracture models are provided in Weng 2011 and Wu 2012.

FIG. 3 shows a schematic diagram 300 showing a plan view of a complex fracture network 300. The fracture network 300 is discretized into many connected small elements ELEM i,j. In each element ELEM i,j, fluid pressure and width may be determined by solving a system of coupled elasticity and fluid flow equations. Examples of fluid flow in fractures are provided in Weng 2011. To account for the interaction among adjacent fractures, 2D DDM may be utilized. Examples of 2D techniques are provided in Crouch and Starfield 1983.

The 2D DDM equations relate the normal and shear stresses ($\sigma_n$ and $\sigma_s$) acting on one fracture element Elem i to the contributions of the opening and shearing displacement discontinuities ($D_n$ and $D_s$) from all fracture elements Elem i,j, as shown in equations below. To account for the 3D effect due to finite fracture height there is introduced a 3D correction factor 2368 to the influence coefficients and the modified elasticity equations (8.1) and (8.2) of 2D DDM as described herein. Techniques involving 3D effects are provided in Olson 2004.

The 3D correction factor may be presented as set forth in equation (12). The introduced 3D correction factor may lead to decaying of interaction between any two fracture elements when the distance increases, correctly reflecting the 3D effect of finite fracture height. The enhanced 2D DDM method may be validated 2370 against 3D Finite Difference solutions in simple cases to confirm good approximations. Correction techniques are described in Wu 2012.

In the above method for stress shadow computation, the stresses may be computed 2372 at the center of each element of the hydraulic fracture network. Similar equations can be applied for by computing the stress field in the rock away from the hydraulic fracture elements. By computing the normal and shear stresses acting on portions of the discrete fracture network, such as the pre-existing natural fractures and/or any points in the rock matrix, the shear failure condition can be evaluated.

2. 3D DDM

In some cases, the enhanced 2D DDM method may be limited to an evaluation of average stresses in the horizontal plane (assuming the fractures are vertical). The method may also be based on 3D DDM 2374.

For a given hydraulic fracture network, the network may be discretized into connected small rectangular (or polygonal) elements. For any given rectangular element subjected on displacement discontinuity between its two faces represented by $D_x$, $D_y$, and $D_z$, the induced stresses in the rock at any point (x, y, z) can be computed using the 3D DDM solution.

Figure 24:
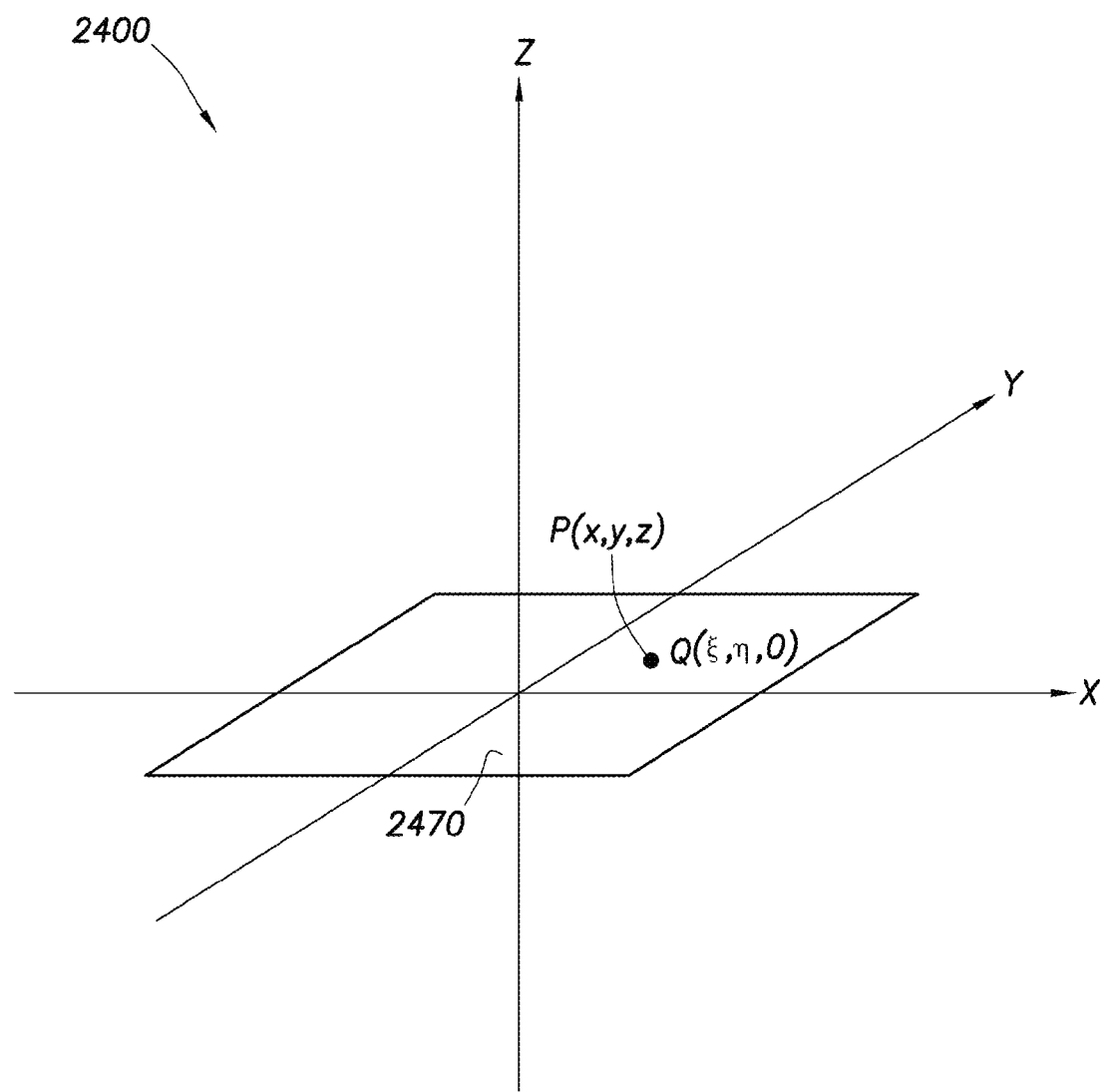
FIG. 24 is a schematic diagram depicting a fracture plane about a coordinate axis.

FIG. 24 shows a diagram 2400 of a local x,y,z coordinate system for one of the rectangular elements 2470 positioned along an x-y plane. The induced displacement and stress field can be expressed as:

$$\mu_x = [2(1-v)f_{,z} - zf_{,xx}]D_x - zf_{,xy}D_y - [(1-2v)f_{,x} + zf_{,xz}]D_z \quad (10)$$

$$\mu_y = -zf_{,xy}D_x + [2(1-v)f_{,z} - zf_{,yy}]D_y - [(1-2v)f_{,y} + zf_{,yz}]D_z \quad (11)$$

$$\mu_z = [(1-2v)f_{,x} - zf_{,xz}]D_x + [(1-2v)f_{,y} - zf_{,yz}]D_y + [2(1-v)f_{,z} - zf_{,zz}]D_z \quad (12)$$

$$\sigma_{xx} = 2G\{[2f_{,xz} - zf_{,xxz}]D_x + [2vf_{,yz} - zf_{,xyz}]D_y + [f_{,zz} + (1-2v)f_{,yy} - zf_{,xz}]D_x\} \quad (14)$$

$$\sigma_{zz} = 2G\{-zf_{,xzz}D_x - zf_{,yzz}D_y + [f_{,zz} - zf_{,xyz}]D_z\} \quad (15)$$

$$\tau_{xy} = 2G\{[(1-v)f_{,yz} - zf_{,xxy}]D_x + [(1-v)f_{,xz} - zf_{,xyy}]D_y - [(1-2v)f_{,xy} + zf_{,xyz}]D_z\} \quad (16)$$

$$\tau_{yz} = 2G\{-[vf_{,xy} + zf_{,xyz}]D_x + [f_{,zz} + vf_{,xx} - zf_{,yyz}]D_y - zf_{,yzz}D_z\} \quad (17)$$

$$\tau_{xz} = 2G\{[(f_{,zz} + vf_{,yy} - zf_{,xxz}]D_x - [vf_{,xy} + zf_{,xyz}]D_y - zf_{,xzz}D_z\} \quad (18)$$

where a and b are the half lengths of the edges of the rectangle, and $$f(x, y, z) = \frac{1}{8\pi(1-v)} \int\int_A [(x-\xi)^2 + (y-\eta)^2 + z^2]^{-1/2} d\xi d\eta, \quad (19)$$

$$|\xi| \le a, |\eta| \le b$$

For any given observation point P (x,y,z) in the 3D space, by superposing the stresses from all fracture elements and by applying proper coordinate transform, the induced stress at the point P may be computed 2376. Techniques involving 3D DDM are provided in Crouch, S. L. and Starfield, A. M. (1990), *Boundary Element Methods in Solid Mechanics*, Unwin Hyman, London, the entire contents of which are hereby incorporated by reference herein.

Failure Assessment and Calibration Against Microseismic Events

Failure assessment and calibration may be performed 2358 against microseismic events. The stresses can be computed in different locations in 3D space for different analysis purposes. The stresses may be generated by applying the stress field to fixed points in 3D space, to generate plots 2378 of stress components, and/or to generate stresses 2380 along observed microseismic locations. The following lists a few such applications but the method is not limited to these applications.

1. 3D Stress Contour

The stress computation can be applied to fixed points in 3D space to generate contour plots 2378 of various stress components or plots of derived failure parameters from the stresses. The 3D contour plots give indication of where stress concentrations are or where the rock are most likely induce shear failure that may be correlated to the microseismic event locations or event density.

2. Stresses at Given Natural Fractures

The stresses can be computed 2380 at the natural fractures or along the natural fractures. The shear stress or other relevant indicators pertaining to failure conditions can be computed. Again, this can be compared 2382 to the microseismic locations and moment tensor attributes to determine if the assumed natural fracture parameters are consistent with the microseismic observations and if any adjustments are needed to the fracture parameters.

3. Stresses at Microseismic Event Locations

The stresses can be computed 2384 at the observed microseismic event locations. Based on the computed stresses, the likelihood of shear slippage or the required condition can be assessed. Since the shear slip takes place at the microseismic event location, agreement or disagreement of the model prediction with the reality may provide a measure of correctness of the model results.

Regardless where in space the stresses are computed, the comparison 2386 of the predicted propensity for shear slippage or failure can be made against the microseismic observation. If the model prediction does not agree well with the microseismic observations, modifications in natural fracture system or other rock parameters may be needed and the simulation rerun until adequate match is obtained. After the adjusting 2388, the wellsite data may be modified at 2352 and the method repeated. Once the calibrations are complete, the fracture parameters may be adjusted 2388 based on the comparing. The stimulation operation 2390 may also be adjusted based on the fracture parameters.

The method provides a direct tie of the observed microseismicity and the stress field anticipated from the induced hydraulic fractures. By doing so, many effects due to initial heterogeneous stress distribution in the rock formation, variation of natural fractures and their attributes and their distribution in the reservoir, major faults with different properties, etc., can be taken into consideration. This may reduce uncertainties in the analysis and interpretation of the microseismic events and may provide more deterministic validation/calibration of the fracture geometry from the fracture model.

The calibration process may also provide better understanding of the microseismic source mechanisms and key parameters, which provides the basis for improved microseismic measurement installation or design considerations in subsequent treatments in the same well, or in future treatments in the adjacent wells.

FIG. 23B provides another method 2300.2 of performing a fracture operation. In this version, the method involves 2350 performing a stimulation operation comprising stimulating the wellsite by injecting an injection fluid with proppant into the fracture network and 2352 generating wellsite data (e.g. natural fracture parameters of the natural fractures, pump data, and microseismic measurements) as in FIG. 23A. The method 2300.2 also involves 2375 modeling hydraulic fractures of the fracture network based on the wellsite data and defining a hydraulic fracture geometry of the hydraulic fractures, 2377 generating a stress field of the hydraulic fractures using a geomechanical model (e.g., 2D or 3D DDM), 2379 determining shear failure parameters comprising failure envelope and a stress state about the fracture network (e.g., along the natural fractures, hydraulic fractures, and/or rock medium), 2381 determining a location of shear failure of the fracture network from the failure envelope and the stress state, 2383 calibrating the hydraulic fracture geometry by comparing the microseismic measurements with the simulated hydraulic fracture network and/or the activated discrete fracture network, 2385 adjusting the discrete fracture network based on the comparing, and 2387 adjusting the stimulation operation based on the comparing.

Part or all of the methods may be performed in any order and repeated as desired.

Although the present disclosure has been described with reference to exemplary embodiments and implementations thereof, the present disclosure is not to be limited by or to such exemplary embodiments and/or implementations. Rather, the systems and methods of the present disclosure are susceptible to various modifications, variations and/or enhancements without departing from the spirit or scope of the present disclosure. Accordingly, the present disclosure expressly encompasses all such modifications, variations and enhancements within its scope.

It should be noted that in the development of any such actual embodiment, or numerous implementation, specific decisions must be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure. In addition, the embodiments used/disclosed herein can also include some components other than those cited.

In the description, each numerical value should be read once as modified by the term "about" (unless already expressly so modified), and then read again as not so modified unless otherwise indicated in context. Also, in the description, it should be understood that any range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to only a few specific ones, it is to be understood that inventors appreciate and understand that any and all data points within the range are to be considered to have been specified, and that inventors possessed knowledge of the entire range and all points within the range.

The statements made herein merely provide information related to the present disclosure and may not constitute prior art, and may describe some embodiments illustrating the invention. All references cited herein are incorporated by reference into the current application in their entirety.

Although only a few example embodiments have been described in detail above, those skilled in the art will readily appreciate that many modifications are possible in the example embodiments without materially departing from the system and method for performing wellbore stimulation operations. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words 'means for' together with an associated function.

What is claimed is:

1. A method of performing a fracture operation at a wellsite, the wellsite positioned about a subterranean formation having a wellbore therethrough and a fracture network therein, the fracture network comprising natural fractures, the wellsite stimulated by injection of an injection fluid with proppant into the fracture network, the method comprising:

generating wellsite data comprising natural fracture parameters of the natural fractures and obtaining measurements of microseismic events of the subterranean formation;

modeling hydraulic fractures of the fracture network based on the wellsite data and defining a hydraulic fracture geometry of the hydraulic fractures;

generating a stress field of the hydraulic fractures using a geomechanical model based on the wellsite data;

determining shear failure parameters comprising a failure envelope and a stress state about the fracture network;

determining a location of shear failure of the fracture network from the failure envelope and the stress state; and calibrating the hydraulic fracture geometry by comparing the modeled hydraulic fractures and the locations of shear failure against the measured microseismic events.

2. The method of claim 1, further comprising adjusting the natural fracture parameters based on the calibrating.

3. The method of claim 1, further comprising stimulating the wellsite by injecting the injection fluid into the fracture network.

4. The method of claim 3, further comprising adjusting the stimulation operation based on the calibrating.

5. The method of claim 1, further comprising adjusting the wellsite data by selectively repeating the method based on the calibrating.

6. The method of claim 1, wherein the determining a stress field comprises performing numerical simulations.

7. The method of claim 1, wherein the determining shear failure parameters comprises determining a stress state at one of: along the natural fractures, along the hydraulic fractures, and along a rock medium about the natural fractures.

8. The method of claim 1, wherein the geomechanical model comprises one of: a two dimensional displacement discontinuity method, a three dimensional displacement discontinuity method, finite element numerical geomechanics code, and a finite difference code.

9. The method of claim 8, wherein the two dimensional displacement discontinuity method comprises:
providing a three dimensional correction factor;
validating the two dimensional displacement discontinuity method against a three dimensional finite difference solution; and
computing stresses acting on the fracture network.

10. The method of claim 8, wherein the three dimensional displacement discontinuity method comprises:
discretizing the discrete fracture network into a plurality of elements;
generating an induced stress at a point by superimposing stresses from all fracture elements of the fracture network; and
applying a coordinate transform.

11. The method of claim 1, wherein the calibrating comprises performing a failure assessment and calibration against the microseismic events.

12. The method of claim 1, wherein the calibrating comprises:
generating plots of failure parameters by applying the stress field to points in three dimensional space;
generating stress parameters at and/or along the natural fractures based on shear stresses of failure conditions;
comparing stress parameters with microseismic locations and moment tensor attributes;
computing stresses at observed microseismic event locations; and
comparing predicted failure comprising shear slippage against the microseismic events.

13. The method of claim 12, wherein the failure envelope is a Mohr-Coulomb failure envelope and wherein the stress state is a Mohr circle.

14. A method of performing a fracture operation at a wellsite, the wellsite positioned about a subterranean formation having a wellbore therethrough and a fracture network therein, the fracture network comprising natural fractures, the wellsite stimulated by injection of an injection fluid with proppant into the fracture network, the method comprising:
generating wellsite data comprising natural fracture parameters of the natural fractures and obtaining measurements of microseismic events of the subterranean formation;
modeling hydraulic fractures of the fracture network based on the wellsite data and defining a hydraulic fracture geometry of the hydraulic fractures;
generating a stress field of the hydraulic fractures using a geomechanical model based on the wellsite data;
determining shear failure parameters comprising a failure envelope and a stress state about the fracture network;
determining a location of shear failure of the fracture network from the failure envelope and the stress state; and
calibrating the hydraulic fracture geometry by comparing the modeled hydraulic fractures and the locations of shear failure against the measured microseismic events; and
adjusting the natural fracture parameters operation based on the calibrating.

15. The method of claim 14, further comprising performing a stimulation operation comprising stimulating the wellsite by injecting the injection fluid into the fracture network.

16. The method of claim 14, further comprising adjusting the stimulation operation based on the calibrating.

17. A method of performing a fracture operation at a wellsite, the wellsite positioned about a subterranean formation having a wellbore therethrough and a fracture network therein, the fracture network comprising natural fractures, the wellsite stimulated by injection of an injection fluid with proppant into the fracture network, the method comprising:
performing a stimulation operation comprising stimulating the wellsite by injecting the injection fluid into the fracture network;
generating wellsite data comprising natural fracture parameters of the natural fractures and obtaining measurements of microseismic events of the subterranean formation;
modeling hydraulic fractures of the fracture network based on the wellsite data and defining a hydraulic fracture geometry of the hydraulic fractures;
generating a stress field of the hydraulic fractures using a geomechanical model based on the wellsite data;
determining shear failure parameters comprising a failure envelope and a stress state about the fracture network;
determining a location of shear failure of the fracture network from the failure envelope and the stress state; and
calibrating the hydraulic fracture geometry by comparing the modeled hydraulic fractures and the locations of shear failure against the measured microseismic events.

18. The method of claim 17, further comprising adjusting the natural fracture parameters operation based on the calibrating.

19. The method of claim 17, further comprising adjusting the stimulation operation based on the calibrating.

20. The method of claim 17, further comprising measuring the wellsite data and the microseismic events at the wellsite.

* * * * *